(12) United States Patent
Shimoda et al.

(10) Patent No.: US 9,123,752 B2
(45) Date of Patent: Sep. 1, 2015

(54) PROCESS FOR PRODUCTION OF FUNCTIONAL DEVICE, PROCESS FOR PRODUCTION OF FERROELECTRIC MATERIAL LAYER, PROCESS FOR PRODUCTION OF FIELD EFFECT TRANSISTOR, THIN FILM TRANSISTOR, FIELD EFFECT TRANSISTOR, AND PIEZOELECTRIC INK JET HEAD

(71) Applicant: Japan Science and Technology Agency, Kawaguchi-shi (JP)

(72) Inventors: Tatsuya Shimoda, Nomi (JP); Eisuke Tokumitsu, Kanazawa (JP); Takaaki Miyasako, Yokkaichi (JP); Toshihiko Kaneda, Chino (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 14/531,723

(22) Filed: Nov. 3, 2014

(65) Prior Publication Data
US 2015/0093841 A1    Apr. 2, 2015

Related U.S. Application Data

(62) Division of application No. 13/696,551, filed as application No. PCT/JP2011/060581 on May 6, 2011.

(30) Foreign Application Priority Data

May 7, 2010 (JP) ................................. 2010-107764
May 7, 2010 (JP) ................................. 2010-107768
May 24, 2010 (JP) ................................ 2010-118857

(51) Int. Cl.
*H01L 29/10* (2006.01)
*H01L 29/66* (2006.01)
(Continued)

(52) U.S. Cl.
CPC ............ *H01L 29/66969* (2013.01); *B05D 5/06* (2013.01); *B41J 2/161* (2013.01);
(Continued)

(58) Field of Classification Search
None
See application file for complete search history.

(56) References Cited

U.S. PATENT DOCUMENTS

2004/0212305 A1    10/2004  Fujitani et al.
2005/0242342 A1*   11/2005  Suh et al. .................... 257/40
(Continued)

FOREIGN PATENT DOCUMENTS

CN    1542922 A    11/2004
JP    07-156414 A   6/1995
(Continued)

OTHER PUBLICATIONS

International Search Report, dated Aug. 2, 2011, for corresponding International Application No. PCT/JP2011/060581, 4 pages.
(Continued)

*Primary Examiner* — Kyoung Lee
(74) *Attorney, Agent, or Firm* — Seed IP Law Group PLLC

(57) ABSTRACT

A method of producing a functional device according to the present invention includes, in this order: the functional solid material precursor layer formation step of applying a functional liquid material onto a base material to form a precursor layer of a functional solid material; the drying step of heating the precursor layer to a first temperature in a range from 80° C. to 250° C. to preliminarily decrease fluidity of the precursor layer; the imprinting step of imprinting the precursor layer that is heated to a second temperature in a range from 80° C. to 300° C. to form an imprinted structure on the precursor layer; and the functional solid material layer formation step of heat treating the precursor layer at a third temperature higher than the second temperature to transform the precursor layer into a functional solid material layer.

9 Claims, 59 Drawing Sheets

(51) Int. Cl.
- *B41J 2/16* (2006.01)
- *C23C 18/12* (2006.01)
- *B05D 5/06* (2006.01)
- *H01L 21/02* (2006.01)
- *H01L 21/368* (2006.01)
- *H01L 29/786* (2006.01)
- *H01L 41/33* (2013.01)
- *H01L 41/318* (2013.01)
- *H01L 27/12* (2006.01)
- *C23C 18/06* (2006.01)
- *H01L 21/441* (2006.01)
- *H01L 41/09* (2006.01)

(52) U.S. Cl.
CPC ............. *B41J 2/1623* (2013.01); *B41J 2/1629* (2013.01); *B41J 2/1637* (2013.01); *B41J 2/1639* (2013.01); *B41J 2/1643* (2013.01); *B41J 2/1645* (2013.01); *C23C 18/06* (2013.01); *C23C 18/1216* (2013.01); *C23C 18/1254* (2013.01); *C23C 18/1279* (2013.01); *C23C 18/1283* (2013.01); *C23C 18/1295* (2013.01); *H01L 21/02104* (2013.01); *H01L 21/368* (2013.01); *H01L 21/441* (2013.01); *H01L 27/1225* (2013.01); *H01L 27/1292* (2013.01); *H01L 29/786* (2013.01); *H01L 29/7869* (2013.01); *H01L 41/318* (2013.01); *H01L 41/33* (2013.01); *H01L 21/0237* (2013.01); *H01L 21/02521* (2013.01); *H01L 21/02601* (2013.01); *H01L 21/02628* (2013.01); *H01L 41/0973* (2013.01)

(56) References Cited

U.S. PATENT DOCUMENTS

| | | | |
|---|---|---|---|
| 2008/0076267 A1* | 3/2008 | Oishi et al. | 438/785 |
| 2008/0079075 A1 | 4/2008 | Seon et al. | |
| 2008/0173867 A1 | 7/2008 | Ichikawa et al. | |
| 2010/0051938 A1 | 3/2010 | Hayashi et al. | |
| 2010/0117684 A1* | 5/2010 | Kim et al. | 326/120 |

FOREIGN PATENT DOCUMENTS

| | | |
|---|---|---|
| JP | 08-274195 A | 10/1996 |
| JP | 2000-058837 A | 2/2000 |
| JP | 2003-051262 A | 2/2003 |
| JP | 2003-151362 A | 5/2003 |
| JP | 2006-121029 A | 5/2006 |
| JP | 2007-042689 A | 2/2007 |
| JP | 2008-091904 A | 4/2008 |
| JP | 2008-153535 A | 7/2008 |
| JP | 2009-166385 A | 7/2009 |

OTHER PUBLICATIONS

Chinese Office Action, dated Apr. 1, 2014, for corresponding Chinese Application No. 201180021920.6, 14 pages.

Japanese Notification of Reasons for Refusal, dated May 7, 2014, for corresponding JP Patent Application No. 2012-265997, 6 pages.

Notification of Written Opinion on the Second Examination dated Oct. 27, 2014, for corresponding CN Application No. 201180021920.6, 8 pages.

Office Action mailed Jan. 5, 2015, for corresponding TW Application No. 100116093, 13 pages.

Chou et al., "Nanoimprint lithography," J. Vac. Sci. Technol. B 14(6):4129-4133, Nov./Dec. 1996.

* cited by examiner (a)

(b)

(c)

(d)

(e)

(a)

(b)

(c)

(d)

(e)

(f)

(a)

(b)

(c)

(d)

(e)

(a)

(b)

(c)

(d)

(e)

(a)

(b)

(c)

(a)

(b)

(c)

(a)

(b)

(c)

(a)

(b)

(a)

(b)

(a)

(b)

(a) Embodiment 9

(b) Comparative Example (a) Embodiment 9 — No leakage path
(b) Comparative Example — Leakage path Leakage path

| Polarization residual value | | Second Temperature (°C) | | | | | | |
|---|---|---|---|---|---|---|---|---|
| | | 120 | 150 | 175 | 200 | 225 | 250 | 300 |
| First Temperature (°C) | 120 | | ○ | ○ | ○ | ○ | ○ | |
| | 150 | | ○ | ○ | ○ | ○ | ○ | ○ |
| | 175 | | | | ○ | ○ | ○ | |
| | 200 | | △ | | ○ | | ○ | ○ |
| | 225 | | | | | | ○ | |
| | 250 | | ○ | | × | | × | ○ |
| | 300 | | △ | | △ | | △ | ○ |

| Leakage current | | Second Temperature (°C) | | | | | | |
|---|---|---|---|---|---|---|---|---|
| | | 120 | 150 | 175 | 200 | 225 | 250 | 300 |
| First Temperature (°C) | 120 | | × | × | ○ | × | × | |
| | 150 | | × | ○ | ○ | ○ | ○ | ○ |
| | 175 | | | | ○ | ○ | ○ | |
| | 200 | | △ | | × | | × | ○ |
| | 225 | | | | | | × | |
| | 250 | | × | | △ | | × | × |
| | 300 | | × | | × | | × | × |

(a)

(b)

(c)

(d)

(e)

(a)

(b)

(c)

(d)

(e)

(a)

(b)

(a)

(b)

(c)

(d)

(a)

(b)

(c)

(d)

(e)

(a)

(b)

(a)

(b)

(c)

(d)

(a)

(b)

(c)

(d)

(a)

(b)

(a)

(b)

(c)

(d)

(e)

(a)

(b)

(c)

(d)

(e)

(a)

(b)

(a)

(b)

(a)

(b)

PROCESS FOR PRODUCTION OF FUNCTIONAL DEVICE, PROCESS FOR PRODUCTION OF FERROELECTRIC MATERIAL LAYER, PROCESS FOR PRODUCTION OF FIELD EFFECT TRANSISTOR, THIN FILM TRANSISTOR, FIELD EFFECT TRANSISTOR, AND PIEZOELECTRIC INK JET HEAD

TECHNICAL FIELD

The present invention relates to a method of producing a functional device, a method of producing a ferroelectric material layer, a method of producing a field effect transistor, a thin film transistor, the field effect transistor, and a piezoelectric ink jet head.

BACKGROUND ART

FIG. 65 is an explanatory view of a conventional thin film transistor 900.

As shown in FIG. 65, the conventional thin film transistor 900 includes a source electrode 950, a drain electrode 960, a channel layer 940 located between the source electrode 950 and the drain electrode 960, a gate electrode 920 for controlling a conductive state of the channel layer 940, and a gate insulating layer 930 provided between the gate electrode 920 and the channel layer 940 and made of a ferroelectric material. In FIG. 65, reference sign 910 denotes an insulating substrate.

In the conventional thin film transistor 900, used as a material for the gate insulating layer 930 is a ferroelectric material (such as BLT ($Bi_{4-x}La_xTi_3O_{12}$) or PZT ($Pb(Zr_xTi_{1-x})O_3$)). Furthermore, an oxide conductive material (such as indium tin oxide (ITO)) is used as a material for the channel layer 940.

In the conventional thin film transistor 900, such an oxide conductive material is used as a material for the channel layer, thereby increasing carrier density. Furthermore, the ferroelectric material is used as a material for the gate insulating layer, thereby realizing quick switching at a low drive voltage. Achieved as a result is quick control on a large current at a low drive voltage.

The conventional thin film transistor can be produced in accordance with a method of producing a conventional thin film transistor, as shown in FIGS. 66(a) to 66(f). FIGS. 66(a) to 66(f) are explanatory views of the method of producing a conventional thin film transistor. FIGS. 66(a) to 66(e) show the respective processes. FIG. 66(f) is a plan view of the thin film transistor 900.

Initially, as shown in FIG. 66(a), there is formed, on an insulating substrate 910 that is made of an Si substrate provided on a surface thereof with an $SiO_2$ layer, the gate electrode 920 as a laminated film made of Ti (10 nm) and Pt (40 nm), in accordance with the electron-beam evaporation technique.

Then, as shown in FIG. 66(b), formed from above the gate electrode 920 in accordance with the sol-gel method is the gate insulating layer 930 (200 nm) which is made of BLT ($Bi_{3.25}La_{0.75}Ti_3O_{12}$) or PZT ($Pb(Zr_{0.4}Ti_{0.6})O_3$).

Subsequently, as shown in FIG. 66(c), the channel layer 940 (5 nm to 15 nm) made of ITO is formed on the gate insulating layer 930 in accordance with the RF-sputtering technique.

Thereafter, as shown in FIG. 66(d), Ti (30 nm) and Pt (30 nm) are deposited on the channel layer 940 in accordance with the electron-beam evaporation technique, so that there are formed the source electrode 950 and the drain electrode 960.

Then, the element region is isolated from a different element region in accordance with the RIE method and the wet etching method (HF:HCl liquid mixture).

Produced as a result is the thin film transistor 900 illustrated in FIGS. 66(e) and 66(f).

FIG. 67 is an explanatory view of electrical properties of the conventional thin film transistor 900. In FIG. 67, reference sign 940a denotes a channel, and reference sign 940b denotes a depletion layer.

As shown in FIG. 67, the conventional thin film transistor 900 obtains approximately $10^{-4}$ A as an ON-state current at a gate voltage of 3 V (VG=3 V), $1 \times 10^4$ as an ON/OFF ratio, 10 $cm^2/Vs$ as an electron field-effect mobility $\mu_{FE}$, and approximately 2 V as a memory window property.

PRIOR ART DOCUMENT

Patent Document

Patent Document 1: JP 2006-121029 A

SUMMARY OF THE INVENTION

Problems to be Solved by the Invention

However, because the conventional thin film transistor 900 is produced in accordance with the method described above, it is necessary to adopt the vacuum process or the photolithography process upon the formation of the gate electrode 920, the channel layer 940, the source electrode 950, and the drain electrode 960. Accordingly, efficiency in the use of raw materials and production energy is deteriorated. There is another problem that the production takes a long period of time.

These problems occur not only in the above method of producing a thin film transistor but also in any method of producing a functional device such as an actuator or an optical device. The necessities mentioned above apply also to piezoelectric ink jet heads, capacitors, and any other purposes utilizing the electrical properties of a ferroelectric material layer, as functional devices of one type.

The present invention has been made to solve at least one of the problems mentioned above. More specifically, the present invention can significantly contribute to providing a method of producing various functional devices such as the excellent thin film transistor as described above. Such a method of producing a functional device realizes production by the less processes as compared with the conventional method, using raw materials and production energy much less than the conventional case.

Solutions to the Problems

According to the present invention, a method of producing a functional device includes the following steps (1) to (4):

(1) the functional solid material precursor layer formation step of applying a functional liquid material onto a base material to form a precursor layer of a functional solid material;

(2) after the functional solid material precursor layer formation step, the drying step of heating the precursor layer to a first temperature in the range from 80° C. to 250° C.;

(3) after the drying step, the imprinting step of imprinting the precursor layer that is heated to a second temperature in the range from 80° C. to 300° C. to form an imprinted structure on the precursor layer; and (4) after the imprinting step, the functional solid material layer formation step of heat treating the precursor layer at a third temperature higher than the second temperature to transform the precursor layer into a functional solid material layer.

In the present application, referred to for convenience as the functional liquid material preparation step is the step performed prior to the production method described above, of preparing the functional liquid material, which is to be transformed by heat treatment into a functional solid material made of metal oxide ceramics or a metal. The "precursor layer", which is referred to as above in the present application, may be occasionally called a "precursor composition layer". Furthermore, there is no inhibition of performing, between the respective steps, any step not relevant to the purposes of the present invention, such as shifting or inspecting the substrate.

According to the method of producing a functional device, a functional solid material layer can be formed by applying a functional liquid material onto a base material to form a precursor layer, imprinting the precursor layer to form an imprinted structure, and heat treating the precursor layer at predetermined temperature. As a result, any functional device, such as the excellent thin film transistor as described above, can be produced with use of the raw materials and production energy, which are much less than the conventional case, as well as by the less processes as compared with the conventional method.

The above method of producing a functional device can exert the following functional effects. Firstly, by heating to the first temperature in the range from 80° C. to 250° C., the precursor layer is solidified to some extent to preliminarily decrease fluidity of the precursor layer. Furthermore, hardness of the precursor layer is decreased by heating to the second temperature in the range from 80° C. to 300° C., so that the precursor layer having obtained high plastic deformability can be imprinted. As a result, the desired imprinted structure can be formed with high accuracy, so as to produce a functional device having desired performance.

There is a report that the imprinting is performed at room temperature in an imprinting technique of imprinting with use of a functional liquid material that is to be transformed by heat treatment into metal oxide ceramics or a metal, unlike an ordinary imprinting technique of imprinting with use of a polymer material. However, according to this report, it is necessary to contain an organic component, a solvent, or the like in order to provide predetermined plastic deformability. Such an organic component, a solvent, or the like thus contained stimulates deterioration in shape upon baking.

Nevertheless, the inventors of the present invention researched to find out that the plastic deformability of the precursor layer is increased when the precursor layer is heated to the second temperature in the range from 80° C. to 300° C. Also found is that a main solvent can be removed. Therefore, in a method of producing a functional device according to the present invention, the precursor layer is imprinted, which is heated to the second temperature in the range from 80° C. to 300° C. to obtain high plastic deformability, as well as is less likely to be deteriorated in shape upon baking.

The second temperature is set to be in the range "from 80° C. to 300° C." for the following reasons. Firstly, if the second temperature is less than 80° C., the precursor layer is not softened enough to adequately enhance the plastic deformability of the precursor layer. In addition, if the second temperature exceeds 300° C., the precursor layer is solidified excessively to deteriorate again the plastic deformability of the precursor layer.

In view of the above, it is more preferred to imprint the precursor layer, which is heated to certain temperature in the range from 100° C. to 200° C.

In a method of producing a functional device according to the present invention, the second temperature may be constant or may be varied in a predetermined temperature range. In a method of producing a functional device according to the present invention, the "imprinting" may be referred to as "nanoimprinting".

In a method of producing a functional device according to the present invention, in the imprinting step, the imprinting is performed preferably by applying a pressure in the range from 1 MPa to 20 MPa.

In the method of producing a functional device, as described above, the precursor layer having obtained high plastic deformability is imprinted. As a result, even in a case where the pressure as low as 1 MPa to 20 MPa is applied upon imprinting, the precursor layer is deformed to follow the shape of the surface of the mold, thereby forming the desired imprinted structure with high accuracy. Moreover, because the pressure as low as 1 MPa to 20 MPa is applied upon imprinting, the mold is less likely to be damaged during the imprinting.

The above pressure is set to be in the range "from 1 MPa to 20 MPa" for the following reasons. Firstly, if the pressure is less than 1 MPa, the precursor composition may not be imprinted because the pressure is too low. In addition, the precursor composition can be sufficiently imprinted by applying the pressure as high as 20 MPa, with no need to apply a higher pressure.

In view of the above, in the imprinting step mentioned above, the imprinting is performed more preferably by applying a pressure in the range from 2 MPa to 10 MPa.

In a method of producing a functional device according to the present invention, in the imprinting step, the imprinting is performed preferably with use of a mold heated to a fourth temperature in the range from 80° C. to 300° C.

By adopting such a method, the plastic deformability of the precursor layer is not deteriorated during the imprinting, so that the desired imprinted structure can be formed with higher accuracy.

The fourth temperature is set to be in the range "from 80° C. to 300° C." for the following reasons. Firstly, if the fourth temperature is less than 80° C., the plastic deformability of the precursor layer is deteriorated due to the decrease in temperature of the precursor layer. In addition, if the fourth temperature exceeds 300° C., the precursor layer is solidified excessively to deteriorate the plastic deformability of the precursor layer.

In view of the above, at the fourth temperature, the imprinting is performed preferably with use of a mold heated to certain temperature in the range from 100° C. to 200° C.

In a method of producing a functional device according to the present invention, in the imprinting step, the precursor layer is imprinted preferably after performing mold releasing treatment to at least one of a surface of the precursor layer and an imprinting surface of the mold.

Such a method achieves decrease in frictional force between the precursor layer and the mold, so that the precursor layer can be imprinted with higher accuracy.

In a method of producing a functional device according to the present invention, the functional liquid material is preferably a solution containing at least one selected from the group including:

a solution containing metal alkoxide;
a solution containing a metal organic acid salt;
a solution containing a metal inorganic acid salt;
a solution containing metal halide;
a solution containing an inorganic compound including metal, nitrogen, and hydrogen;
a solution containing metal hydride;
a solution containing metal nanoparticles; and
particulate ceramics.

By adopting such a method, the precursor layer having predetermined plastic deformability can be imprinted to form the imprinted structure with higher accuracy.

In a method of producing a functional device according to the present invention, the functional liquid material preferably includes at least one selected from the group including the solution containing metal alkoxide, the solution containing a metal organic acid salt, and the solution containing a metal inorganic acid salt. Furthermore, in the functional solid material layer formation step, the precursor layer having been imprinted is transformed into the functional solid material layer preferably at a volume shrinkage factor in the range from 30% to 90%.

In this manner, by transforming the precursor layer having been imprinted into the functional solid material layer at the predetermined volume shrinkage factor in the functional solid material layer formation step, it is possible to form the desired imprinted structure with higher accuracy.

The volume shrinkage factor is set to be in the range "from 30% to 90%" for the following reasons. Firstly, if the volume shrinkage factor is set to be less than 30%, the precursor layer may be solidified excessively in some cases, thereby to be difficult to sufficiently enhance the plastic deformability of the precursor layer. In addition, if the volume shrinkage factor exceeds 90%, the imprinted structure tends to be broken in the course of contraction of the precursor layer due to such an excessively high volume shrinkage factor.

In view of the above, the volume shrinkage factor in the functional solid material layer formation step of transforming the precursor layer having been imprinted into the functional solid material layer is more preferably in the range from 40% to 70%, and still more preferably in the range from 50% to 60%.

The volume shrinkage factor is a value obtained by dividing a "value obtained by subtracting the volume after contraction in the functional solid material layer formation step from the volume prior to contraction after the imprinting step" by the "volume prior to contraction after the imprinting step". Therefore, the degree of contraction is higher as the volume shrinkage factor is larger.

In a method of producing a functional device according to the present invention, preferably, the functional liquid material is a solution containing at least one selected from the group including
the solution containing metal halide,
the solution containing an inorganic compound including metal, nitrogen, and hydrogen,
the solution containing metal hydride,
the solution containing metal nanoparticles, and
the particulate ceramics, and in the functional solid material layer formation step, the precursor layer having been imprinted is transformed into the functional solid material layer at a volume shrinkage factor in the range from 1% to 30%.

The volume shrinkage factor is set to be in the range "from 1% to 30%" for the following reasons. Firstly, if the volume shrinkage factor is set to be less than 1%, the precursor layer may be solidified excessively in some cases, thereby to be difficult to sufficiently enhance the plastic deformability of the precursor layer. In addition, in the case of using one of these functional liquid materials, the volume shrinkage factor naturally falls in the range not exceeding 30%.

In a method of producing a functional device according to the present invention, in the functional solid material layer formation step, heat treatment is preferably performed in an atmosphere containing oxygen to form the functional solid material layer made of metal oxide ceramics.

By adopting such a method, as to be described later, the functional solid material layer can serve as "a gate electrode layer, a gate insulating layer, a source layer, a drain layer, a channel layer, or a wiring layer in a thin film transistor", "a piezoelectric layer or an electrode layer in an actuator", "a latticed layer in an optical device", or the like, which enables production of a functional device of any type.

In this case, examples of metal oxide ceramics usable as the functional solid material include any paraelectric materials (such as BZN ($Bi_{1.5}Zn_{1.0}Nb_{1.5}O_7$), BST ($Ba_xSr_{1-x}$) $Ti_3O_{12}$), $SiO_2$, $SrTiO_3$, $LaAlO_3$, and $HfO_2$), any ferroelectric materials (such as PZT (Pb ($Zr_xTi_{1-x}$) $O_3$), BLT ($Bi_{4-x}La_xTi_3O_{12}$), Nb doped PZT, La doped PZT, barium titanate ($BaTiO_3$), lead titanate ($PbTiO_3$), BTO ($Bi_4Ti_3O_{12}$), SBT ($SrBi_2Ta_2O_9$), BZN ($Bi_{1.5}Zn_{1.0}Nb_{1.5}O_7$), and bismuth ferrite ($BiFeO_3$), any semiconductor materials, any conductor materials (oxide conductor materials such as indium tin oxide (ITO), indium oxide ($In_2O_3$), antimony doped tin oxide (Sb—$SnO_2$), zinc oxide (ZnO), aluminum doped zinc oxide (Al—ZnO), gallium doped zinc oxide (Ga—ZnO), ruthenium oxide ($RuO_2$), iridium oxide ($IrO_2$), tin oxide ($SnO_2$), tin monoxide (SnO), and niobium doped titanium dioxide (Nb—$TiO_2$), amorphous conductive oxide materials such as indium gallium zinc complex oxide (IGZO), gallium doped indium oxide (In—Ga—O (IGO)), and indium doped zinc oxide (In—Zn—O (IZO)), strontium titanate ($SrTiO_3$), niobium doped strontium titanate (Nb—$SrTiO_3$), strontium barium complex oxide ($SrBaO_2$), strontium calcium complex oxide ($SrCaO_2$), strontium ruthenate ($SrRuO_3$), lanthanum nickel oxide ($LaNiO_3$), lanthanum titanium oxide ($LaTiO_3$), lanthanum copper oxide ($LaCuO_3$), neodymium nickel oxide ($NdNiO_3$), yttrium nickel oxide ($YNiO_3$), lanthanum calcium manganese complex oxide (LCMO), barium plumbate ($BaPbO_3$), LSCO ($La_xSr_{1-x}CuO_3$), LSMO ($La_{1-x}Sr_xMnO_3$), YBCO ($YBa_2Cu_3O_{7-x}$), LNTO ($La(Ni_{1-x}Ti_x)O_3$), LSTO (($La_{1-x}Sr_x$) $TiO_3$), STRO ($Sr(Ti_{1-x}Ru_x)O_3$), any other perovskite conductive oxide, any other pyrochlore conductive oxide, and the like), and other materials (such as High-k materials ($HfO_2$, $Ta_2O_5$, $ZrO_2$, $HfSi_xO_y$, $ZrSi_xO_y$, $LaAlO_3$, $La_2O_3$, ($Ba_{1-x}Sr_x$) $TiO_3$, $Al_2O_3$, ($Bi_{2-x}Zn_x$)($Zn_yNb_{2-y}$)$O_7$, $Y_2O_3$, $GeO_2$, $Gd_2O_3$, and the like), whistler alloys (alloys of Co, Co—Pt, Co—Fe, Mn—Pt, Ni—Fe, CoFeB, and the like, as well as Co—Cr—Fe—Al, $Co_2MnAl$, and the like), MRAM barrier materials (MRAM electrode materials including an oxide-based semimetal such as ($La_{1-x}Sr_x$)$MnO_3$, AlAs, MgO, $Al_2O_3$, and the like), multiferroic materials (such as perovskite $BiMnO_3$, $BiFeO_3$, and $YbMnO_3$, garnet $R_3Fe_2O_{12}$ (R=Dy, Ho, Er, Tm, Tb, and Lu), $Y_3Al_5O_{12}$, $Gd_3Ga_5O_{12}$, and SGGG ($Gd_{2.7}Ca_{0.3}$) ($Ga_{4.0}Mg_{0.32}Zr_{0.65}Ca_{0.03}$)$O_{12}$), PRAM materials (of chalcogenide base such as $Ge_xTe_{1-x}$ and $Ge_2Sb_2Te_5$, and Sb—X alloys (X=Ge, Ga, In, Se, and Te), and the like), and photocatalytic rutile titanium dioxide ($TiO_2$).

In a method of producing a functional device according to the present invention, in the functional solid material layer formation step, heat treatment is performed preferably in a reducing atmosphere to form the functional solid material layer made of a metal.

By adopting such a method, as to be described later, the functional solid material layer can serve as "a gate electrode layer or a wiring layer in a thin film transistor", "an electrode layer in an actuator", "a metal latticed layer in an optical device", or the like, which enables production of a functional device of any type.

In this case, examples of the metal usable as the functional solid material include Au, Pt, Ag, Cu, Ti, Ge, In, and Sn.

In a method of producing a functional device according to the present invention, in the imprinting step, the imprinted structure is preferably formed such that a crack is generated in the thinnest region by the heat treatment in the functional solid material layer formation step.

By adopting such a method, in the functional solid material layer formation step, a crack is generated in the thinnest region of the precursor layer. Due to the crack thus generated, the precursor layer can be easily contracted in the in-plane direction. As a result, the desired imprinted structure can be formed with high accuracy.

Preferably, a method of producing a functional device according to the present invention further includes, between the imprinting step and the functional solid material layer formation step, the step of entirely etching the precursor layer under a condition where the precursor layer is completely removed at the thinnest region in the imprinted precursor layer.

By adopting such a method, in the functional solid material layer formation step, the precursor layer is divided into a plurality of regions, so that the precursor layer can be easily contracted in the in-plane direction. As a result, the desired imprinted structure can be formed with high accuracy.

In a method of producing a functional device according to the present invention, preferably, the functional solid material layer is made of a functional solid material having a crystal structure, and the crystal structure of the functional solid material layer is identical or similar to a crystal structure of the base material or a crystal structure on the surface of the base material.

This method enhances the degree of affinity between the base material or the surface of the base material and the functional solid material layer, so that the precursor layer is less likely to be contracted in the in-plane direction.

In a method of producing a functional device according to the present invention, in the functional solid material precursor layer formation step, it is preferred to adopt the base material having a surface provided with two regions that have different degrees of affinity to the precursor layer. In the imprinting step, the imprinted structure is preferably formed on the precursor layer such that, in the two regions, a first region having the relatively high degree of affinity to the precursor layer is thicker than a second region having the relatively low degree of affinity to the precursor layer.

Also by adopting such a method, the degree of affinity is increased between the base material or the surface of the base material and the functional solid material layer, so that the precursor layer is less likely to be contracted in the in-plane direction. Furthermore, by adopting such a method, the pattern on the surface of the base material can be easily matched with the pattern on the functional solid material layer.

In a method of producing a functional device according to the present invention, it is possible to use, as the base material, an insulating substrate (such as an insulating substrate obtained by forming an STO ($SrTiO_3$) layer on a surface of a quartz glass substrate, an $SiO_2$/Si substrate, an alumina ($Al_2O_3$) substrate, an STO ($SrTiO_3$) substrate, an Si substrate, or the like, with an $SiO_2$ layer and a Ti layer being interposed therebetween), a semiconductor substrate (an Si substrate, an SiC substrate, a Ge substrate, or the like), a conductive substrate (a Pt substrate, an Au substrate, an Al substrate, a Ti substrate, a stainless substrate, an SRO ($SrRuO_3$) substrate, or the like), or any other base material.

In a method of producing a functional device according to the present invention, preferably, the functional device is a thin film transistor, and the functional solid material layer is at least one selected from the group including the gate electrode layer, the gate insulating layer, the source layer, the drain layer, the channel layer, and the wiring layer in the thin film transistor.

By adopting such a method, at least one of the layers in the thin film transistor can be produced with use of the raw material and production energy, which are much less than the conventional case, as well as by the less processes as compared with the conventional method.

In a case where the functional solid material layer is the gate electrode layer or the wiring layer, it is possible to use, as the functional solid material, any conductor material from among the metal oxide ceramics listed above or any one of the metals listed above.

In another case where the functional solid material layer is the gate insulating layer, it is possible to use, as the functional solid material, any paraelectric material or any ferroelectric material from among the metal oxide ceramics listed above.

In still another case where the functional solid material layer is the source layer, the drain layer, or the channel layer, it is possible to use, as the functional solid material, any semiconductor material or any conductor material from among the metal oxide ceramics listed above.

In a method of producing a functional device according to the present invention, preferably, the functional device is an actuator including a piezoelectric layer, and the functional solid material layer is the piezoelectric layer.

By adopting such a method, at least the piezoelectric layer can be produced with use of the raw material and production energy, which are much less than the conventional case, as well as by the less processes as compared with the conventional method.

In this case, it is possible to use, as the functional solid material, any ferroelectric material from among the metal oxide ceramics listed above.

In a method of producing a functional device according to the present invention, preferably, the functional device is an optical device including a base material and a plurality of latticed layers provided on the base material, and the functional solid material layer is the latticed layer.

By adopting such a method, the latticed layer can be produced with use of the raw material and production energy, which are much less than the conventional case, as well as by the less processes as compared with the conventional method.

In a case where the latticed layer is made of an insulator, it is possible to use, as the functional solid material, any insulating material from among the metal oxide ceramics listed above. In another case where the latticed layer is made of a metal, it is possible to use any one of the metals listed above as the functional solid material.

A thin film transistor according to the present invention includes: an oxide conductor layer having a source region, a drain region, and a channel region; a gate electrode for controlling a conductive state of the channel region; and a gate insulating layer provided between the gate electrode and the channel region and made of a ferroelectric material or a paraelectric material. The channel region is thinner than the source region and the drain region. In addition, in this thin film transistor, the oxide conductor layer, in which the channel region is thinner than the source region and the drain region, is formed in accordance with a method of producing a functional device according to the present invention.

In the above thin film transistor, the oxide conductive material is used as the material for the channel region, thereby increasing the carrier density. Furthermore, the ferroelectric material or the paraelectric material is used as the material for the gate insulating layer, thereby realizing quick switching at a low drive voltage. Achieved as a result is quick control on a large current at a low drive voltage, similarly to a conventional thin film transistor.

The above thin film transistor can be produced simply by forming the oxide conductor layer, in which the channel region is thinner than the source region and the drain region, in accordance with a method of producing a functional device according to the present invention. Accordingly, there is no need to form the channel region, the source region, and the drain region with use of the different materials, unlike the conventional thin film transistor. Therefore, the excellent thin film transistor as described above can be produced with use of the raw materials and production energy much less than the conventional case, as well as by the less processes as compared with the conventional method.

A thin film transistor according to the present invention can include an oxide conductor layer having an imprinted structure of high accuracy, which is formed by imprinting a precursor layer that has obtained high plastic deformability by heat treatment at the second temperature in the range from 80° C. to 300° C. As a result, it is possible to obtain the thin film transistor exerting desired performance.

In a thin film transistor according to the present invention, each of the oxide conductor layer, the gate electrode, and the gate insulating layer is preferably made of the functional liquid material.

By adopting such a configuration, as apparent from the embodiments to be described later, the thin film transistor can be produced in accordance with the imprinting technique. As a result, the excellent thin film transistor as described above can be produced with use of the raw materials and production energy, which are much less than the conventional case, as well as by the less processes as compared with the conventional method.

In a thin film transistor according to the present invention, all of the oxide conductor layer, the gate electrode, and the gate insulating layer are preferably formed without adopting the vacuum process (inclusive of a process under a depressurized condition).

By adopting such a configuration, the thin film transistor can be produced without adopting the vacuum process. As a result, the excellent thin film transistor as described above can be produced with use of production energy much less than the conventional case, as well as by the less processes as compared with the conventional method.

In a thin film transistor according to the present invention, each of the oxide conductor layer, the gate electrode, and the gate insulating layer is preferably made of an oxide material.

By adopting such a configuration, it is possible to form each of the oxide conductor layer, the gate electrode, and the gate insulating layer with use of a liquid material, in other words, by using the liquid material as a starting material, in accordance with the imprinting technique. Furthermore, the thin film transistor can obtain high reliability.

In a thin film transistor according to the present invention, each of the gate electrode and the gate insulating layer preferably has a perovskite structure.

By adopting such a configuration, each of the gate electrode and the gate insulating layer has an identical crystal structure, so that the thin film transistor of high quality can be produced with less lattice defect.

In a thin film transistor according to the present invention, the channel region has carrier density and thickness preferably set to such values at which the channel region is entirely depleted when the thin film transistor is in an OFF state.

By adopting such a configuration, the amount of the current flowing in the case where the thin film transistor is in the OFF state can be sufficiently decreased even if the carrier density of the oxide conductor layer is increased. Therefore, it is possible to control a large current at a low drive voltage while keeping a required ON/OFF ratio.

In this case, if the thin film transistor is of the enhancement type, such a thin film transistor is turned into the OFF state upon application of a control voltage of 0 V to the gate electrode. Therefore, the values may be set such that the channel region is entirely depleted in this case. On the other hand, if the thin film transistor is of the depression type, such a thin film transistor is turned into the OFF state upon application of a negative control voltage to the gate electrode. Therefore, the values may be set such that the channel region is entirely depleted in this case.

In a thin film transistor according to the present invention, the channel region preferably has carrier density in the range from $1\times10^{15}$ cm$^{-3}$ to $1\times10^{21}$ cm$^{-3}$, and the channel region preferably has thickness in the range from 5 nm to 100 nm.

By adopting such a configuration, it is possible to control a large current at a low drive voltage while keeping a required ON/OFF ratio.

In a thin film transistor according to the present invention, each of the source region and the drain region preferably has thickness in the range from 50 nm to 1000 nm.

A piezoelectric ink jet head according to the present invention includes: a cavity component; a vibration plate attached to one side of the cavity component and provided with a piezoelectric layer; a nozzle plate attached to another side of the cavity component and provided with a nozzle opening; and an ink chamber defined by the cavity component, the vibration plate, and the nozzle plate. In addition, the piezoelectric layer and/or the cavity component is characterized by being formed in accordance with a method of producing a functional device of the present invention.

In a piezoelectric ink jet head according to the present invention, the piezoelectric layer and/or the cavity component is formed in accordance with a method of producing a functional device of the present invention. Therefore, the piezoelectric ink jet head can be produced with use of the raw materials and production energy, which are much less than the conventional case, as well as by the less processes as compared with the conventional method.

Furthermore, a piezoelectric ink jet head according to the present invention includes the piezoelectric layer and/or the cavity component having an imprinted structure of high accuracy, which is formed by imprinting the precursor layer having obtained high plastic deformability due to heat treatment at the second temperature in the range from 80° C. to 300° C. Accordingly, the piezoelectric ink jet head achieves desired performance.

In a piezoelectric ink jet head according to the present invention, each of the cavity component, the vibration plate, and the piezoelectric layer is preferably formed with use of a functional liquid material.

By adopting such a configuration, it is possible to produce the piezoelectric ink jet head in accordance with the imprinting technique. Therefore, the excellent piezoelectric ink jet head as described above can be produced with use of the raw materials and production energy, which are much less than the conventional case.

In a piezoelectric ink jet head according to the present invention, all of the cavity component, the vibration plate, and the piezoelectric layer are preferably formed without adopting the vacuum process (inclusive of a process under a depressurized condition).

By adopting such a configuration, it is possible to produce the piezoelectric ink jet head without adopting the vacuum process. Therefore, the excellent piezoelectric ink jet head as described above can be produced with use of production energy much less than the conventional case, as well as by the less processes as compared with the conventional method.

Described below are a method of producing a functional device according to the present invention, or a ferroelectric material layer, as one type of the elemental technique, according to an aspect of the present invention, a thin film transistor, and a piezoelectric inkjet head.

An aspect of the present invention can significantly contribute to provision of a method of producing a ferroelectric material layer, which can further improve electrical properties of the ferroelectric material layer (such as high residual polarization properties and low leakage current properties). An aspect of the present invention can significantly contribute also to provision of a thin film transistor of high performance, which includes a gate insulating layer formed in accordance with such a method of producing a ferroelectric material layer. Furthermore, an aspect of the present invention can significantly contribute also to provision of a piezoelectric ink jet head of high performance, which includes a piezoelectric layer formed in accordance with such a method of producing a ferroelectric material layer.

More specifically, a method of producing a ferroelectric material layer according to an aspect of the present invention includes the following steps (1) to (4):

(1) the ferroelectric material precursor layer formation step of applying a sol-gel solution onto a base material to form a precursor layer of a ferroelectric material;

(2) after the ferroelectric material precursor layer formation step, the drying step of heating the precursor layer to the first temperature (exclusively for the production of a ferroelectric material layer) in the range from 120° C. to 250° C.;

(3) after the drying step, the imprinting step of imprinting the precursor layer that is heated to the second temperature (exclusively for the production of a ferroelectric material layer) higher than the first temperature (exclusively for the production of a ferroelectric material layer) and in the range from 150° C. to 300° C. to form an imprinted structure on the precursor layer; and (4) after the imprinting step, the ferroelectric material layer formation step of heat treating the precursor layer at a third temperature (exclusively for the production of a ferroelectric material layer) higher than the second temperature (exclusively for the production of a ferroelectric material layer) to transform the precursor layer into a ferroelectric material layer.

In the present application, referred to for convenience as the sol-gel solution preparation step is the step, to be performed prior to the production method, of preparing the sol-gel solution to serve as the ferroelectric material by heat treatment. Furthermore, as stated earlier, there is no inhibition of performing, between the respective steps, any step not relevant to the purposes of the present invention, such as shifting or inspecting the substrate.

In a method of producing a ferroelectric material layer according to an aspect of the present invention, the precursor layer is dried at the first temperature (exclusively for the production of a ferroelectric material layer) in the range from 120° C. to 250° C., and the precursor layer is imprinted in a state where the precursor layer is heated to the second temperature (exclusively for the production of a ferroelectric material layer) higher than the first temperature (exclusively for the production of a ferroelectric material layer) and in the range from 150° C. to 300° C. As a result, as apparent from Example 3 and the like to be described later, it is possible to further enhance residual polarization of the ferroelectric material layer.

The first temperature (exclusively for the production of a ferroelectric material layer) is set to be "in the range from 120° C. to 250° C." for the following reasons. Firstly, if the first temperature (exclusively for the production of a ferroelectric material layer) is less than 120° C., the precursor layer cannot be sufficiently dried, with a result of difficulty in uniformly imprinting the precursor layer in the imprinting step. On the other hand, if the first temperature (exclusively for the production of a ferroelectric material layer) exceeds 250° C., the precursor layer is solidified excessively and cannot be sufficiently softened (to adequately enhance the plastic deformability of the precursor layer) in the imprinting step. As a result, it is difficult to achieve the sufficient effects of the imprinting. In view of the above, the first temperature (exclusively for the production of a ferroelectric material layer) is more preferably set to be in the range from 120° C. to 250° C.

The second temperature (exclusively for the production of a ferroelectric material layer) is set to be "higher than the first temperature (exclusively for the production of a ferroelectric material layer) and in the range from 150° C. to 300° C." for the following reasons. Firstly, if the second temperature (exclusively for the production of a ferroelectric material layer) is lower than the first temperature (exclusively for the production of a ferroelectric material layer), the precursor layer cannot be sufficiently softened (to adequately enhance the plastic deformability of the precursor layer). As a result, it is difficult to achieve the sufficient effects of the imprinting. In addition, if the second temperature (exclusively for the production of a ferroelectric material layer) is less than 150° C., the precursor layer cannot be sufficiently softened again (to adequately enhance the plastic deformability of the precursor layer), which results in difficulty in achieving the sufficient effects of the imprinting. On the other hand, if the second temperature (exclusively for the production of a ferroelectric material layer) exceeds 300° C., the precursor layer is solidified excessively to be hardened too much, so that the plastic deformability of the precursor layer is deteriorated again. In view of the above, the second temperature (exclusively for the production of a ferroelectric material layer) is more preferably set to be in the range from 200° C. to 300° C.

In a method of producing a ferroelectric material layer according to an aspect of the present invention, each of the first temperature (exclusively for the production of a ferroelectric material layer) and the second temperature (exclusively for the production of a ferroelectric material layer) may be constant or may be varied in a predetermined temperature range. In a method of producing a ferroelectric material layer according to an aspect of the present invention, the "imprinting" includes both the cases of partially imprinting a ferroelectric material layer with use of a convexoconcave mold and entirely imprinting a ferroelectric material layer with use of a flat mold. In a method of producing a ferroelectric material layer according to an aspect of the present invention, the ferroelectric material layer may be imprinted with use of an imprinting apparatus for imprinting a planar base material by pressing a mold at a right angle against the base material. Furthermore, in a method of producing a ferroelectric material layer according to an aspect of the present invention, the ferroelectric material layer may be imprinted with use of an imprinting apparatus for imprinting a planar base material by rotating a roller to a surface of which a mold is attached. Moreover, in a method of producing a ferroelectric material layer according to an aspect of the present invention, the ferroelectric material layer may be imprinted with use of an imprinting apparatus for imprinting a base material such that the base material is attached to a surface of a roller and the roller is rotated on the mold on a plane. When the mold is attached to the surface of the roller, the mold may be formed on the surface itself of the roller, instead of attaching the mold to the surface of the roller.

In a method of producing a ferroelectric material layer according to an aspect of the present invention, preferred examples of the ferroelectric material include PZT (Pb($Zr_x Ti_{1-x}$) $O_3$), BLT ($Bi_{4-x} La_x Ti_3 O_{12}$), Nb doped PZT, La doped PZT, barium titanate ($BaTiO_3$), lead titanate ($PbTiO_3$), BTO ($Bi_4 Ti_3 O_{12}$), SBT ($SrBi_2 Ta_2 O_9$), BZN ($Bi_{1.5} Zn_{1.0} Nb_{1.5} O_7$), and bismuth ferrite ($BiFeO_3$).

In a method of producing a ferroelectric material layer according to an aspect of the present invention, in the imprinting step, the imprinting is more preferably performed with use of the mold that is heated to the fourth temperature (exclusively for the production of a ferroelectric material layer) higher than the first temperature (exclusively for the production of a ferroelectric material layer) and in the range from 150° C. to 300° C.

The fourth temperature (exclusively for the production of a ferroelectric material layer) is set to be "higher than the first temperature (exclusively for the production of a ferroelectric material layer) and in the range from 150° C. to 300° C." for the following reasons. Firstly, if the fourth temperature (exclusively for the production of a ferroelectric material layer) is lower than the first temperature (exclusively for the production of a ferroelectric material layer), the temperature of the precursor layer tends to be decreased at the surface in contact with the mold, though depending on the heat capacity of the mold. In addition, if the fourth temperature (exclusively for the production of a ferroelectric material layer) is less than 150° C., the temperature of the precursor layer also tends to be decreased at the surface in contact with the mold. On the other hand, if the fourth temperature (exclusively for the production of a ferroelectric material layer) exceeds 300° C., the precursor layer is solidified excessively to be hardened too much at the surface in contact with the mold, so that the plastic deformability of the precursor layer is deteriorated again. In view of the above, the fourth temperature (exclusively for the production of a ferroelectric material layer) is more preferably set to be "higher than the first temperature (exclusively for the production of a ferroelectric material layer) and in the range from 200° C. to 300° C.".

In a method of producing a ferroelectric material layer according to an aspect of the present invention, the first temperature (exclusively for the production of a ferroelectric material layer) is preferably set to be in the range from 120° C. to 200° C., and the second temperature (exclusively for the production of a ferroelectric material layer) is preferably set to be higher than the first temperature (exclusively for the production of a ferroelectric material layer) and in the range from 175° C. to 300° C.

In a method of producing a ferroelectric material layer according to an aspect of the present invention, the first temperature (exclusively for the production of a ferroelectric material layer) is set to be in the range from 120° C. to 200° C., and the second temperature (exclusively for the production of a ferroelectric material layer) is set to be higher than the first temperature (exclusively for the production of a ferroelectric material layer) and in the range from 175° C. to 300° C. As a result, as apparent from Example 4 and the like to be described later, it is possible to further decrease the leakage current of the ferroelectric material layer. As apparent from Example 4 and the like, it is more preferred that the first temperature (exclusively for the production of a ferroelectric material layer) is set to be in the range from 150° C. to 175° C., and the second temperature (exclusively for the production of a ferroelectric material layer) is set to be in the range from 200° C. to 300° C.

In a method of producing a ferroelectric material layer according to an aspect of the present invention, in the imprinting step, the imprinting is more preferably performed with use of a mold that is heated to the fourth temperature (exclusively for the production of a ferroelectric material layer) higher than the first temperature (exclusively for the production of a ferroelectric material layer) and in the range from 175° C. to 300° C.

The fourth temperature (exclusively for the production of a ferroelectric material layer) is set to be "higher than the first temperature (exclusively for the production of a ferroelectric material layer) and in the range from 175° C. to 300° C." for the following reasons. Firstly, if the fourth temperature (exclusively for the production of a ferroelectric material layer) is lower than the first temperature (exclusively for the production of a ferroelectric material layer), the temperature of the precursor layer tends to be decreased at the surface in contact with the mold, though depending on the heat capacity of the mold. In addition, if the fourth temperature (exclusively for the production of a ferroelectric material layer) is less than 175° C., the temperature (exclusively for the production of a ferroelectric material layer) of the precursor layer also tends to be decreased at the surface in contact with the mold. On the other hand, if the fourth temperature (exclusively for the production of a ferroelectric material layer) exceeds 300° C., the precursor layer is solidified excessively to be hardened too much at the surface in contact with the mold, so that the plastic deformability of the precursor layer is deteriorated again. In view of the above, the fourth temperature (exclusively for the production of a ferroelectric material layer) is more preferably set to be "higher than the first temperature (exclusively for the production of a ferroelectric material layer) and in the range from 200° C. to 300° C.".

In the method of producing a ferroelectric material layer according to the aspect of the present invention, in the imprinting step, the imprinting is performed preferably by applying a pressure in the range from 1 MPa to 20 MPa.

In the method of producing a ferroelectric material layer according to the aspect of the present invention, as described above, the precursor layer is imprinted in the state where the precursor layer is sufficiently softened (the plastic deformability of the precursor layer is adequately enhanced). As a result, even if the pressure applied upon the imprinting is decreased to be as low as 1 MPa to 20 MPa, it is possible to obtain desired electrical properties improvement effects (the effect of increasing residual polarization and/or the effect of decreasing the leakage current).

The above pressure is set to be in the range "from 1 MPa to 20 MPa" for the following reasons. Firstly, if the pressure is less than 1 MPa, the precursor composition cannot be imprinted sufficiently due to such a too low pressure, which may result in failing to achieve the desired electrical properties improvement effects. On the other hand, the precursor composition can be sufficiently imprinted by applying the pressure as high as 20 MPa, with no need to apply a higher pressure.

In view of the above, in the imprinting step described above, the imprinting is performed more preferably by applying a pressure in the range from 2 MPa to 10 MPa.

Another thin film transistor according to the present invention includes: a source electrode; a drain electrode; a channel layer located between the source electrode and the drain electrode; a gate electrode for controlling a conductive state of the channel layer; and a gate insulating layer provided between the gate electrode and the channel region and made of a ferroelectric material. In addition, the gate insulating layer of this thin film transistor is characterized by being formed in accordance with the method of producing a ferroelectric material layer in the aspect of the present invention.

Another thin film transistor according to the present invention includes the gate insulating layer that is formed in accordance with the method of producing a ferroelectric material layer in the aspect of the present invention and has the "excellent electrical properties (such as high residual polarization properties and low leakage current properties)", thereby being superior to a conventional thin film transistor.

Another thin film transistor according to the present invention includes: an oxide conductor layer having a source region, a drain region, and a channel region; a gate electrode for controlling a conductive state of the channel region; and a gate insulating layer provided between the gate electrode and the channel region and made of a ferroelectric material, in which the channel region is thinner than the source region and the drain region. In addition, the gate insulating layer is characterized by being formed in accordance with the method of producing a ferroelectric material layer in the aspect of the present invention.

Another thin film transistor according to the present invention includes the gate insulating layer that is formed in accordance with the method of producing a ferroelectric material layer in the aspect of the present invention and has the "excellent electrical properties (such as high residual polarization properties and low leakage current properties)", thereby being superior to a conventional thin film transistor.

Furthermore, in another thin film transistor according to the present invention, the oxide conductive material is used as the material for the channel region, thereby increasing the carrier density. Moreover, the ferroelectric material is used as the material for the gate insulating layer, thereby realizing quick switching at a low drive voltage. Achieved as a result is quick control on a large current at a low drive voltage, similarly to a conventional thin film transistor.

In another thin film transistor according to the present invention, the oxide conductor layer, in which the channel region is thinner than the source region and the drain region, is preferably formed in accordance with the imprinting technique.

By adopting such a configuration, it is possible to produce a thin film transistor simply by forming the oxide conductor layer, in which the channel region is thinner than the source region and the drain region. As a result, there is no need to form the channel region, the source region, and the drain region with use of different materials, unlike a conventional thin film transistor. Therefore, the excellent thin film transistor as described above can be produced with use of the raw materials and production energy, which are much less than the conventional case, as well as by the less processes as compared with the conventional method.

In another thin film transistor according to the present invention, each of the oxide conductor layer, the gate electrode, and the gate insulating layer is preferably made of a liquid material.

By adopting such a configuration, as apparent from the embodiments to be described later, the thin film transistor can be produced in accordance with the imprinting technique. As a result, the excellent thin film transistor as described above can be produced with use of the raw materials and production energy, which are much less than the conventional case, as well as by the less processes as compared with the conventional method.

In another thin film transistor according to the present invention, all of the oxide conductor layer, the gate electrode, and the gate insulating layer are preferably formed without adopting the vacuum process.

By adopting such a configuration, the thin film transistor can be produced without adopting the vacuum process. As a result, the excellent thin film transistor as described above can be produced with use of production energy much less than the conventional case, as well as by the less processes as compared with the conventional method.

In another thin film transistor according to the present invention, each of the oxide conductor layer, the gate electrode, and the gate insulating layer is preferably made of an oxide material.

By adopting such a configuration, it is possible to form each of the oxide conductor layer, the gate electrode, and the gate insulating layer with use of a liquid material, in other words, by using the liquid material as a starting material, in accordance with the imprinting technique. Furthermore, the thin film transistor can obtain high reliability.

In another thin film transistor according to the present invention, each of the oxide conductor layer, the gate electrode, and the gate insulating layer preferably has a perovskite structure.

By adopting such a configuration, each of the gate electrode and the gate insulating layer has an identical crystal structure, so that the thin film transistor of high quality can be produced with less lattice defect.

In another thin film transistor according to the present invention, the channel region has carrier density and thickness preferably set to such values at which the channel region is entirely depleted when the thin film transistor is in an OFF state.

By adopting such a configuration, the amount of the current flowing in the case where the thin film transistor is in the OFF state can be sufficiently decreased even if the carrier density of the oxide conductor layer is increased. Therefore, it is possible to control a large current at a low drive voltage while keeping a required ON/OFF ratio.

In this case, if the thin film transistor is of the enhancement type, such a thin film transistor is turned into the OFF state upon application of a control voltage of 0 V to the gate electrode. Therefore, the values may be set such that the entire channel region is depleted in this case. On the other hand, if the thin film transistor is of the depression type, such a thin film transistor is turned into the OFF state upon application of a negative control voltage to the gate electrode. Therefore, the values may be set such that the entire channel region is depleted in this case.

In another thin film transistor according to the present invention, the channel region preferably has carrier density in the range from $1\times10^{15}$ cm$^{-3}$ to $1\times10^{21}$ cm$^{-3}$, and the channel region preferably has thickness in the range from 5 nm to 100 nm.

By adopting such a configuration, it is possible to control a large current at a low drive voltage while keeping a required ON/OFF ratio.

In another thin film transistor according to the present invention, each of the source region and the drain region preferably has thickness in the range from 50 nm to 1000 nm.

Another piezoelectric ink jet head according to the present invention includes: a cavity component; a vibration plate attached to one side of the cavity component and provided with a piezoelectric layer; a nozzle plate attached to another side of the cavity component and provided with a nozzle opening; and an ink chamber defined by the cavity component, the vibration plate, and the nozzle plate. In addition, the piezoelectric layer is characterized by being formed in accordance with the method of producing a ferroelectric material layer in the aspect of the present invention.

Another piezoelectric ink jet head according to the present invention includes the piezoelectric layer that is formed in accordance with the method of producing a ferroelectric material layer in the aspect of the present invention and has the "excellent electrical properties (such as high residual polarization properties and low leakage current properties)", thereby being superior to a conventional piezoelectric ink jet head.

In another piezoelectric ink jet head according to the present invention, each of the cavity component and the piezoelectric layer is preferably made of a liquid material.

By adopting such a configuration, the piezoelectric ink jet head can be produced in accordance with the imprinting technique. As a result, the excellent piezoelectric ink jet head as described above can be produced with use of the raw materials and production energy, which are much less than the conventional case.

In another piezoelectric ink jet head according to the present invention, both of the cavity component and the piezoelectric layer are preferably formed without adopting the vacuum process.

By adopting such a configuration, the piezoelectric ink jet head can be produced without adopting the vacuum process. As a result, the excellent piezoelectric ink jet head as described above can be produced with use of the raw materials and production energy, which are much less than the conventional case, as well as by the less processes as compared with the conventional method.

Described below are the functional device according to the present invention, or a field effect transistor according to an aspect of the present invention as one type of the elemental technique, as well as a method of producing the same.

A field effect transistor according to an aspect of the present invention includes: an oxide conductor layer having a source region, a drain region, and a channel region; a gate electrode for controlling a conductive state of the channel region; and a gate insulating layer provided between the gate electrode and the channel region and made of a ferroelectric material or a paraelectric material. Furthermore, in this field effect transistor, the oxide conductor layer, in which the channel region is thinner than the source region and the drain region and the channel region is thinner than the source region and the drain region, is formed in accordance with the imprinting technique.

In the above field effect transistor, an oxide conductive material is used as the material for the channel region, thereby increasing the carrier density. Furthermore, the ferroelectric material or the paraelectric material is used as the material for the gate insulating layer, thereby realizing quick switching at a low drive voltage. Achieved as a result is quick control on a large current at a low drive voltage, similarly to a conventional field effect transistor.

Moreover, it is possible to produce the field effect transistor described above simply by forming the oxide conductor layer, in which the channel region is thinner than the source region and the drain region. Thus, there is no need to form the channel region, the source region, and the drain region with use of different materials, unlike a conventional field effect transistor. As a result, the excellent field effect transistor as described above can be produced with use of the raw materials and production energy, which are much less than the conventional case.

Furthermore, by adopting the configuration described above, as apparent from the embodiments to be described later, it is possible to simply and easily produce the field effect transistor, without performing, after performing the imprinting, the so-called "post process" such as the photolithography step. Therefore, the excellent field effect transistor as described above can be produced with use of the raw materials and production energy, which are much less than the conventional case.

In a field effect transistor according to an aspect of the present invention, each of the oxide conductor layer, the gate electrode, and the gate insulating layer is preferably made of a liquid material.

By adopting such a configuration, as apparent from the embodiments to be described later, the field effect transistor can be produced in accordance with the imprinting technique. Therefore, the excellent field effect transistor as described above can be produced with use of the raw materials and production energy, which are much less than the conventional case.

In a field effect transistor according to an aspect of the present invention, each of the oxide conductor layer, the gate electrode, and the gate insulating layer is preferably made of an oxide material.

By adopting such a configuration, it is possible to form each of the oxide conductor layer, the gate electrode, and the gate insulating layer with use of a liquid material. Furthermore, the field effect transistor can obtain high reliability.

In a field effect transistor according to an aspect of the present invention, each of the oxide conductor layer, the gate electrode, and the gate insulating layer preferably has a perovskite structure.

By adopting such a configuration, as apparent from the embodiments to be described later, each of the oxide conductor layer, the gate electrode, and the gate insulating layer has an identical crystal structure, so that the field effect transistor of high quality can be produced with less lattice defect.

In a field effect transistor according to an aspect of the present invention, all of the oxide conductor layer, the gate electrode, and the gate insulating layer are preferably formed without adopting the vacuum process.

By adopting such a configuration, the field effect transistor can be produced without adopting the vacuum process. Therefore, the excellent field effect transistor as described above can be produced with use of production energy much less than the conventional case.

In a field effect transistor according to an aspect of the present invention, the channel region has carrier density and thickness preferably set to such values at which the channel region is entirely depleted when the field effect transistor is in an OFF state.

By adopting such a configuration, the amount of the current flowing in the case where the field effect transistor is in the OFF state can be sufficiently decreased even if the carrier density of the oxide conductor layer is increased. Therefore, it is possible to control a large current at a low drive voltage while keeping a required ON/OFF ratio.

In this case, if the field effect transistor is of the enhancement type, such a field effect transistor is turned into the OFF state upon application of a control voltage of 0 V to the gate electrode. Therefore, the values may be set such that the channel region is entirely depleted in this case. On the other hand, if the field effect transistor is of the depression type, such a field effect transistor is turned into the OFF state upon application of a negative control voltage to the gate electrode. Therefore, the values may be set such that the channel region is entirely depleted in this case.

In a field effect transistor according to an aspect of the present invention, the channel region preferably has carrier density in the range from $1 \times 10^{18}$ cm$^{-3}$ to $1 \times 10^{21}$ cm$^{-3}$, and the channel region preferably has thickness in the range from 5 nm to 100 nm.

By adopting such a configuration, it is possible to control a large current at a low drive voltage while keeping a required ON/OFF ratio.

In a field effect transistor according to an aspect of the present invention, each of the source region and the drain region preferably has thickness in the range from 50 nm to 1000 nm.

In a field effect transistor according to an aspect of the present invention, the oxide conductor layer can be made of any oxide conductor material such as indium tin oxide (ITO), indium oxide ($In_2O_3$), antimony doped tin oxide (Sb—$SnO_2$), zinc oxide (ZnO), aluminum doped zinc oxide (Al—ZnO), gallium doped zinc oxide (Ga—ZnO), ruthenium oxide ($RuO_2$), iridium oxide ($IrO_2$), tin oxide ($SnO_2$), tin monoxide SnO, or niobium doped titanium dioxide (Nb—$TiO_2$). In a field effect transistor according to an aspect of the present invention, the oxide conductor layer can be made of amorphous conductive oxide such as indium gallium zinc complex oxide (IGZO), gallium doped indium oxide (In—Ga—O (IGO)), or indium doped zinc oxide (In—Zn—O (IZO)). In a field effect transistor according to an aspect of the present invention, the oxide conductor layer can be made of strontium titanate ($SrTiO_3$), niobium doped strontium titanate (Nb—$SrTiO_3$), strontium barium complex oxide ($SrBaO_2$), strontium calcium complex oxide ($SrCaO_2$), strontium ruthenate ($SrRuO_3$), lanthanum nickel oxide ($LaNiO_3$), lanthanum titanium oxide ($LaTiO_3$), lanthanum copper oxide ($LaCuO_3$), neodymium nickel oxide ($NdNiO_3$), yttrium nickel oxide ($YNiO_3$), lanthanum calcium manganese complex oxide (LCMO), barium plumbate ($BaPbO_3$), LSCO ($La_xSr_{1-x}CuO_3$), LSMO ($La_{1-x}Sr_xMnO_3$), YBCO ($YBa_2Cu_3O_{7-x}$), LNTO ($La(Ni_{1-x}Ti_x)O_3$), LSTO (($La_{1-x}Sr_x$)$TiO_3$), STRO ($Sr(Ti_{1-x}Ru_x)O_3$), any other perovskite conductive oxide, or any other pyrochlore conductive oxide.

In a field effect transistor according to an aspect of the present invention, it is possible to use, as the ferroelectric material, PZT (Pb ($Zr_xTi_{1-x}$) $O_3$), Nb doped PZT, La doped PZT, barium titanate ($BaTiO_3$), lead titanate ($PbTiO_3$), BTO ($Bi_4Ti_3O_{12}$), BLT ($Bi_{4-x}La_xTi_3O_{12}$), SBT ($SrBi_2Ta_2O_9$), BZN ($Bi_{1.5}Zn_{1.0}Nb_{1.5}O_7$), or bismuth ferrite ($BiFeO_3$).

In a field effect transistor according to an aspect of the present invention, it is possible to use, as the paraelectric material, BZN ($Bi_{1.5}Zn_{1.0}Nb_{1.5}O_7$) or BST ($Ba_xSr_{1-x}$)$Ti_3O_{12}$.

In a field effect transistor according to an aspect of the present invention, it is possible to use, as the material for the gate electrode, Pt, Au, Ag, Al, Ti, ITO, $In_2O_3$, Sb—$In_2O_3$, Nb—$TiO_2$, ZnO, Al—ZnO, Ga—ZnO, IGZO, $RuO_2$, $IrO_2$, Nb—STO, $SrRuO_3$, $LaNiO_3$, $BaPbO_3$, LSCO, LSMO, YBCO, or any other perovskite conductive oxide. Furthermore, in a field effect transistor according to an aspect of the present invention, it is possible to use, as the material for the gate electrode, pyrochlore conductive oxide or amorphous conductive oxide.

A field effect transistor according to an aspect of the present invention can be formed on a solid substrate such as an insulating substrate (an insulating substrate obtained by forming an STO ($SrTiO_3$) layer on a surface of a substrate made of quartz glass ($SiO_2$) or an Si substrate with an $SiO_2$ layer and a Ti layer being interposed therebetween, an $SiO_2$/Si substrate, an alumina ($Al_2O_3$) substrate, an SRO ($SrRuO_3$) substrate, an STO ($SrTiO_3$) substrate, or a semiconductor substrate (a silicon (Si) substrate, a silicon carbide (SiC) substrate, or the like).

According to a method of producing a field effect transistor in an aspect of the present invention, there are provided: an oxide conductor layer having a source region, a drain region, and a channel region; a gate electrode for controlling a conductive state of the channel region; and a gate insulating layer provided between the gate electrode and the channel region and made of a ferroelectric material or a paraelectric material. In addition, this method of producing a field effect transistor is for the production of a field effect transistor in which the channel region is thinner than the source region and the drain region. The oxide conductor layer in which the channel region is thinner than the source region and the drain region is formed in accordance with the imprinting technique.

In a method of producing a field effect transistor in an aspect of the present invention, as apparent from the embodiments to be described later, it is therefore possible to simply and easily produce the field effect transistor, without performing, after performing the imprinting, the so-called "post process" such as the photolithography step. Therefore, it is possible to produce with use of the raw materials and production energy, which are much less than the conventional case.

A method of producing a field effect transistor according to an aspect of the present invention preferably includes the following steps (1) to (3):

(1) the first step of forming the gate electrode on one of surfaces of a solid substrate;

(2) after the first step, the second step of applying a solution containing a ferroelectric raw material or a paraelectric raw material at least onto the gate electrode of the solid substrate to form a film containing the ferroelectric raw material or the paraelectric raw material, and then performing heat treatment to form the gate insulating layer; and (3) after the second step, the third step of applying a solution containing an oxide conductive raw material onto the gate insulating layer to form a film containing the oxide conductive raw material, then imprinting the film containing the oxide conductive raw material with use of a convexo-concave mold formed such that the region corresponding to the channel region is convex relatively to the regions corresponding to the source region and the drain region, and subsequently performing heat treatment to form the source region, the drain region, and the channel region.

There is no inhibition of performing, between the respective steps, any step not relevant to the purposes of the present invention, such as shifting or inspecting the substrate.

By adopting such a method, it is possible to produce a field effect transistor (bottom gate) according to an aspect of the present invention.

In a method of producing a field effect transistor according to an aspect of the present invention, in the third step, the imprinting is preferably performed such that the film containing the oxide conductive raw material at the region corresponding to the channel region has predetermined thickness in the range from 5 nm to 100 nm.

Such a method realizes a structure in which the channel region is depleted when an OFF control voltage is applied to the gate electrode. As a result, it is possible to produce a field effect transistor that can control a large current at a low drive voltage while keeping a required ON/OFF ratio.

A method of producing a field effect transistor according to an aspect of the present invention preferably includes the following steps (1) to (3):

(1) the first step of forming the gate electrode on one of surfaces of a solid substrate;
(2) after the first step, the second step of applying a solution containing a ferroelectric raw material or a paraelectric raw material onto one of surfaces of the solid substrate to form a film containing the ferroelectric raw material or the paraelectric raw material, then imprinting the film containing the ferroelectric raw material or the paraelectric raw material with use of a convexoconcave mold formed such that the regions corresponding to the source region and the drain region are convex relatively to the region corresponding to the channel region, and thereafter performing heat treatment to form the gate insulating layer configured such that the region corresponding to the channel region is convex relatively to the regions corresponding to the source region and the drain region; and
(3) after the second step, the third step of applying a solution containing an oxide conductive raw material onto one of the surfaces of the solid substrate to form a film containing the oxide conductive raw material, then imprinting the film containing the oxide conductive raw material with use of a flat mold, and subsequently performing heat treatment to form the source region, the drain region, and the channel region.

There is no inhibition of performing, between the respective steps, any step not relevant to the purposes of the present invention, such as shifting or inspecting the substrate.

Also by adopting such a method, it is possible to produce a field effect transistor (bottom gate) according to an aspect of the present invention.

In a method of producing a field effect transistor according to an aspect of the present invention, in the third step, the imprinting is preferably performed such that the film containing the oxide conductive raw material at the region corresponding to the channel region has predetermined thickness in the range from 5 nm to 100 nm.

Such a method realizes a structure in which the channel region is depleted when an OFF control voltage is applied to the gate electrode. As a result, it is possible to produce a field effect transistor that can control a large current at a low drive voltage while keeping a required ON/OFF ratio.

In a method of producing a field effect transistor according to an aspect of the present invention, in the second step, it is preferred to form the film containing the ferroelectric raw material or the paraelectric raw material on one of the surfaces of the solid substrate, and then flatten the surface of the film containing the ferroelectric raw material or the paraelectric raw material with use of the flat mold.

By adopting such a method, it is possible to uniform the thickness of the gate insulating layer and the thickness of the channel region. It is therefore possible to produce a field effect transistor having uniform properties.

In a method of producing a field effect transistor according to an aspect of the present invention, the third step preferably includes the step of partially removing the film containing the oxide conductive raw material in accordance with the imprinting technique so as to achieve element isolation.

By adopting such a method, it is possible to produce a plurality of field effect transistors, which are independent from each other, on one substrate.

In a method of producing a field effect transistor according to an aspect of the present invention, in the first step, a plating catalytic material is caused to adhere to the portion to be provided with the gate electrode in accordance with the contact printing technique. Thereafter, nonelectrolytic plating is preferably provided to the region, to which the plating catalytic material adheres, so as to form the gate electrode.

By adopting such a method, it is possible to supply the material for the gate electrode only to the portion to be provided with the gate electrode.

In a method of producing a field effect transistor according to an aspect of the present invention, in the first step, the portion to be provided with the gate electrode is lyophilized in accordance with the contact printing technique. Then, ink containing the raw material for the gate electrode is supplied to the lyophilized region. Thereafter, it is preferred to perform heat treatment so as to form the gate electrode.

Also by adopting such a method, it is possible to supply the material for the gate electrode only to the portion to be provided with the gate electrode.

In a method of producing a field effect transistor according to an aspect of the present invention, in the first step, a precursor layer of a conductive oxide material is formed by applying a functional liquid material, which is transformed by heat treatment into the conductive oxide material, onto one of the surfaces of the solid substrate, and an imprinted structure is formed on the precursor layer in accordance with the imprinting technique. Subsequently, the gate electrode is formed by heat treating the precursor layer. This method is another preferred aspect of the present invention.

Also by adopting such a method, it is possible to supply the material for the gate electrode only to the portion to be provided with the gate electrode.

A method of producing a field effect transistor according to an aspect of the present invention preferably includes the following steps (1) to (3):

(1) the first step of applying a solution containing an oxide conductive raw material onto one of surfaces of a solid substrate to form a film containing the oxide conductive raw material, then imprinting the film containing the oxide conductive raw material with use of a convexoconcave mold formed such that the region corresponding to the channel region is convex relatively to the regions corresponding to the source region and the drain region, and subsequently performing heat treatment to form the source region, the drain region, and the channel region;
(2) after the first step, the second step of applying a solution containing a ferroelectric raw material or a paraelectric raw material at least onto the channel region to form a film containing the ferroelectric raw material or the paraelectric raw material, then imprinting the film containing the ferroelectric raw material or the paraelectric raw material with use of a flat mold, and thereafter performing heat treatment to form the gate insulating layer; and
(3) after the second step, the third step of forming the gate electrode on the gate insulating layer.

There is no inhibition of performing, between the respective steps, any step not relevant to the purposes of the present invention, such as shifting or inspecting the substrate.

By adopting such a method, it is possible to produce a field effect transistor (top gate) according to an aspect of the present invention.

In a method of producing a field effect transistor according to an aspect of the present invention, in the first step, the imprinting is preferably performed such that the film containing the oxide conductive raw material at the region corresponding to the channel region has predetermined thickness in the range from 5 nm to 100 nm.

Such a method realizes a structure in which the channel region is depleted when an OFF control voltage is applied to the gate electrode. As a result, it is possible to produce a field effect transistor that can control a large current at a low drive voltage while keeping a required ON/OFF ratio.

In a method of producing a field effect transistor according to an aspect of the present invention, the first step preferably includes the step of partially removing the film containing the oxide conductive raw material in accordance with the imprinting technique so as to achieve element isolation.

By adopting such a method, it is possible to produce a plurality of field effect transistors, which are independent from each other, on one substrate.

In a method of producing a field effect transistor according to an aspect of the present invention, in the third step, preferably, a plating catalytic material is caused to adhere to the portion to be provided with the gate electrode in accordance with the contact printing technique, and then nonelectrolytic plating is provided to the region, to which the plating catalytic material adheres, so as to form the gate electrode.

By adopting such a method, even in the case of the top gate, it is possible to supply the material for the gate electrode only to the portion to be provided with the gate electrode.

In a method of producing a field effect transistor according to an aspect of the present invention, in the third step, the portion to be provided with the gate electrode is lyophilized in accordance with the contact printing technique. Then, ink containing the raw material for the gate electrode is supplied to the lyophilized region. Thereafter, it is preferred to perform heat treatment so as to form the gate electrode.

Also by adopting such a method, even in the case of the top gate, it is possible to supply the material for the gate electrode only to the portion to be provided with the gate electrode.

In a method of producing a field effect transistor according to an aspect of the present invention, as another preferred aspect, in the third step, a precursor layer of a conductive oxide material is formed by applying a functional liquid material, which is transformed by heat treatment into the conductive oxide material, onto one of the surfaces of the solid substrate, and an imprinted structure is formed on the precursor layer in accordance with the imprinting technique, and then the precursor layer is heat treated to form the gate electrode.

Also by adopting such a method, even in the case of the top gate, it is possible to supply the material for the gate electrode only to the portion to be provided with the gate electrode.

In a method of producing a field effect transistor according to an aspect of the present invention, preferably, the solution containing the oxide conductive material additionally includes impurities at a concentration set such that the completed channel region has the carrier density in the range from $1 \times 10^{18}$ cm$^{-3}$ to $1 \times 10^{21}$ cm$^{-3}$.

By adopting such a method, it is possible to produce a field effect transistor that can control a large current at a low drive voltage while keeping a required ON/OFF ratio.

BRIEF DESCRIPTION OF THE DRAWINGS

FIGS. 34(a) and 34(b) are explanatory views of the difference between the leakage current of the ferroelectric material layer according to Embodiment 9 and that of the ferroelectric material layer according to Comparative Example.

DESCRIPTION OF REFERENCE SIGNS

Figure 1:
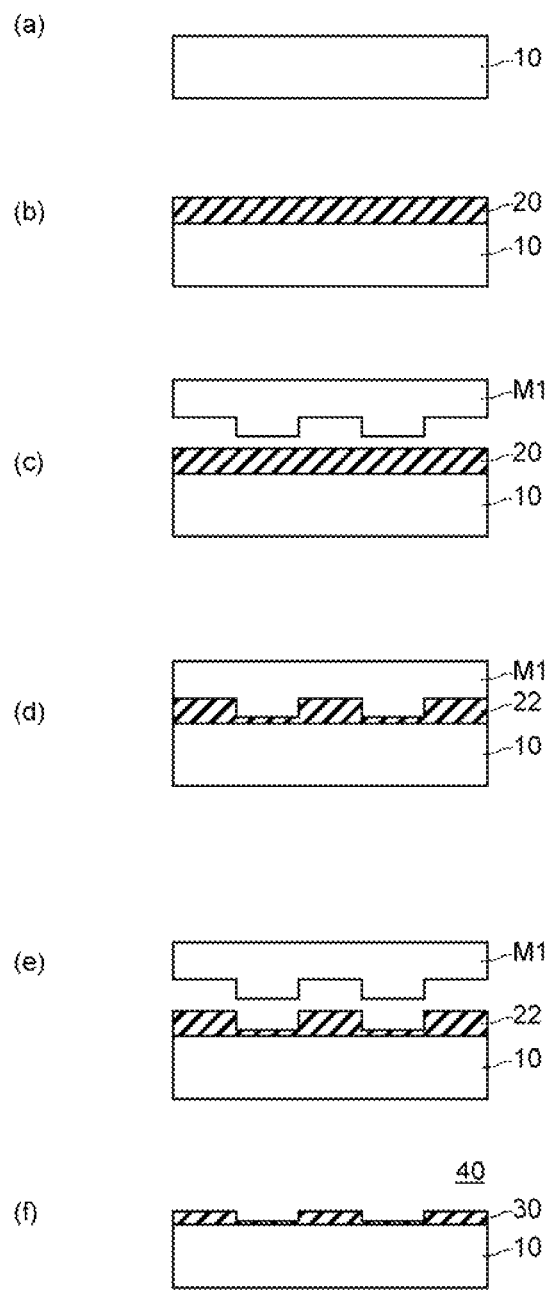
FIGS. 1(a) to 1(f) are explanatory views of a method of producing a functional device according to Embodiment 1.

10: Base material
12A: Capacitor (Center, Embodiment 9)
14A: Capacitor (Periphery, Comparative Example)
20, 22: Precursor layer
22A: Insulating substrate
30: Functional solid material layer
30a, 30b, 30c: Precursor layer
30A: Ferroelectric material layer
32A: Ferroelectric material layer (Center, Embodiment 9)
34A: Ferroelectric material layer (Periphery, Comparative Example)
40, 42, 44, 46, 48: Functional device
42A, 44A: Upper electrode
100, 100A, 200, 200A, 400, 900: Thin film transistor
100B, 200B, 300B, 400B, 500B: Field effect transistor
110, 110A, 110B, 210, 210B, 310B, 410, 410B, 910: Insulating substrate
120, 120A, 120B, 220, 220B, 320B, 420, 420B, 920: Gate electrode
120', 120A', 220', 420': Precursor layer (Gate electrode)
120B': Precursor layer of lanthanum nickel oxide
130, 130A, 130B, 230, 230A, 230B, 330B, 430, 430B, 930: Gate insulating layer 130', 130A', 230', 230A', 430': Precursor layer (Gate insulating layer)
130B', 230B', 330B', 430B', 530B': Film containing ferroelectric raw material
140, 140A, 140B, 240, 240B, 340B, 440, 440B: Oxide conductor layer
140', 140A, 240', 440', 440B': Precursor layer (Oxide conductive layer)
140B', 240B', 340B', 440B': Film containing oxide conductive material
142, 142A, 142B, 242, 242B, 342B, 442, 442B: Channel region
144, 144A, 144B, 244, 244B, 344B: Source region
146, 146A, 146B, 246, 246B, 346B: Drain region
300, 300A: Piezoelectric ink jet head
310, 310A: Dummy substrate
320, 320A: Piezoelectric element
322: First electrode layer
322B: Particulate catalyst
324, 324A: Piezoelectric layer
326: Second electrode layer
330: Nozzle plate
332: Nozzle opening
340: Cavity component
350: Vibration plate
352: Ink supply port
360: Ink chamber
412B: Si substrate
414B: $SiO_2$ layer
444: Source/drain region
444B: Source/drain region
940: Channel layer
950: Source electrode
960: Drain electrode
M1, M2, M3, M4, M5, M6, M7, M8, M9, M10, M11, M12, M13, M1A, M2A, M3A, M4A, M1B, M1a, M3B, M5B, M7B, M8B, M10B, M11B, M12B: Convexoconcave mold
M2B, M4B, M6B, M9B: Flat mold

EMBODIMENTS OF THE INVENTION

A method of producing a functional device, a thin film transistor, and a piezoelectric ink jet head according to embodiments of the present invention are described in detail with reference to the accompanying drawings. In this disclosure, common parts are denoted by common reference signs in all the drawings unless otherwise specified. Furthermore, components according to the embodiments are not necessarily illustrated in accordance with relative scaling in the drawings. Moreover, some of the reference signs may not be indicated for the purpose of easier recognition of the respective drawings.

Embodiment 1

FIGS. 1(a) to 1(f) are explanatory views of a method of producing a functional device according to Embodiment 1.

FIGS. 1(a) to 1(f) show the respective processes.

As shown in FIGS. 1(a) to 1(f), the method of producing a functional device according to Embodiment 1 includes the following processes (1) to (4). Prior to these processes, there may be performed the functional liquid material preparation process of preparing a functional liquid material, which is transformed by heat treatment into a functional solid material made of metal oxide ceramics or a metal. In this method of producing a functional device, the processes are performed in the numbered order. However, each of the processes should not be necessarily performed immediately after the corresponding most recent previous process. For example, this method does not inhibit performing between the respective processes any process not relevant to the purposes of the present embodiment, such as shifting or inspecting the substrate.

(1) the functional solid material precursor layer formation process of applying a functional liquid material onto a base material 10 to form a precursor layer 20 of a functional solid material (see FIGS. 1(a) and 1(b))

(2) the drying process of heating the precursor layer to reach the first temperature in the range from 80° C. to 250° C., so as to preliminarily decrease fluidity of the precursor layer 20

(3) the imprinting process of imprinting the precursor layer 20 in a state where the precursor layer 20 is heated to reach the second temperature in the range from 80° C. to 300° C., so as to form an imprinted structure on a precursor layer 22 (see FIGS. 1(c) to 1(e))

(4) the functional solid material layer formation process of heat treating the precursor layer 22 at a third temperature higher than the second temperature to transform the precursor layer 22 into a functional solid material layer 30 (see FIG. 1(f))

In the method of producing a functional device according to Embodiment 1, for example, it is possible to use, as the functional liquid material, a solution containing metal alkoxide that enables formation of the functional solid material layer made of metal oxide ceramics (such as PZT ($Pb(Zr_x Ti_{1-x})O_3$)), by heat treating in an atmosphere containing oxygen. In this case, the functional solid material layer is made of metal oxide ceramics (such as PZT ($Pb(Zr_xTi_{1-x})O_3$)).

In the method of producing a functional device according to Embodiment 1, there may be used, as the base material, an insulating substrate obtained by forming an STO ($SrTiO_3$) layer on a surface of an Si substrate with an $SiO_2$ layer and a Ti layer being interposed therebetween. For example, the base material is shaped and sized as a rectangular parallelepiped having 20 mm in length, 20 mm in width, and 2 mm in height.

There is used, as a mold, a convexoconcave mold M1 in the method of producing a functional device according to Embodiment 1. More specifically, the convexoconcave mold M1 may have a pattern region of 2 mm×2 mm at the center of a square shape of 10 mm×10 mm. The convexoconcave mold M1 is further provided with a large number of square patterns of 2 μm in length, 2 μm in width, and the difference in height of 200 nm, in the pattern region at pitches of 10 μm in length and width.

According to the method of producing a functional device of Embodiment 1, the functional liquid material is applied onto the base material 10 in the functional solid material precursor layer formation process, so that the precursor layer 20 (230 nm thick) of the functional solid material is formed. Furthermore, according to the method of producing a functional device of Embodiment 1, the precursor layer is imprinted in the imprinting process, so that the precursor layer is deformed to have an imprinted structure (220 nm thick at the convex portions and 20 nm thick at the concave portions).

According to the method of producing a functional device of Embodiment 1, for example, the imprinting is performed by applying the pressure of 4 MPa in the imprinting process.

In the method of producing a functional device according to Embodiment 1, the second temperature is set to 150° C., for example. In the imprinting process, the imprinting is performed with use of the mold heated to 150° C.

According to the method of producing a functional device of Embodiment 1, in the imprinting process, mold releasing treatment is applied to the surface of the precursor layer and mold releasing treatment is applied to an imprinting surface of the mold, and then the precursor layer is imprinted. Examples of a mold releasing agent usable in the mold releasing treatment include a surface active agent (such as a fluorochemical surface active agent, a silicone surface active agent, and a non-ionic surface active agent), and diamond-like carbon containing fluorine.

According to the method of producing a functional device of Embodiment 1, in the functional solid material layer formation process, the volume shrinkage factor may be set to 50% upon transforming the precursor layer having been imprinted into the functional solid material layer.

According to the method of producing a functional device of Embodiment 1, it is possible to form the functional solid material layer having the imprinted structure in which the pattern region of 2 mm×2 mm is provided at the center of the base material and the large number of the square patterns of 2 µm in length, 2 µm in width, and the difference in height of 100 nm (110 nm thick at the convex portions and 10 nm thick at the concave portions) are aligned in the pattern region at the pitches of 10 µm in length and width.

According to the method of producing a functional device of Embodiment 1, the functional liquid material is applied onto the base material so as to form the precursor layer, and the precursor layer is imprinted so as to be provided with the imprinted structure. The precursor layer is further heat treated at a high temperature so as to form the functional solid material layer. As a result, any functional device, such as the excellent thin film transistor as described above, can be produced with use of the raw materials and production energy, which are much less than the conventional case, as well as by the less processes as compared with the conventional method.

According to the method of producing a functional device of the present embodiment, the precursor layer is imprinted, which obtains high plastic deformability by being heated to the second temperature in the range from 80° C. to 300° C. It is therefore possible to form the desired imprinted structure with high accuracy. As a result, it is possible to produce a functional device exerting desired performance.

Furthermore, according to the method of producing a functional device of the present embodiment, the precursor layer is imprinted, which has obtained high plastic deformability as described above. As a result, even in a case where the pressure as low as 1 MPa to 20 MPa is applied upon imprinting, the precursor layer is deformed to follow the shape of the surface of the mold, thereby forming the desired imprinted structure with high accuracy. Moreover, the pressure as low as 1 MPa to 20 MPa is applied upon imprinting, so that the mold is less likely to be damaged during the imprinting process.

According to the method of producing a functional device of Embodiment 1, in the imprinting process, the imprinting is performed with use of the mold that is heated to the fourth temperature in the range from 80° C. to 300° C. As a result, the plastic deformability of the precursor layer is not deteriorated while the imprinting is performed. Therefore, the desired imprinted structure can be formed with higher accuracy.

According to the method of producing a functional device of Embodiment 1, in the imprinting process, after the mold releasing treatment is applied to the surface of the precursor layer and the imprinting surface of the mold, the precursor layer is imprinted. As a result, frictional force between the precursor layer and the mold can be decreased, so that the precursor layer can be imprinted with higher accuracy.

According to the method of producing a functional device of Embodiment 1, the functional liquid material is a solution containing metal alkoxide, and the volume shrinkage factor upon transforming the precursor layer having been imprinted into the functional solid material layer is in the range from 30% to 90%. As a result, the desired imprinted structure can be formed with higher accuracy.

The method of producing a functional device according to Embodiment 1 is applicable to the case of forming at least one selected from the group including the gate electrode layer, the gate insulating layer, the source layer, the drain layer, the channel layer, and the wiring layer in a thin film transistor. In this case, upon formation of the gate electrode layer, there can be used, as the functional solid material, any conductor material from among the metal oxide ceramics listed above or any one of the metals listed above. Furthermore, upon formation of the gate insulating layer, there can be used, as the functional solid material, any paraelectric material or any ferroelectric material from among the metal oxide ceramics listed above. Moreover, upon formation of the source layer, the drain layer, or the channel layer, it is possible to use, as the functional solid material, any semiconductor material or any conductor material from among the metal oxide ceramics listed above.

The method of producing a functional device according to Embodiment 1 is applicable to the case of forming a piezoelectric layer in an actuator. In this case, it is possible to use, as the functional solid material, any ferroelectric material from among the metal oxide ceramics listed above.

The method of producing a functional device according to Embodiment 1 is applicable also to the case of forming a plurality of latticed layers provided in an optical device. In this case, there may be used, as the functional solid material, any insulating material from among the metal oxide ceramics listed above or any one of the metals listed above.

Embodiment 2

Figure 2:
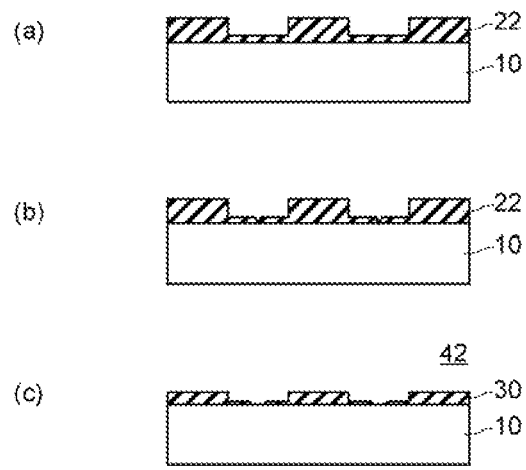
FIGS. 2(a) to 2(c) are explanatory views of a method of producing a functional device according to Embodiment 2.

FIGS. 2(a) to 2(c) are explanatory views of a method of producing a functional device according to Embodiment 2.

FIG. 2(a) shows the state of a precursor layer 22 immediately after a precursor layer 20 is imprinted in the imprinting process. FIG. 2(b) shows the state of the precursor layer 22 while the precursor layer 22 is heat treated to transform the precursor layer 22 into a functional solid material layer 30. FIG. 2(c) shows the state of the functional solid material layer 30 after the completion of the process of transforming the precursor layer 22 into the functional solid material layer 30.

The method of producing a functional device according to Embodiment 2 basically includes processes similar to those of the method of producing a functional device according to Embodiment 1. However, the functional solid material precursor layer formation process according to the present embodiment is different from that of the method of producing a functional device according to Embodiment 1. More specifically, as shown in FIGS. 2(a) to 2(c), in the method of producing a functional device according to Embodiment 2, in the functional solid material precursor layer formation process, the precursor layer 20 is formed to be 220 nm in thickness. Therefore, in the method of producing a functional device according to Embodiment 2, in the imprinting process, the precursor layer 20 is deformed to have an imprinted structure (210 nm thick at the convex portions and 10 nm thick at the concave portions). As a result, due to the heat treatment performed in the imprinting process, cracks are formed at the concave portions of the precursor layer (the regions where the precursor layer is the thinnest).

In the functional solid material layer formation process in the method of producing a functional device according to Embodiment 2, such cracks are formed at the concave portions of the precursor layer (the regions where the precursor layer is the thinnest), so that the precursor layer can be easily contracted in the in-plane direction because of the cracks thus formed. As a result, the desired imprinted structure can be formed with high accuracy.

The method of producing a functional device according to Embodiment 2 is similar to the method of producing a functional device according to Embodiment 1 except for the functional solid material precursor layer formation process. Thus, the method according to the present embodiment exerts corresponding effects from among the effects of the method of producing a functional device according to Embodiment 1.

Embodiment 3

Figure 3:
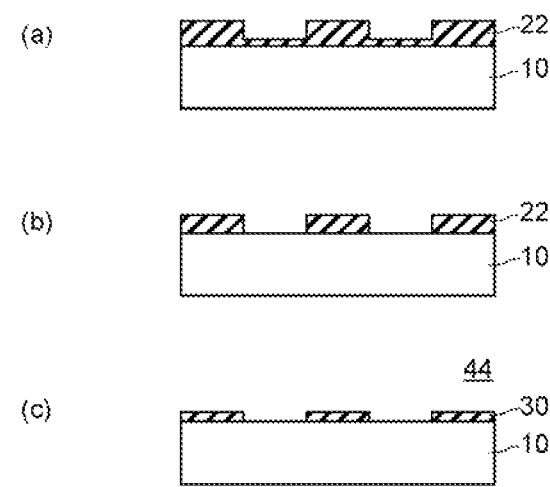
FIGS. 3(a) to 3(c) are explanatory views of a method of producing a functional device according to Embodiment 3.

FIGS. 3(a) to 3(c) are explanatory views of a method of producing a functional device according to Embodiment 3.

FIG. 3(a) shows the state of a precursor layer 22 immediately after a precursor layer 20 is imprinted in the imprinting process. FIG. 3(b) shows the state where the precursor layer 22 is entirely etched after the completion of the imprinting process. FIG. 3(c) shows the state of a functional solid material layer 30 after the completion of the process of transforming the precursor layer 22 into the functional solid material layer 30.

The method of producing a functional device according to Embodiment 3 basically includes processes similar to those of the method of producing a functional device according to Embodiment 1. However, the method according to the present embodiment is different from the method of producing a functional device according to Embodiment 1 in that there is further included, between the imprinting process and the functional solid material layer formation process, the process of entirely etching the precursor layer 22 (the entire etching step). More specifically, as shown in FIGS. 3(a) to 3(c), the method of producing a functional device according to Embodiment 3 further includes, between the imprinting process and the functional solid material layer formation process, the entire etching process of entirely etching the precursor layer 22 by 20 nm. Therefore, in the method of producing a functional device according to Embodiment 3, after the completion of the entire etching process, there is formed an imprinted structure (200 nm thick at the convex portions and 0 nm thick at the concave portions).

In the functional solid material layer formation process in the method of producing a functional device according to Embodiment 3, the precursor layer is divided into a plurality of regions, so that the precursor layer can be easily contracted in the in-plane direction. As a result, the desired imprinted structure can be formed with high accuracy.

The method of producing a functional device according to Embodiment 3 is similar to the method of producing a functional device according to Embodiment 1 except for the feature that the entire etching process of entirely etching the precursor layer 22 is further included between the imprinting process and the functional solid material layer formation process. Thus, the method according to the present embodiment exerts corresponding effects from among the effects of the method of producing a functional device according to Embodiment 1.

Embodiment 4

Figure 4:
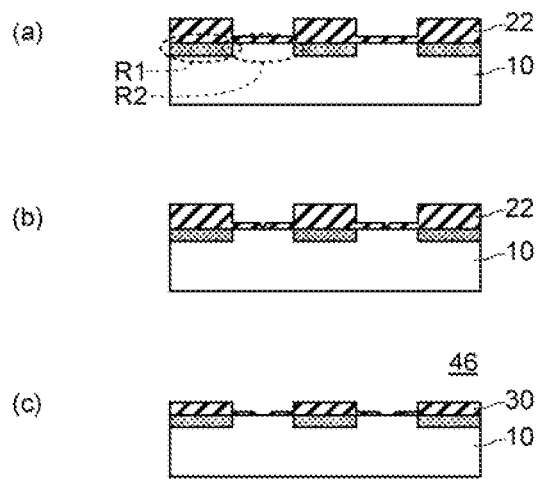
FIGS. 4(a) to 4(c) are explanatory views of a method of producing a functional device according to Embodiment 4.

FIGS. 4(a) to 4(c) are explanatory views of a method of producing a functional device according to Embodiment 4.

FIG. 4(a) shows the state of a precursor layer 22 immediately after a precursor layer 20 is imprinted in the imprinting process. FIG. 4(b) shows the state of the precursor layer 22 while the precursor layer 22 is heat treated to transform the precursor layer 22 into a functional solid material layer 30. FIG. 4(c) shows the state of the functional solid material layer 30 after the completion of the process of transforming the precursor layer 22 into the functional solid material layer 30.

The method of producing a functional device according to Embodiment 4 basically includes processes similar to those of the method of producing a functional device according to Embodiment 2. However, the configuration of a base material according to the present embodiment is different from that in the method of producing a functional device according to Embodiment 2. More specifically, as shown in FIGS. 4(a) to 4(c), in the method of producing a functional device according to Embodiment 4, there is adopted the base material having a surface provided with two regions that have different degrees of affinity to the precursor layer. Accordingly, the precursor layer is deformed to have an imprinted structure in which, out of the two regions, a first region R1 where the degree of affinity to the precursor layer is relatively high is thicker than a second region R2 where the degree of affinity to the precursor layer is relatively low out of the two regions.

Thus, the method of producing a functional device according to Embodiment 4 enhances the degree of affinity between the base material or the surface of the base material and the functional solid material layer, so that the precursor layer is less likely to be contracted in the in-plane direction. Therefore, the pattern on the surface of the base material can be easily matched with the pattern on the functional solid material layer.

The method of producing a functional device according to Embodiment 4 is similar to the method of producing a functional device according to Embodiment 2 except for the configuration of the base material. Thus, the method according to the present embodiment exerts corresponding effects from among the effects of the method of producing a functional device according to Embodiment 2.

Embodiment 5

Figure 5:
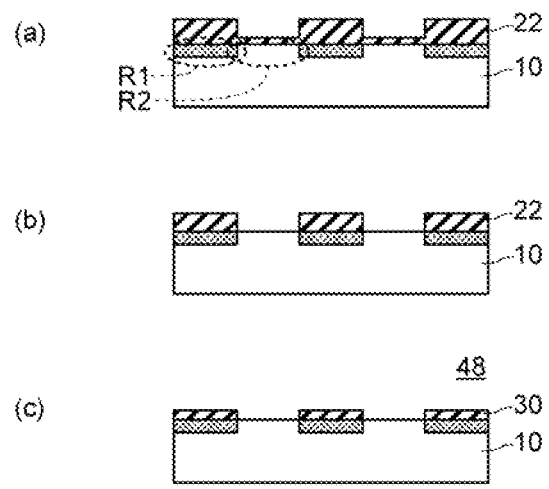
FIGS. 5(a) to 5(c) are explanatory views of a method of producing a functional device according to Embodiment 5.

FIGS. 5(a) to 5(c) are explanatory views of a method of producing a functional device according to Embodiment 5.

FIG. 5(a) shows the state of a precursor layer 22 immediately after a precursor layer 20 is imprinted in the imprinting process. FIG. 5(b) shows the state where the precursor layer 22 is entirely etched after the completion of the imprinting process. FIG. 5(c) shows the state of a functional solid material layer 30 after the completion of the process of transforming the precursor layer 22 into the functional solid material layer 30.

The method of producing a functional device according to Embodiment 5 basically includes processes similar to those of the method of producing a functional device according to Embodiment 3. However, the configuration of a base material according to the present embodiment is different from that in the method of producing a functional device according to Embodiment 3. More specifically, as shown in FIGS. 5(a) to 5(c), the method of producing a functional device according to Embodiment 5 adopts the base material having a surface provided with two regions that have different degrees of affinity to the precursor layer. Accordingly, the precursor layer is deformed to have an imprinted structure in which, out of the two regions, a first region R1 where the degree of affinity to the precursor layer is relatively high is thicker than a second region R2 where the degree of affinity to the precursor layer is relatively low out of the two regions.

Thus, the method of producing a functional device according to Embodiment 5 enhances the degree of affinity between the base material or the surface of the base material and the functional solid material layer. Because the degree of affinity is improved between the base material or the surface of the base material and the functional solid material layer, the precursor layer is less likely to be contracted in the in-plane direction. Therefore, the pattern on the surface of the base material can be easily matched with the pattern on the functional solid material layer.

The method of producing a functional device according to Embodiment 5 is similar to the method of producing a functional device according to Embodiment 3 except for the configuration of the base material. Thus, the method according to the present embodiment exerts corresponding effects from among the effects of the method of producing a functional device according to Embodiment 3.

Embodiment 6

1. Thin Film Transistor 100 According to Embodiment 6

Figure 6:
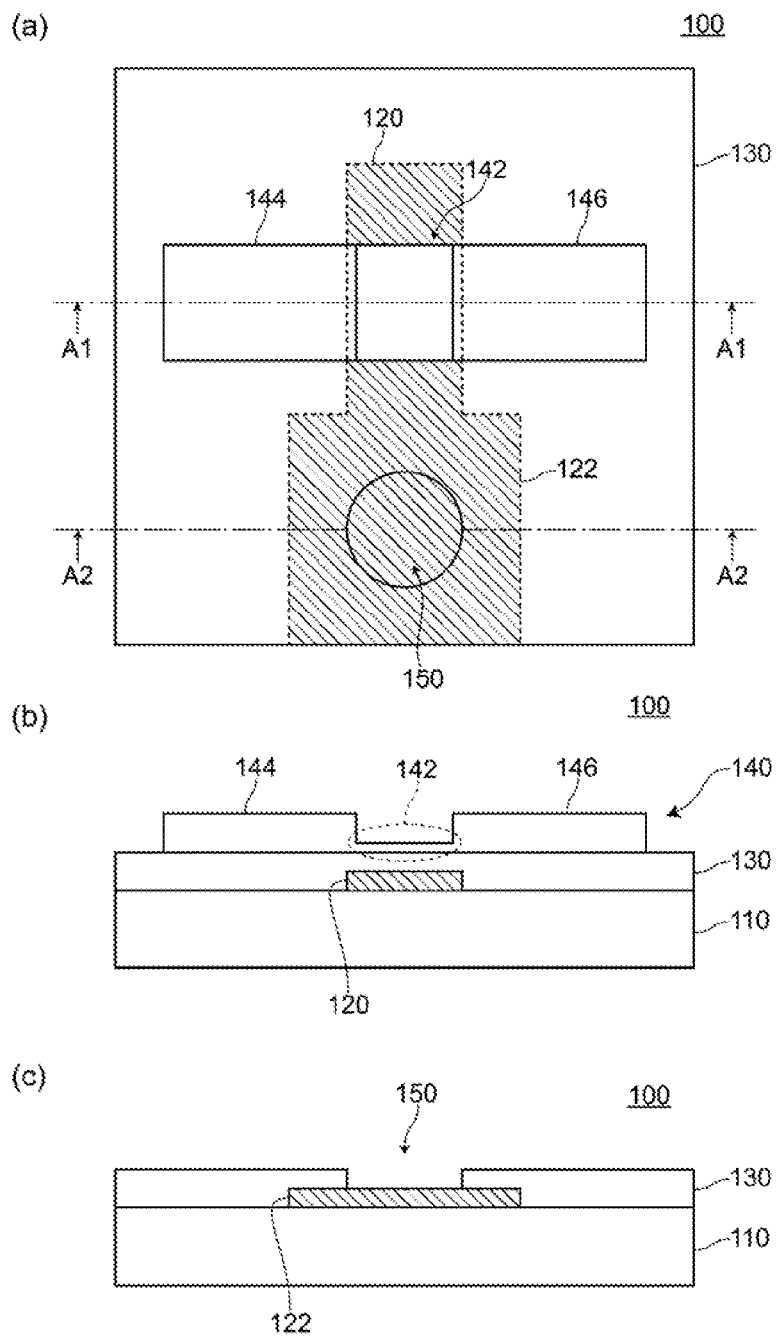
FIGS. 6(a) to 6(c) are explanatory views of a thin film transistor 100 according to Embodiment 6.
Figure 7:
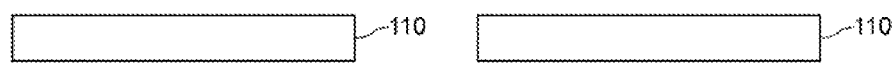
FIGS. 7(a) to 7(e) are explanatory views of a method of producing a thin film transistor according to Embodiment 6.
Figure 7:
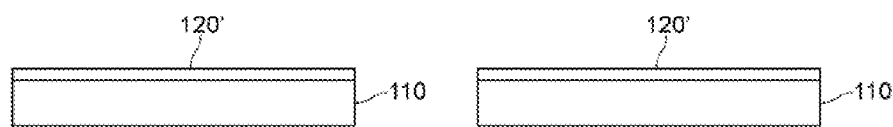
Figure 7:
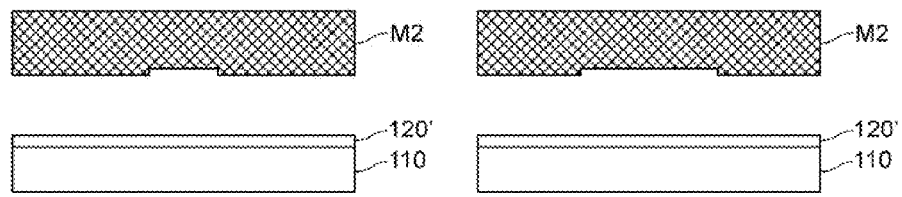
Figure 7:
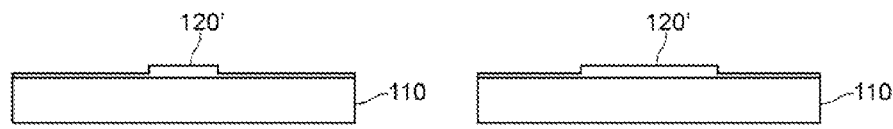
Figure 7:
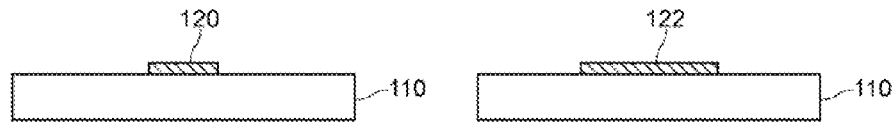
Figure 8:
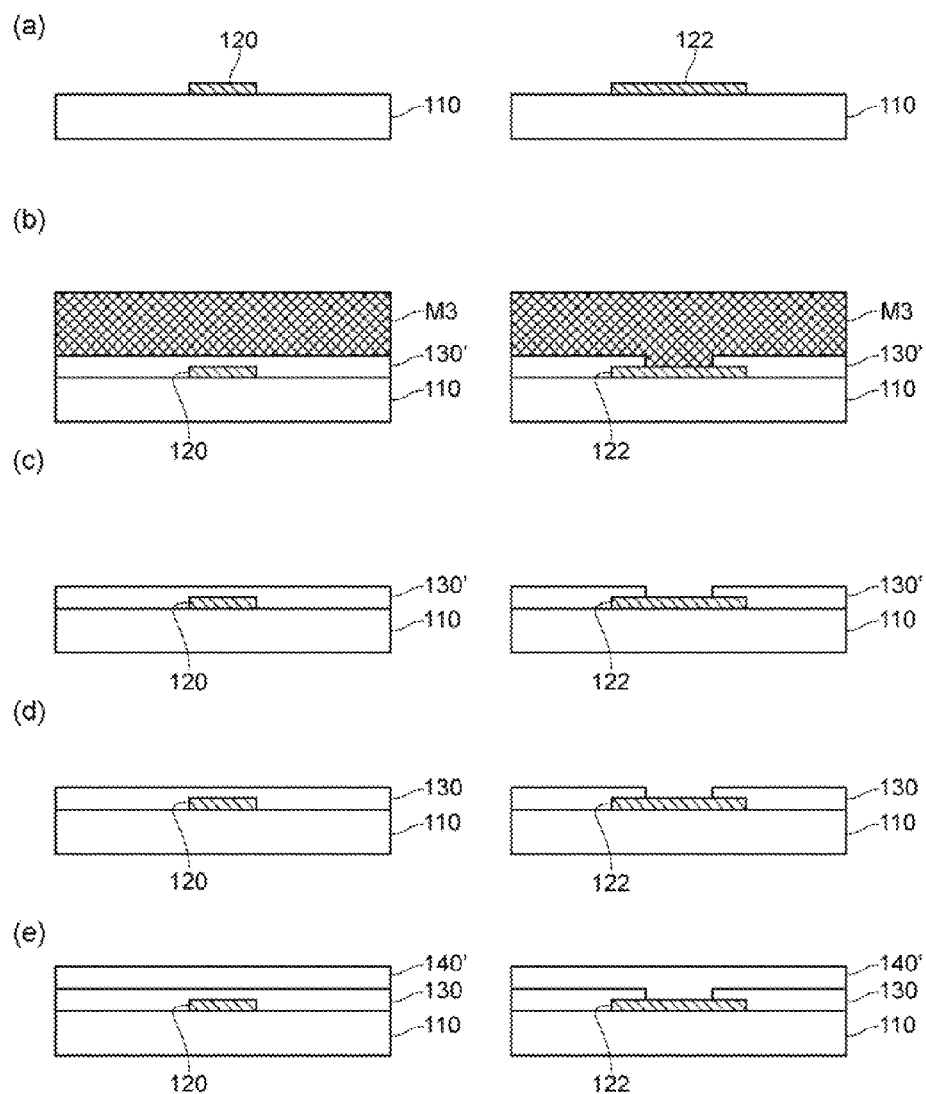
FIGS. 8(a) to 8(e) are explanatory views of the method of producing a thin film transistor according to Embodiment 6.
Figure 9:
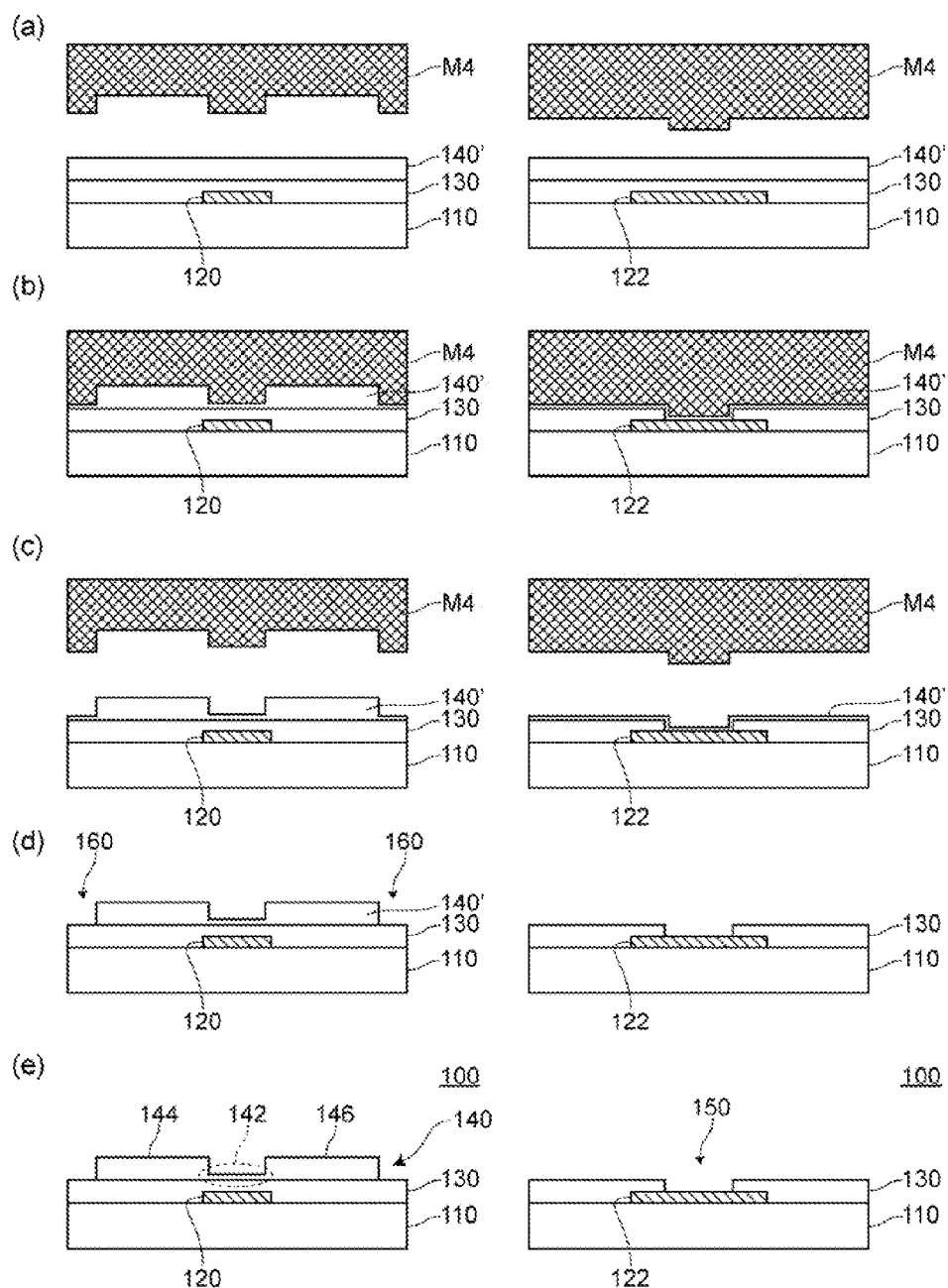
FIGS. 9(a) to 9(e) are explanatory views of the method of producing a thin film transistor according to Embodiment 6.

FIGS. 6(a) to 6(c) are explanatory views of a thin film transistor 100 according to Embodiment 6. FIG. 6(a) is a plan view of the thin film transistor 100. FIG. 6(b) is a sectional view taken along line A1-A1 indicated in FIG. 6(a). FIG. 6(c) is a sectional view taken along line A2-A2 indicated in FIG. 6(a).

As shown in FIGS. 6(a) and 6(b), the thin film transistor 100 according to Embodiment 6 includes an oxide conductor layer 140 having a source region 144, a drain region 146, and a channel region 142, a gate electrode 120 for controlling a conductive state of the channel region 142, and a gate insulating layer 130 provided between the gate electrode 120 and the channel region 142 and made of a ferroelectric material. The channel region 142 is thinner than the source region 144 and the drain region 146. The thickness of the channel region 142 is preferably at most a half of the thickness of each of the source region 144 and the drain region 146. As shown in FIGS. 6(a) and 6(c), the gate electrode 120 is connected to a gate pad 122 that is exposed to outside by way of a through hole 150.

In the thin film transistor 100 according to Embodiment 6, the oxide conductor layer 140 is formed such that the channel region 142 is thinner than the source region 144 and the drain region 146, in accordance with the imprinting technique.

In the thin film transistor 100 according to Embodiment 6, the channel region 142 has the carrier density and the thickness set to such values at which the channel region 142 is depleted when an OFF control voltage is applied to the gate electrode 120. More specifically, the carrier density of the channel region 142 is in the range from $1 \times 10^{15}$ cm$^{-3}$ to $1 \times 10^{21}$ cm$^{-3}$. The thickness of the channel region 142 is in the range from 5 nm to 100 nm.

In the thin film transistor 100 according to Embodiment 6, the source region 144 and the drain region 146 each have thickness in the range from 50 nm to 1000 nm.

The oxide conductor layer 140 is made of indium tin oxide (ITO), and the gate insulating layer 130 is made of PZT (Pb(Zr$_x$Ti$_{1-x}$)O$_3$), for example. Furthermore, the gate electrode 120 is made of lanthanum nickel oxide (LNO (LaNiO$_3$)), for example. An insulating substrate 110, which is solid, may be obtained by forming an STO (SrTiO$_3$) layer on a surface of an Si substrate, with an SiO$_2$ layer and a Ti layer being interposed therebetween.

2. Method of Producing Thin Film Transistor According to Embodiment 6

The thin film transistor 100 according to Embodiment 6 can be produced in accordance with the following method of producing a thin film transistor (the method of producing a thin film transistor according to Embodiment 6). Described step by step below is the method of producing the thin film transistor 100 according to Embodiment 6.

FIGS. 7(a) to 9(e) are explanatory views of the method of producing a thin film transistor according to Embodiment 6. FIGS. 7(a) to 7(e), FIGS. 8(a) to 8(e), and FIGS. 9(a) to 9(e) show the respective processes. In each of the views showing the processes, the portion on the left corresponds to the illustration in FIG. 6(b). The portion on the right corresponds to the illustration in FIG. 6(c).

(1) Formation of Gate Electrode 120

Initially, there is prepared a functional liquid material, which is to be transformed by heat treatment into a functional solid material made of metal oxide ceramics (lanthanum nickel oxide) (the functional liquid material preparation step). More specifically, there is prepared a solution (solvent: 2-methoxyethanol) containing, as metal salts, lanthanum nitrate (hexahydrate) and nickel acetate (tetrahydrate).

Next, as shown in FIGS. 7(a) and 7(b), the functional liquid material is applied onto one of the surfaces of the insulating substrate 110 in accordance with the spin coat technique (500 rpm for 25 seconds, for example). Then, the insulating substrate 110 is laid on a hot plate to be dried at 80° C. for 1 minute. There is thus formed a precursor layer 120' (300 nm thick) of the functional solid material (lanthanum nickel oxide) (the functional solid material precursor layer formation step to the drying step).

Subsequently, as shown in FIGS. 7(c) and 7(d), the precursor layer 120' is imprinted at 150° C. with use of a convexo-concave mold M2 (having the difference in height of 300 nm) formed such that the regions corresponding to the gate electrode 120 and the gate pad 122 are concave. By performing this imprinting, the precursor layer 120' is deformed to have an imprinted structure (300 nm thick at the convex portion and 50 nm thick at the concave portion) (the imprinting step). In this case, the imprinting is performed by applying the pressure of 5 MPa. Therefore, the precursor layer is imprinted, which has obtained high plastic deformability by being heated to the second temperature in the range from 80° C. to 300° C. As a result, it is possible to form the desired imprinted structure with high accuracy.

Then, the precursor layer 120' is entirely etched so that the precursor layer is completely removed at the regions other than the region corresponding to the gate electrode 120 (the entire etching step). The entire etching step is performed in accordance with the wet etching technique without adopting the vacuum process.

Thereafter, the precursor layer 120' is heat treated for 10 minutes at 650° C., which is set as a third temperature, with use of an RTA apparatus. As shown in FIG. 7(e), by performing this heat treatment, the precursor layer 120' is transformed into the gate electrode 120 and the gate pad 122, which are provided as the functional solid material layer (lanthanum nickel oxide) (the functional solid material layer formation step).

(2) Formation of Gate Insulating Layer 130

Initially, there is prepared a functional liquid material, which is to be transformed by heat treatment into a functional solid material made of metal oxide ceramics (PZT). More specifically, prepared as the functional liquid material is a solution containing metal alkoxide (manufactured by Mitsubishi Materials Corporation, PZT sol-gel solution) (the functional liquid material preparation step).

Next, this functional liquid material is applied onto one of the surfaces of the insulating substrate 110 in accordance with the spin coat technique (2000 rpm for 25 seconds, for example). Then, the insulating substrate 110 is laid on a hot plate to be dried at 250° C. for 5 minutes repetitively for 3 times. There is thus formed a precursor layer 130' (300 nm thick) of the functional solid material (PZT) (the functional solid material precursor layer formation step to the drying step).

Subsequently, as shown in FIGS. 8(b) and 8(c), the precursor layer 130' is imprinted at 150° C. with use of a convexoconcave mold M3 (having the difference in height of 300 nm) formed such that the region corresponding to the through hole 150 is convex. By performing this imprinting, the precursor layer 130' is deformed to have an imprinted structure corresponding to the through hole 150 (the imprinting step). In this case, the imprinting is performed by applying the pressure of 5 MPa. Therefore, the precursor layer is imprinted, which has obtained high plastic deformability by being heated to the second temperature in the range from 80° C. to 300° C. As a result, it is possible to form the desired imprinted structure with high accuracy.

Thereafter, the precursor layer 130' is heat treated for 10 minutes at 650° C., which is set as the third temperature, with use of an RTA apparatus. As shown in FIG. 8(d), the precursor layer 130' is thus transformed into the gate insulating layer 130, which is provided as the functional solid material layer (PZT) (the functional solid material layer formation step).

(3) Formation of Oxide Conductor Layer 140

Initially, there is prepared a functional liquid material, which is to be transformed by heat treatment into a functional solid material made of metal oxide ceramics (ITO) (the functional liquid material preparation step). More specifically, prepared as the functional liquid material is a solution containing metal carboxylate, which is one of the metal organic acid salts (the functional liquid material manufactured by Kojundo Chemical Laboratory Co., Ltd. (trade name: ITO-05C), original solution:diluted solution=1:1.5). This functional liquid material additionally includes impurities at a concentration set such that the completed channel region 142 has the carrier density in the range from $1 \times 10^{15}$ cm$^{-3}$ to $1 \times 10^{21}$ cm$^{-3}$.

Next, as shown in FIG. 8(e), this functional liquid material is applied onto one of the surfaces of the insulating substrate 110 in accordance with the spin coat technique (2000 rpm for 25 seconds, for example). Then, the insulating substrate 110 is laid on a hot plate to be dried at 150° C. for 3 minutes. There is thus formed a precursor layer 140' (300 nm thick) of the functional solid material (ITO) (the functional solid material precursor layer formation step to the drying step).

Subsequently, as shown in FIGS. 9(a) to 9(c), the precursor layer 140' is imprinted with use of a convexoconcave mold M4 (having the difference in height of 350 nm) formed such that the region corresponding to the channel region 142 is convex relatively to the regions corresponding to the source region 144 and the drain region 146. By performing this imprinting, the precursor layer 140' is deformed to have an imprinted structure (350 nm thick at the convex portions and 100 nm thick at the concave portions) (the imprinting step). Accordingly, the portion to be transformed into the channel region 142 in the precursor layer 140' is made thinner than the other portions.

According to the present embodiment, in the above step, the precursor layer 140' is imprinted in the state of being heated to 150° C. with use of the mold also heated to 150° C. In this case, the imprinting is performed by applying the pressure of approximately 4 MPa.

The convexoconcave mold M4 is configured such that the regions corresponding to an element isolation region 160 and the through hole 150 are further convex relatively to the region corresponding to the channel region 142. Therefore, when one of the surfaces of the insulating substrate 110 is entirely wet etched, the precursor layer 140' can be completely removed at the regions corresponding to the element isolation region 160 and the through hole 150 while the portion to be transformed into the channel region 142 is made to have predetermined thickness (see FIG. 9(d)). The convexoconcave mold M4 may have a shape tapered at the portion corresponding to the element isolation region.

Thereafter, the precursor layer 140' is heat treated (the precursor layer 140' is baked on a hot plate at 400° C. for 10 minutes, and then the precursor layer 140' is heated with use of an RTA apparatus at 650° C. for 30 minutes (in the oxygen atmosphere for the first 15 minutes and in the nitrogen atmosphere for the second 15 minutes)). By performing this heat treatment, it is possible to form the oxide conductor layer 140 including the source region 144, the drain region 146, and the channel region 142 (the functional solid material layer formation step). As a result, the thin film transistor 100 according to Embodiment 6 can be produced so as to have a bottom gate structure as shown in FIG. 9(e).

3. Effects Exerted by Thin Film Transistor 100 According to Embodiment 6

In the thin film transistor 100 according to Embodiment 6, the oxide conductive material is used as the material for the channel region 142, thereby increasing the carrier density. Furthermore, the ferroelectric material is used as the material for the gate insulating layer 130, thereby realizing quick switching at a low drive voltage. As a result, similarly to the conventional thin film transistor 900, a large current can be quickly controlled at a low drive voltage.

The thin film transistor 100 according to Embodiment 6 can be produced simply by forming the oxide conductor layer 140 in which the channel region 142 is thinner than the source region 144 and the drain region 146. As a result, the channel region as well as the source region and the drain region can be formed with no need to use different materials as in the conventional thin film transistor 900. Therefore, the excellent thin film transistor as described above can be produced with use of the raw materials and production energy much less than the conventional case, as well as by the less processes as compared with the conventional method.

Furthermore, in the thin film transistor 100 according to Embodiment 6, each of the oxide conductor layer, the gate electrode, and the gate insulating layer is made of a functional liquid material. Therefore, the thin film transistor can be produced in accordance with the imprinting technique. As a result, the excellent thin film transistor as described above can be produced with use of the raw materials and production energy, which are much less than the conventional case, as well as by the less processes as compared with the conventional method.

Furthermore, in the thin film transistor 100 according to Embodiment 6, each of the oxide conductor layer, the gate electrode, and the gate insulating layer is formed without adopting the vacuum process. Therefore, the thin film transistor can be produced with no use of the vacuum process. As a result, the excellent thin film transistor as described above can be produced with use of production energy much less than the conventional case, as well as by the less processes as compared with the conventional method.

Moreover, in the thin film transistor 100 according to Embodiment 6, the gate electrode and the gate insulating layer each have a perovskite structure. Therefore, the lattice defect is less likely to occur at the interface between the gate electrode and the gate insulating layer. As a result, the thin film transistor can be produced with high quality.

Moreover, in the thin film transistor 100 according to Embodiment 6, the channel region 142 has the carrier density and the thickness set to such values at which the channel region 142 is depleted when an OFF control voltage is applied to the gate electrode 120. As a result, the amount of the current flowing in the OFF state can be sufficiently decreased even when the carrier density of the oxide conductor layer is increased. Therefore, it is possible to control a large current at a low drive voltage while keeping a required ON/OFF ratio. In this case, if the thin film transistor is of the enhancement type, such a thin film transistor is turned into the OFF state upon application of a control voltage of 0 V to the gate electrode. Therefore, the values may be set such that the channel region is entirely depleted in this case. On the other hand, if the thin film transistor is of the depression type, such a thin film transistor is turned into the OFF state upon application of a negative control voltage to the gate electrode. Therefore, the values may be set such that the channel region is entirely depleted in this case.

Moreover, in the thin film transistor 100 according to Embodiment 6, the carrier density of the channel region 142 is in the range from $1 \times 10^{15}$ cm$^{-3}$ to $1 \times 10^{21}$ cm$^{-3}$, and the thickness of the channel region 142 is in the range from 5 nm to 100 nm. As a result, it is possible to control a large current at a low drive voltage while keeping a required ON/OFF ratio.

Embodiment 7

1. Thin Film Transistor 200 According to Embodiment 7

Figure 10:
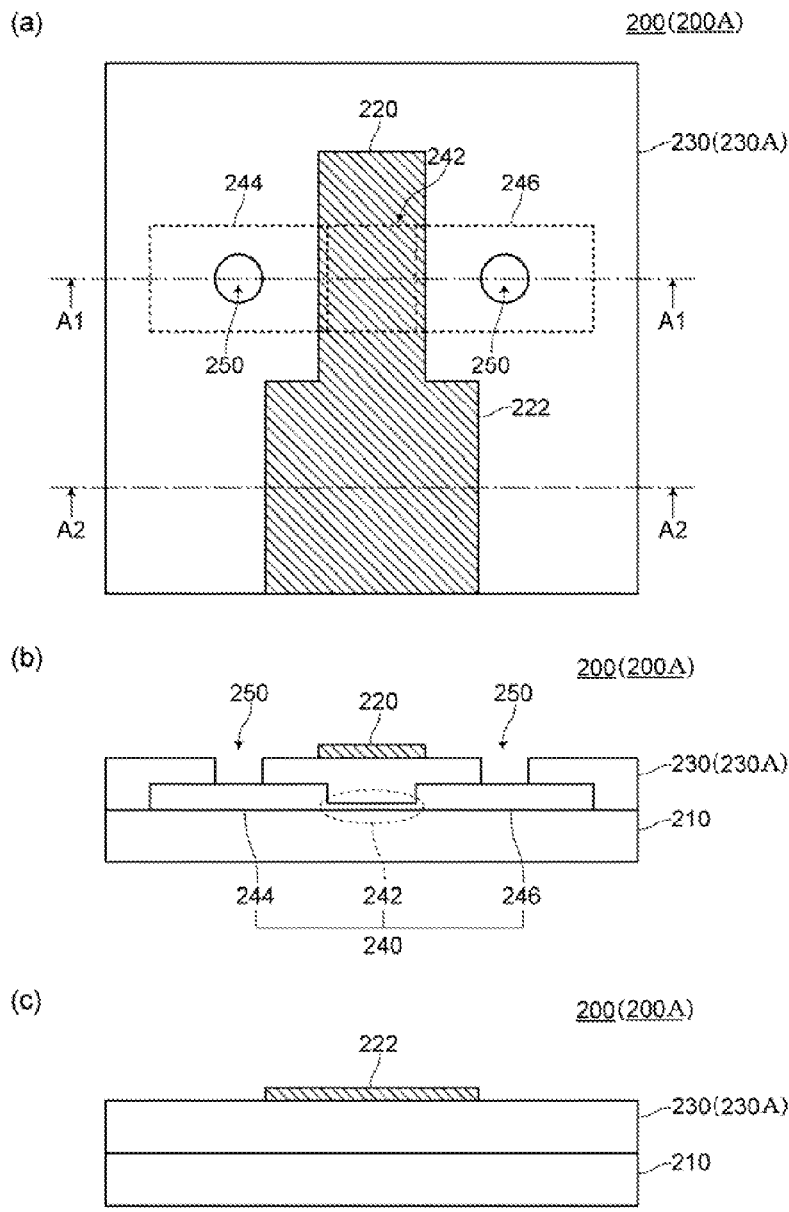
FIGS. 10(a) to 10(c) are explanatory views of a thin film transistor 200 according to Embodiment 7 or a thin film transistor 200A according to Embodiment 11.
Figure 11:
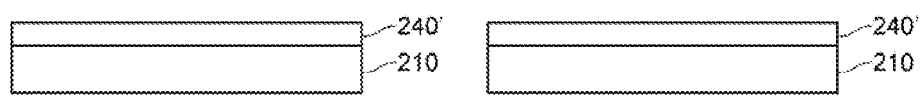
FIGS. 11(a) to 11(f) are explanatory views of a method of producing a thin film transistor according to Embodiment 7 or 11.
Figure 11:
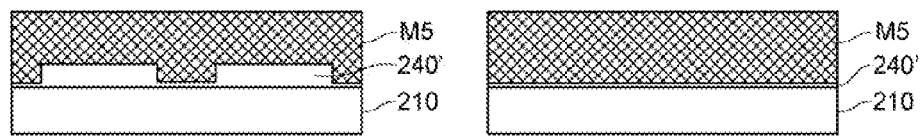
Figure 11:
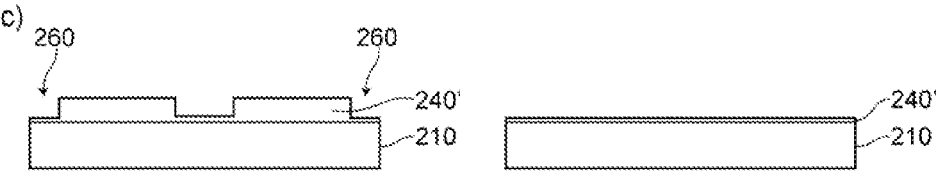
Figure 11:
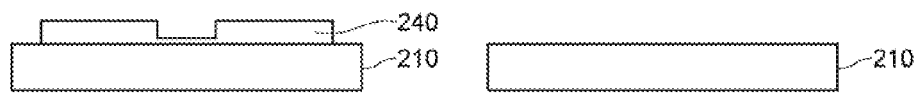
Figure 11:
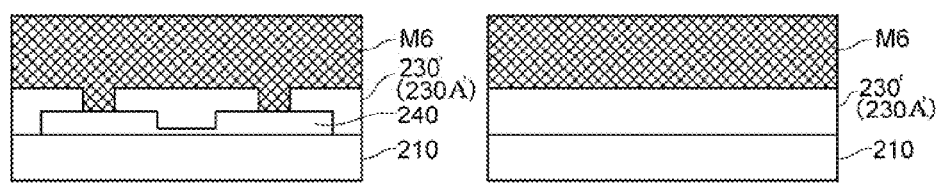
Figure 11:
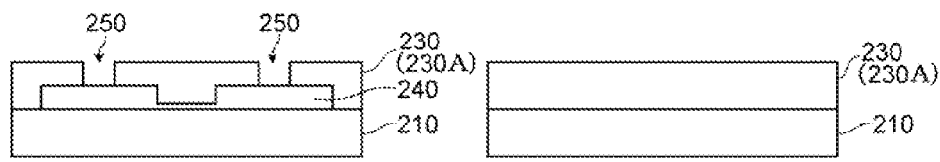
Figure 12:
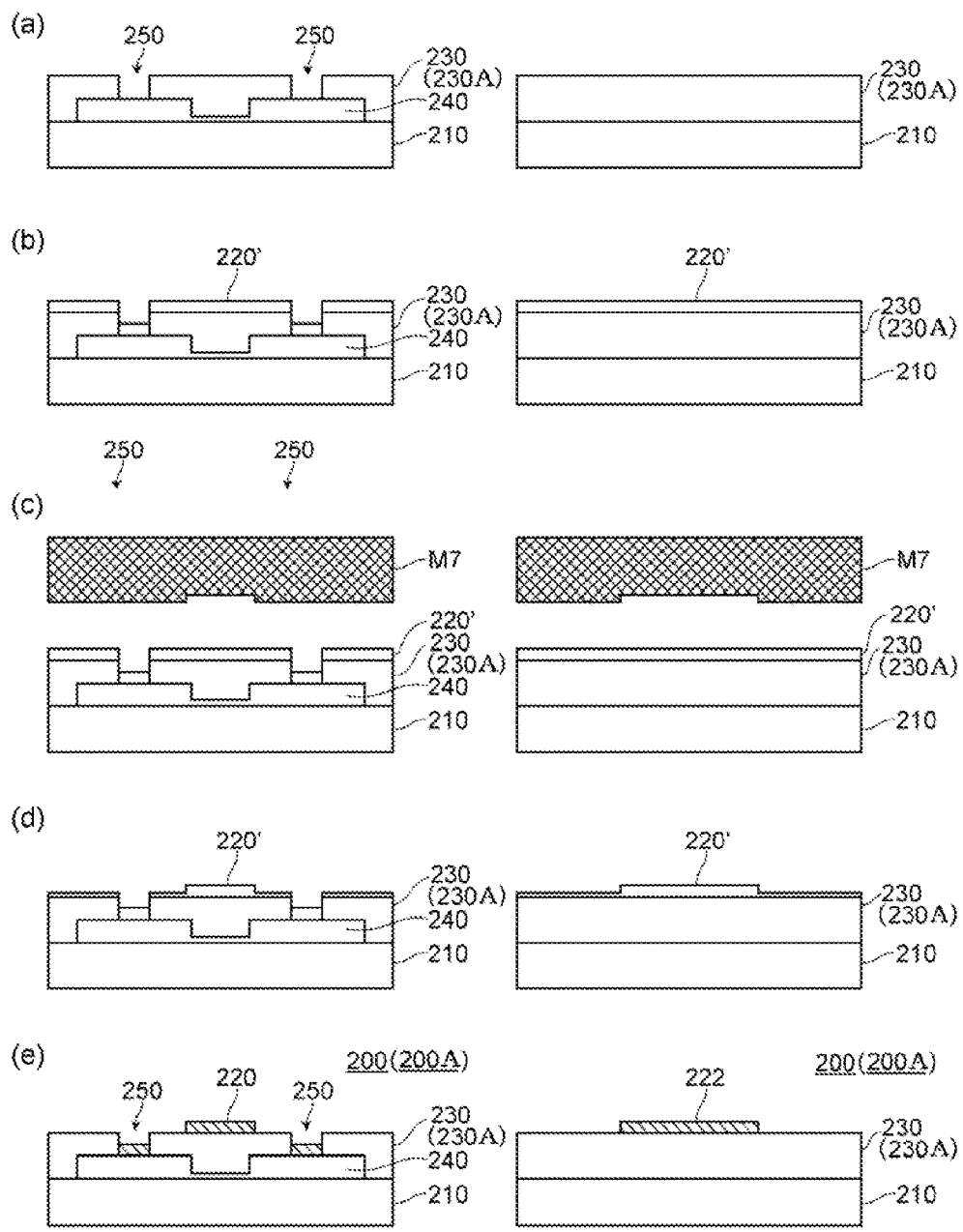
FIGS. 12(a) to 12(e) are explanatory views of the method of producing a thin film transistor according to Embodiment 7 or 11.

FIGS. 10(a) to 10(c) are explanatory views of a thin film transistor 200 according to Embodiment 7.

FIG. 10(a) is a plan view of the thin film transistor 200. FIG. 10(b) is a sectional view taken along line A1-A1 indicated in FIG. 10(a). FIG. 10(c) is a sectional view taken along line A2-A2 indicated in FIG. 10(a).

The thin film transistor 200 according to Embodiment 7 basically has a configuration similar to that of the thin film transistor 100 according to Embodiment 6. However, the thin film transistor of the present embodiment is different from the thin film transistor 100 according to Embodiment 6, in having a top gate structure. More specifically, as shown in FIGS. 10(a) to 10(c), the thin film transistor 200 according to Embodiment 7 has the structure in which an oxide conductor layer 240, a gate insulating layer 230, and a gate electrode 220 are provided in this order on an insulating substrate 210. As shown in FIGS. 10(a) and 10(b), each of a source region 244 and a drain region 246 is exposed to outside by way of a corresponding through hole 250.

As described above, the thin film transistor 200 according to Embodiment 7 is different from the thin film transistor 100 according to Embodiment 6 in having the top gate structure, and an oxide conductive material is used as the material for a channel region 242. As a result, it is possible to increase the carrier density. Furthermore, a ferroelectric material is used as the material for a gate insulating layer 220, thereby realizing quick switching at a low drive voltage. As a result, similarly to the thin film transistor according to Embodiment 6, a large current can be quickly controlled at a low drive voltage.

The thin film transistor can be produced simply by forming the oxide conductor layer 240 in which the channel region 242 is thinner than the source region 244 and the drain region 246. As a result, similarly to the thin film transistor according to Embodiment 6, the excellent thin film transistor as described above can be produced with use of the raw materials and production energy, which are much less than the conventional case, as well as by the less processes as compared with the conventional method.

Furthermore, the thin film transistor 200 according to Embodiment 7 includes the oxide conductor layer having an imprinted structure of high accuracy, which is formed by imprinting a precursor layer having obtained high plastic deformability due to heat treatment at the second temperature in the range from 80° C. to 300° C. As a result, there is obtained the thin film transistor exerting desired performance.

The thin film transistor 200 according to Embodiment 7 can be produced in accordance with the following method of producing a thin film transistor. Described step by step below is the method of producing the thin film transistor 200 according to Embodiment 7.

FIGS. 11(a) to 12(e) are explanatory views of the method of producing a thin film transistor according to Embodiment 7. FIGS. 11(a) to 11(f) and FIGS. 12(a) to 12(e) show the respective processes.

(1) Formation of Oxide Conductor Layer 240

Initially, there is prepared a functional liquid material, which is to be transformed by heat treatment into a functional solid material made of metal oxide ceramics (ITO) (the functional liquid material preparation step). More specifically, prepared as the functional liquid material is a solution containing metal carboxylate, which is one of the metal organic acid salts (the functional liquid material manufactured by Kojundo Chemical Laboratory Co., Ltd. (trade name: ITO-05C)). This functional liquid material additionally includes impurities at a concentration set such that the completed channel region 242 has the carrier density in the range from $1 \times 10^{15}$ cm$^{-3}$ to $1 \times 10^{21}$ cm$^{-3}$.

Next, as shown in FIG. 11(a), this functional liquid material is applied onto one of the surfaces of the insulating substrate 210 in accordance with the spin coat technique. Then, the insulating substrate 210 is laid on a hot plate to be dried at 150° C. for 3 minutes. There is thus formed a precursor layer 240' (300 nm thick) of the functional solid material (ITO) (the functional solid material precursor layer formation step to the drying step).

Subsequently, as shown in FIGS. 11(b) and 11(c), the precursor layer 240' is imprinted with use of a convexoconcave mold M5 (having the difference in height of 350 nm) formed such that the region corresponding to the channel region 242 is convex relatively to the regions corresponding to the source region 244 and the drain region 246. By performing this imprinting, the precursor layer 240' is deformed to have an imprinted structure (350 nm thick at the convex portions and 100 nm thick at the concave portions) (the imprinting step). Accordingly, the portion to be transformed into the channel region 242 is made thinner than the other portions in the precursor layer 240'.

In the above process, the precursor layer 240' is imprinted in the state of being heated to 150° C. with use of the mold also heated to 150° C. In this case, the imprinting is performed by applying the pressure of approximately 4 MPa.

The convexoconcave mold M5 is configured such that the regions corresponding to an element isolation region and a gate pad 222 are further convex relatively to the region corresponding to the channel region 242. Therefore, when one of the surfaces of the insulating substrate 210 is entirely wet etched, the precursor layer 240' can be completely removed at the regions corresponding to an element isolation region 260 and the gate pad 222 while the portion to be transformed into the channel region 242 is made to have predetermined thickness. The convexoconcave mold M5 may have a shape tapered at the portion corresponding to the element isolation region.

Lastly, as shown in FIG. 11(d), the precursor layer 240' is heat treated to form the oxide conductor layer 240 that includes the source region 244, the drain region 246, and the channel region 242 (the functional solid material layer formation step).

(2) Formation of Gate Insulating Layer 230

Initially, there is prepared a functional liquid material, which is to be transformed by heat treatment into a functional solid material made of metal oxide ceramics (PZT) (the functional liquid material preparation step). More specifically, prepared as the functional liquid material is a solution containing metal alkoxide (manufactured by Mitsubishi Materials Corporation, PZT sol-gel solution).

Next, as shown in FIG. 11(e), this functional liquid material is applied onto one of the surfaces of the insulating substrate 210 in accordance with the spin coat technique. Then, the insulating substrate 210 is laid on a hot plate to be dried at 150° C. for 5 minutes. There is thus formed a precursor layer 230' (300 nm thick) of the functional solid material (PZT) (the functional solid material precursor layer formation step to the drying step).

Subsequently, as shown in FIG. 11(e), the precursor layer 230' is imprinted at 150° C. with use of a convexoconcave mold M6 (having the difference in height of 300 nm) formed such that the regions corresponding to the through holes 250 are convex. As a result, the precursor layer 230' is deformed to have an imprinted structure corresponding to the through holes 250 (the imprinting step). In the present embodiment, the imprinting is performed by applying the pressure of 5 MPa. Therefore, the precursor layer is imprinted, which has obtained high plastic deformability by being heated to the second temperature in the range from 80° C. to 300° C. As a result, it is possible to form the desired imprinted structure with high accuracy.

Thereafter, the precursor layer 230' is heat treated for 10 minutes at 650° C., which is set as the third temperature, with use of an RTA apparatus. As shown in FIG. 11(f), by performing this heat treatment, the precursor layer 230' is transformed into the gate insulating layer 230, which is provided as the functional solid material layer (PZT) (the functional solid material layer formation step).

(3) Formation of Gate Electrode 220

Initially, there is prepared a functional liquid material, which is to be transformed by heat treatment into a functional solid material made of metal oxide ceramics (lanthanum nickel oxide) (the functional liquid material preparation step). More specifically, there is prepared a solution (solvent: 2-methoxyethanol) containing, as metal salts, lanthanum nitrate (hexahydrate) and nickel acetate (tetrahydrate).

Next, as shown in FIGS. 12(a) and 12(b), the functional liquid material is applied onto one of the surfaces of the insulating substrate 210 in accordance with the spin coat technique. Then, the insulating substrate 210 is laid on a hot plate to be dried at 80° C. for 1 minute. There is thus formed a precursor layer 220' (300 nm thick) of the functional solid material (lanthanum nickel oxide) (the functional solid material precursor layer formation step to the drying step).

Subsequently, as shown in FIGS. 12(c) and 12(d), the precursor layer 220' is imprinted at 150° C. with use of a convexoconcave mold M7 (having the difference in height of 300 nm) formed such that the regions corresponding to the gate electrode 220 and the gate pad 222 are concave. By performing this imprinting, the precursor layer 220' is deformed to have an imprinted structure (300 nm thick at the convex portion and 50 nm thick at the concave portion) (the imprinting step). In the present embodiment, the imprinting is performed by applying the pressure of 5 MPa. Therefore, the precursor layer is imprinted, which has obtained high plastic deformability by being heated to the second temperature in the range from 80° C. to 300° C. As a result, it is possible to form the desired imprinted structure with higher accuracy.

Then, the precursor layer 220' is entirely etched so that the precursor layer 220' is completely removed at the regions other than the regions corresponding to the gate electrode 220 and the gate pad 222 (the entire etching step). The entire etching process is performed in accordance with the wet etching technique without adopting the vacuum process.

Thereafter, the precursor layer 220' is heat treated for 10 minutes at 650° C., which is set as the third temperature, with use of an RTA apparatus. By performing this heat treatment, the precursor layer 220' is transformed into the gate electrode 220 and the gate pad 222, which are provided as the functional solid material layer (lanthanum nickel oxide) (the functional solid material layer formation step). Therefore, the thin film transistor 200 according to Embodiment 7 can be produced so as to have the top gate structure as shown in FIG. 12(e).

Embodiment 8

Figure 13:
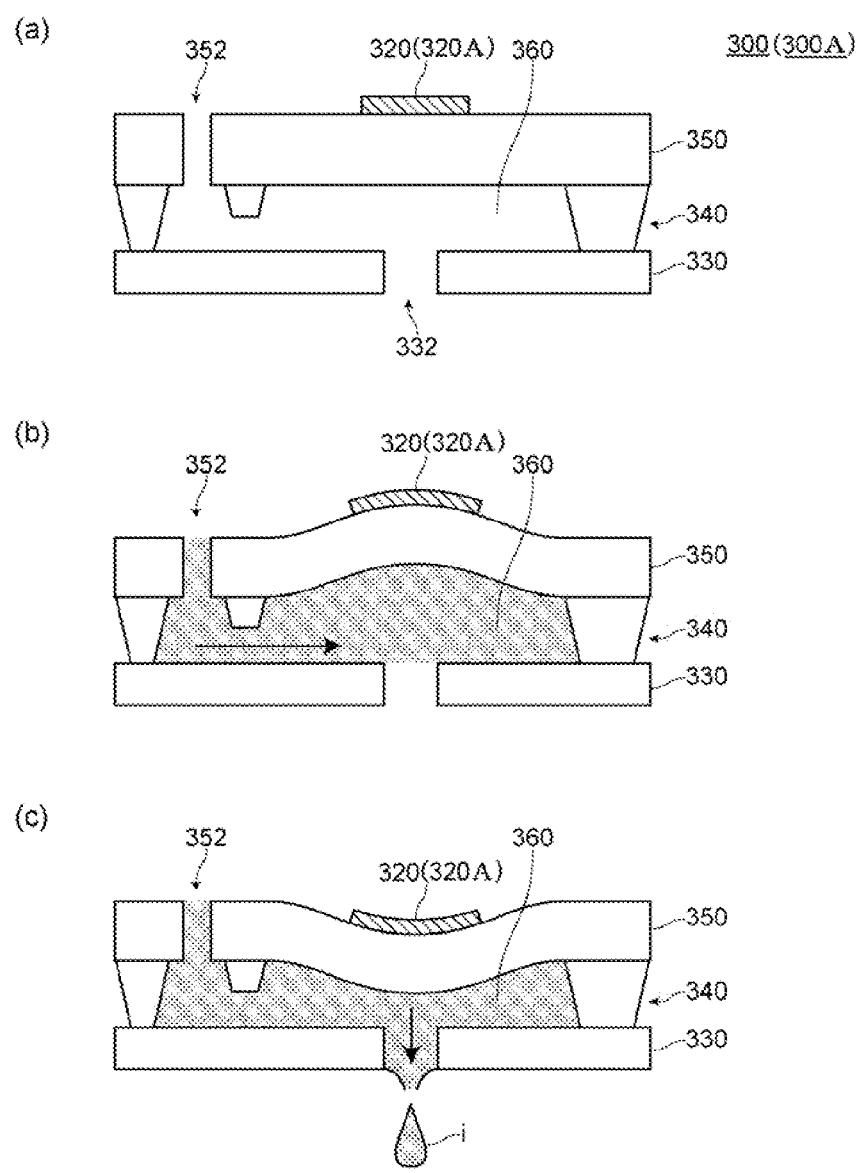
FIGS. 13(a) to 13(c) are explanatory views of a piezoelectric ink jet head 300 according to Embodiment 8 or a piezoelectric ink jet head 300A according to Embodiment 12.

FIGS. 13(a) to 13(c) are explanatory views of a piezoelectric ink jet head 300 according to Embodiment 8. FIG. 13(a) is a sectional view of the piezoelectric ink jet head 300. FIGS. 13(b) and 13(c) each show the state where the piezoelectric ink jet head 300 discharges ink.

1. Configuration of Piezoelectric Ink Jet Head 300 According to Embodiment 8

As shown in FIG. 13(a), the piezoelectric ink jet head 300 according to Embodiment 8 includes a cavity component 340, a vibration plate 350 that is attached to one side of the cavity component 340 and is provided with a piezoelectric element 320, a nozzle plate 330 that is attached to another side of the cavity component 340 and is provided with a nozzle opening 332, and an ink chamber 360 that is defined by the cavity component 340, the vibration plate 350, and the nozzle plate 330. The vibration plate 350 is provided with an ink supply port 352 that is in communication with the ink chamber 360 and is used for supplying ink into the ink chamber 360.

In the piezoelectric ink jet head 300 according to Embodiment 8, initially, as shown in FIGS. 13(b) and 13(c), an appropriate voltage is applied to the piezoelectric element 320, so that the vibration plate 350 is temporarily bent upward and ink is supplied from a reservoir (not shown) into the ink chamber 360. The vibration plate 350 is then bent downward, so that dripped ink i is discharged from the ink chamber 360 through the nozzle opening 332. Therefore, clear printing can be realized on a printing target.

2. Method of producing piezoelectric ink jet head according to Embodiment 8

In the piezoelectric ink jet head 300 configured as described above, both of the piezoelectric element 320 (a first electrode layer 322, a piezoelectric layer 324, and a second electrode layer 326) and the cavity component 340 are formed in accordance with the method of producing a functional device according to the present embodiment. Described step by step below is the method of producing the piezoelectric ink jet head 300 according to Embodiment 8.

FIGS. 14(a) to 16(e) are explanatory views of the method of producing the piezoelectric ink jet head according to Embodiment 8. FIGS. 14(a) to 14(f), FIGS. 15(a) to 15(d), and FIGS. 16(a) to 16(e) show the respective processes.

(1) Formation of Piezoelectric Element 320

(1-1) Formation of First Electrode Layer 322

Initially, there is prepared a functional liquid material, which is to be transformed by heat treatment into a functional solid material made of metal oxide ceramics (lanthanum nickel oxide) (the functional liquid material preparation step). More specifically, there is prepared a solution (solvent: 2-methoxyethanol) containing, as metal salts, lanthanum nitrate (hexahydrate) and nickel acetate (tetrahydrate).

Next, as shown in FIG. 14(a), the functional liquid material is applied onto one of surfaces of a dummy substrate 310 in accordance with the spin coat technique (500 rpm for 25 seconds, for example). Then, the dummy substrate 310 is laid on a hot plate to be dried at 80° C. for 1 minute. There is thus formed a precursor layer 322' (300 nm thick) of the functional solid material (lanthanum nickel oxide) (the functional solid material precursor layer formation step to the drying step).

Figure 14:
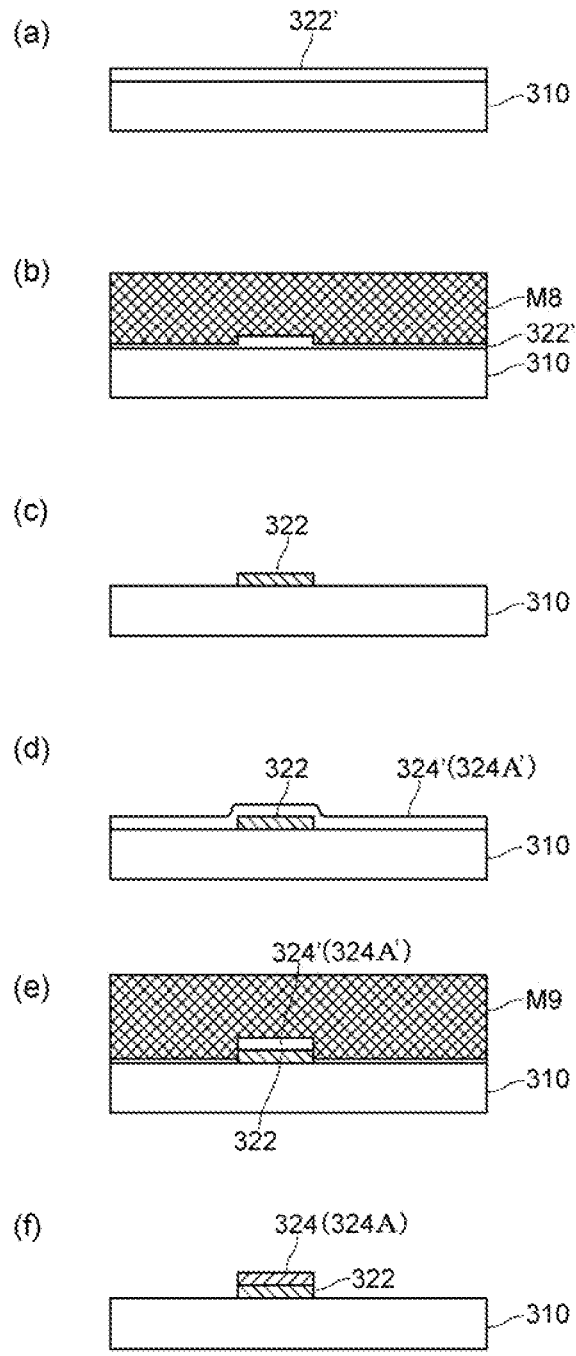
FIGS. 14(a) to 14(f) are explanatory views of a method of producing a piezoelectric ink jet head according to Embodiment 8 or 12.

Subsequently, as shown in FIG. 14(*b*), the precursor layer 322' is imprinted at 150° C. with use of a convexoconcave mold M8 (having the difference in height of 300 nm) formed such that the region corresponding to the first electrode layer 322 is concave. By performing this imprinting, the precursor layer 322' is deformed to have an imprinted structure (300 nm thick at the convex portion and 50 nm thick at the concave portion) (the imprinting step). In this case, the imprinting is performed by applying the pressure of 5 MPa.

Then, the precursor layer 322' is entirely etched so that the precursor layer 322' is completely removed at the regions other than the region corresponding to the first electrode layer 322 (the entire etching step). The entire etching process is performed in accordance with the wet etching technique without adopting the vacuum process.

Thereafter, the precursor layer 322' is heat treated for 10 minutes at 650° C., which is set as the third temperature, with use of an RTA apparatus. As shown in FIG. 14(*c*), a precursor layer 322' is thus transformed into the first electrode layer 322, which is provided as the functional solid material layer (lanthanum nickel oxide) (the functional solid material layer formation step).

(1-2) Formation of Piezoelectric Layer 324

Initially, there is prepared a functional liquid material, which is to be transformed by heat treatment into a functional solid material made of metal oxide ceramics (PZT) (the functional liquid material preparation step). More specifically, prepared as the functional liquid material is a solution containing metal alkoxide (manufactured by Mitsubishi Materials Corporation, PZT sol-gel solution) (the functional liquid material preparation step).

Next, as shown in FIG. 14(*d*), this functional liquid material is applied onto one of the surfaces of the dummy substrate 310 in accordance with the spin coat technique. Then, the dummy substrate 310 is laid on a hot plate to be dried at 250° C. for 5 minutes. There is thus formed a precursor layer 324' (1 μm to 10 μm thick, for example) of the functional solid material (PZT) (the functional solid material precursor layer formation step to the drying step).

Subsequently, as shown in FIG. 14(*e*), the precursor layer 324' is imprinted with use of a convexoconcave mold M9 (having the difference in height of 500 nm) formed such that the region corresponding to the piezoelectric layer 324 is concave. By performing this imprinting, the precursor layer 324' is deformed to have an imprinted structure (1 μm to 10 μm thick at the convex portion and 50 nm thick at the concave portion) (the imprinting step).

In the above process, the precursor layer 324' is imprinted in the state of being heated to 150° C. with use of the mold also heated to 150° C. In this case, the imprinting is performed by applying the pressure of approximately 4 MPa.

Then, the precursor layer 324' is entirely etched so that the precursor layer 324' is completely removed at the regions other than the region corresponding to the piezoelectric layer 324 (the entire etching step). The entire etching process is performed in accordance with the wet etching technique without adopting the vacuum process.

Thereafter, the precursor layer 324' is heat treated for 10 minutes at 650° C., which is set as the third temperature, with use of an RTA apparatus. As shown in FIG. 14(*f*), by performing this heat treatment, the precursor layer 324' is transformed into the piezoelectric layer 324, which is provided as the functional solid material layer (PZT) (the functional solid material layer formation step).

(1-3) Formation of Second Electrode Layer 326

Initially, there is prepared a functional liquid material, which is to be transformed by heat treatment into a functional solid material made of metal oxide ceramics (lanthanum nickel oxide) (the functional liquid material preparation step). More specifically, there is prepared a solution (solvent: 2-methoxyethanol) containing, as metal salts, lanthanum nitrate (hexahydrate) and nickel acetate (tetrahydrate).

Figure 15:
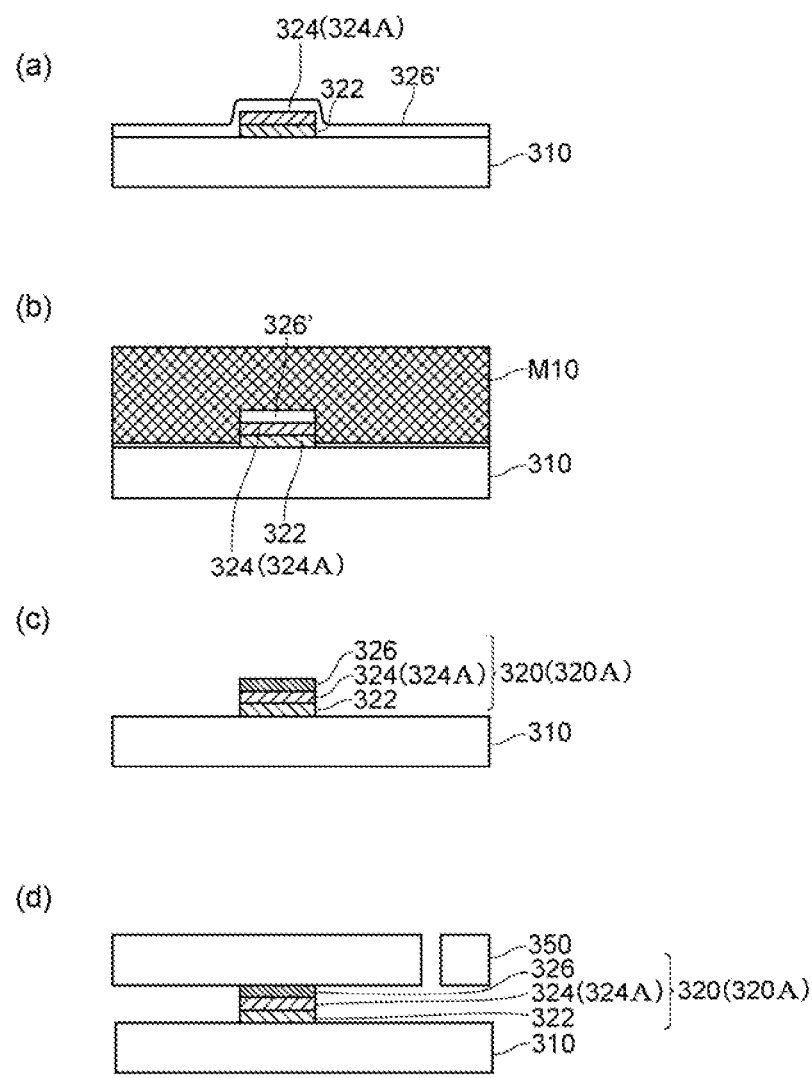
FIGS. 15(a) to 15(d) are explanatory views of the method of producing a piezoelectric ink jet head according to Embodiment 8 or 12.

Next, as shown in FIG. 15(*a*), the functional liquid material is applied onto one of the surfaces of the dummy substrate 310 in accordance with the spin coat technique (500 rpm for 25 seconds, for example). Then, the dummy substrate 310 is laid on a hot plate to be dried at 80° C. for 1 minute. There is thus formed a precursor layer 326' (300 nm thick) of the functional solid material (lanthanum nickel oxide) (the functional solid material precursor layer formation step to the drying step).

Subsequently, as shown in FIG. 15(*b*), the precursor layer 326' is imprinted at 150° C. with use of a convexoconcave mold M10 (having the difference in height of 300 nm) formed such that the region corresponding to the second electrode layer 326 is concave. By performing this imprinting, the precursor layer 326' is deformed to have an imprinted structure (300 nm thick at the convex portion and 50 nm thick at the concave portion) (the imprinting step). In this case, the imprinting is performed by applying the pressure of 5 MPa.

Then, the precursor layer 326' is entirely etched so that the precursor layer 326' is completely removed at the regions other than the region corresponding to the second electrode layer 326 (the entire etching step). The entire etching process is performed in accordance with the wet etching technique without adopting the vacuum process.

Thereafter, the precursor layer 326' is heat treated for 10 minutes at 650° C., which is set as the third temperature, with use of an RTA apparatus. As shown in FIG. 15(*c*), by performing this heat treatment, the precursor layer 326' is transformed into the second electrode layer 326, which is provided as the functional solid material layer (lanthanum nickel oxide) (the functional solid material layer formation step). Accordingly completed is the piezoelectric element 320 that includes the first electrode layer 322, the piezoelectric layer 324, and the second electrode layer 326.

(2) Bonding Between Vibration Plate 350 and Piezoelectric Element 320

As shown in FIG. 15(*d*), the vibration plate 350 provided with the ink supply port 352 and the piezoelectric element 320 are bonded to each other with use of an adhesive agent.

(3) Formation of Cavity Component 340

Initially, there is prepared a functional liquid material, which is to be transformed by heat treatment into a functional solid material made of metal oxide ceramics (quartz glass) (the functional liquid material preparation step). More specifically, prepared as the functional liquid material is a solution containing metal alkoxide (isopropyl silicate (Si(OC$_3$H$_7$)$_4$)).

Figure 16:
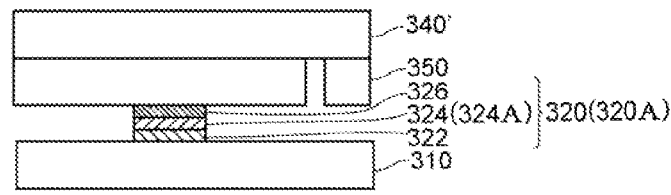
FIGS. 16(a) to 16(e) are explanatory views of the method of producing a piezoelectric ink jet head according to Embodiment 8 or 12.
Figure 16:
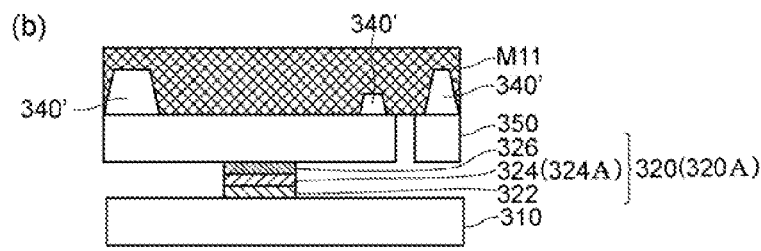
Figure 16:
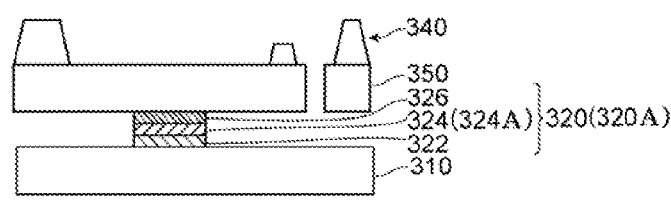
Figure 16:
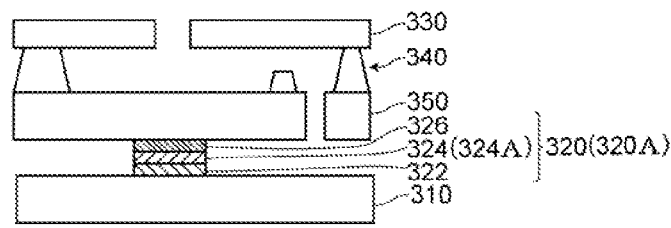
Figure 16:
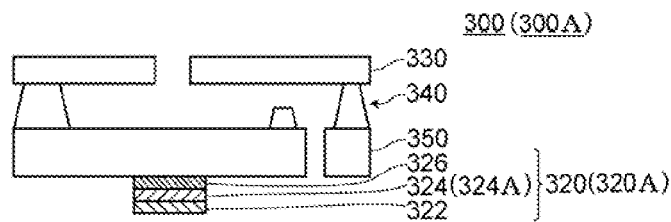

Next, as shown in FIG. 16(*a*), this functional liquid material is applied onto one of the surfaces of the vibration plate 350 in accordance with the spin coat technique. Then, the dummy substrate 310 is laid on a hot plate to be dried at 150° C. for 5 minutes. There is thus formed a precursor layer 340' (10 μm to 20 μm thick, for example) of the functional solid material (quartz glass) (the functional solid material precursor layer formation step to the drying step).

Then, as shown in FIG. 16(*b*), the precursor layer 340' is imprinted with use of a convexoconcave mold M11 that has a shape corresponding to the ink chamber 360 and the like. By performing this imprinting, the precursor layer 340' is deformed to have an imprinted structure (10 μm to 20 μm thick at the convex portions and 50 nm thick at the concave portions) (the imprinting step).

In the above process, the precursor layer 340' is imprinted in the state of being heated to 150° C. with use of the mold also heated to 150° C. In this case, the imprinting is performed by applying the pressure of approximately 4 MPa.

Thereafter, the precursor layer 340' is heat treated for 10 minutes at 650° C., which is set as the third temperature, with use of an RTA apparatus. As shown in FIG. 16(c), by performing this heat treatment, the precursor layer 340' is transformed into the cavity component 340, which is provided as the functional solid material layer (quartz glass).

(4) Bonding Between Cavity Component 340 and Nozzle Plate 330

As shown in FIG. 16(d), the cavity component 340 and the nozzle plate 330 provided with the nozzle opening 332 are bonded to each other with use of an adhesive agent.

(5) Detachment of Dummy Substrate 310

As shown in FIG. 16(e), the dummy substrate 310 is detached from the piezoelectric element 320. As a result, there is completed the piezoelectric ink jet head 300 according to Embodiment 8.

3. Effects Exerted by Piezoelectric Ink Jet Head 300 According to Embodiment 8

In the piezoelectric ink jet head 300 according to Embodiment 8, the piezoelectric element 320 (the first electrode layer 322, the piezoelectric layer 324, and the second electrode layer 326) and the cavity component 340 are formed in accordance with the imprinting technique. Therefore, the piezoelectric ink jet head can be produced with use of the raw materials and production energy, which are much less than the conventional case, as well as by the less processes as compared with the conventional method.

Furthermore, the piezoelectric ink jet head 300 according to Embodiment 8 includes the first electrode layer, the piezoelectric layer, the second electrode layer, and the cavity component each having the imprinted structure of high accuracy, which are formed by imprinting the precursor layer having obtained high plastic deformability due to heat treatment at the second temperature in the range from 80° C. to 300° C. Accordingly, the piezoelectric ink jet head achieves desired performance.

In the piezoelectric ink jet head 300 according to Embodiment 8, each of the piezoelectric element 320 (the first electrode layer 322, the piezoelectric layer 324, and the second electrode layer 326) and the cavity component 340 is formed with use of a functional liquid material. Therefore, the piezoelectric ink jet head can be produced in accordance with the imprinting technique. Moreover, the excellent piezoelectric ink jet head as described above can be produced with use of the raw materials and production energy, which are much less than the conventional case.

Furthermore, in the piezoelectric ink jet head 300 according to Embodiment 8, both of the piezoelectric element 320 (the first electrode layer 322, the piezoelectric layer 324, and the second electrode layer 326) and the cavity component 340 are formed without adopting the vacuum process. Therefore, the excellent piezoelectric ink jet head as described above can be produced with use of production energy, which is much less than the conventional case, as well as by the less processes as compared with the conventional method.

EXAMPLES

Example 1

Example 1 indicates that a thin film transistor according to an aspect of the present invention can be produced in accordance with the imprinting technique.

1. Formation of Thin Film Transistor 400

Figure 17:
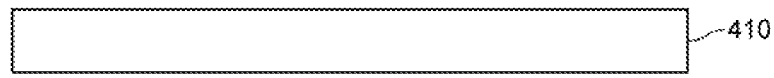
FIGS. 17(a) to 17(e) are explanatory views of a method of producing a thin film transistor according to Example 1.
Figure 17:
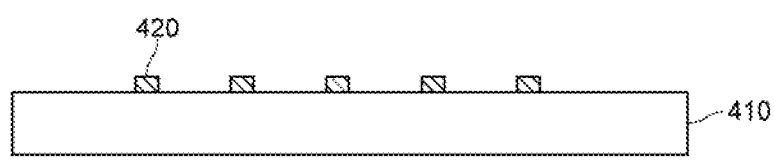
Figure 17:
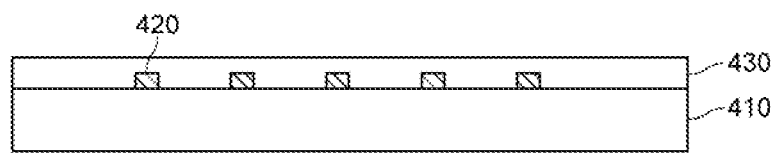
Figure 17:
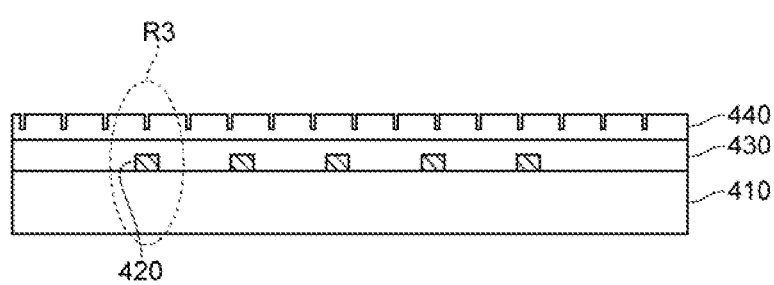
Figure 17:
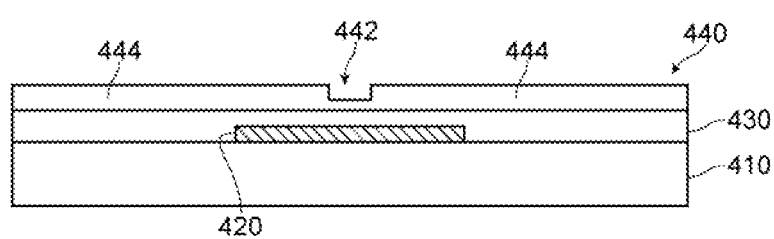

FIGS. 17(a) to 17(e) are explanatory views of a method of producing a thin film transistor according to Example 1. FIGS. 17(a) to 17(d) show the respective processes. FIG. 17(e) shows the portion denoted by reference sign R3 indicated in FIG. 17(d), the portion being extended in the lateral direction.

Figure 18:
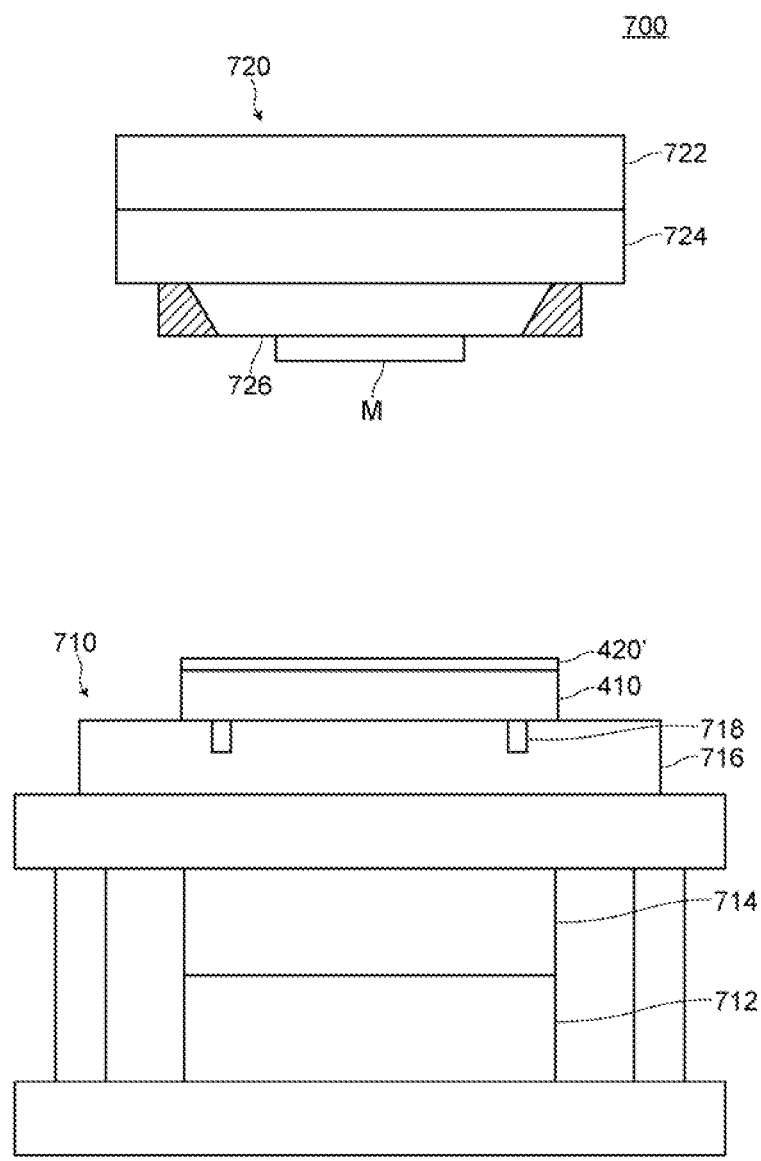
FIG. 18 is an explanatory view of an imprinting apparatus 700 used in Example 1.

FIG. 18 is an explanatory view of an imprinting apparatus 700 used in Example 1. In FIG. 18, reference sign 710 denotes a lower mold, reference sign 712 denotes a heat shield plate, reference sign 714 denotes a heater, reference sign 716 denotes a mount portion, reference sign 718 denotes a suction portion, reference sign 720 denotes an upper mold, reference sign 722 denotes a heater, reference sign 724 denotes a fixing portion, and reference sign 726 denotes a base material made of quartz glass.

Figure 19:
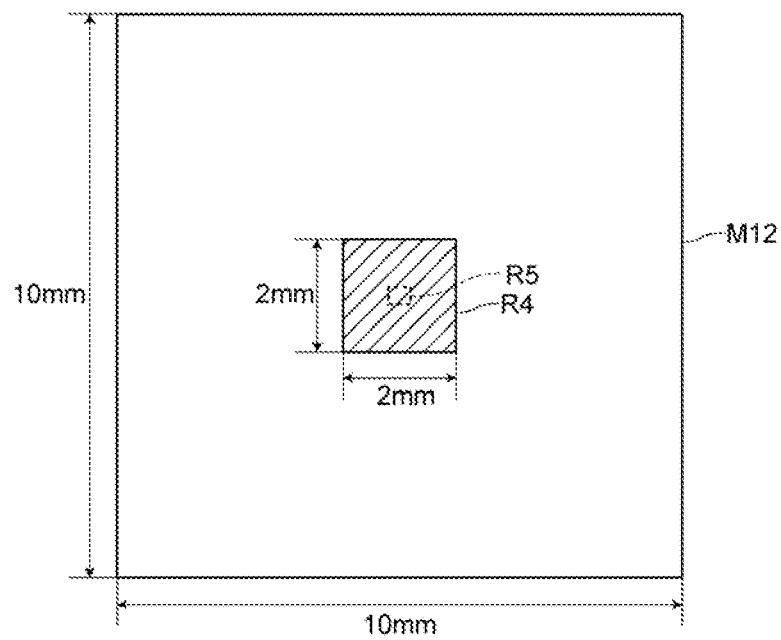
FIGS. 19(a) to 19(c) are explanatory views of a convexoconcave mold M12 used in Example 1.
Figure 19:
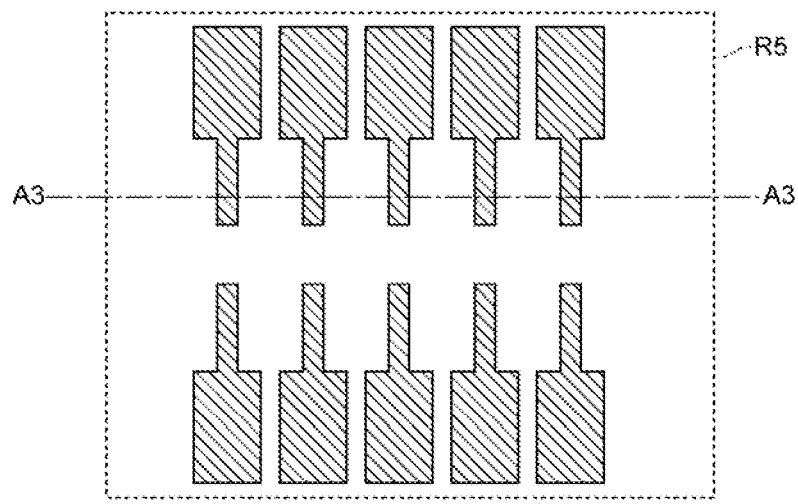
Figure 19:
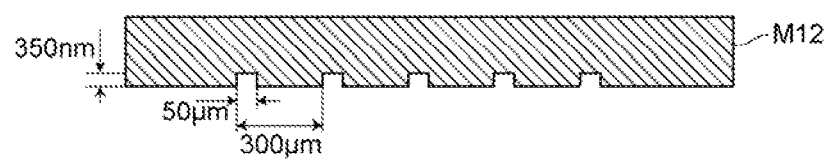
Figure 20:
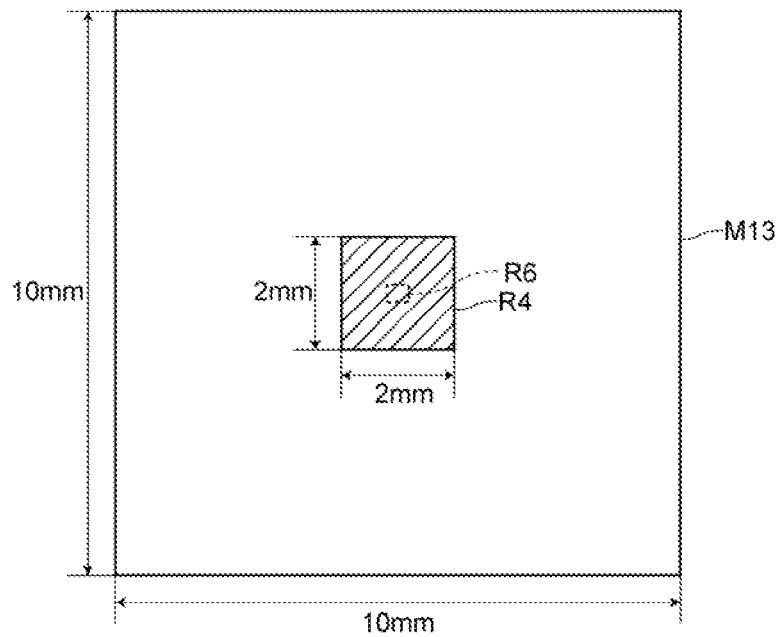
FIGS. 20(a) to 20(c) are explanatory views of a convexoconcave mold M13 used in Example 1.
Figure 20:
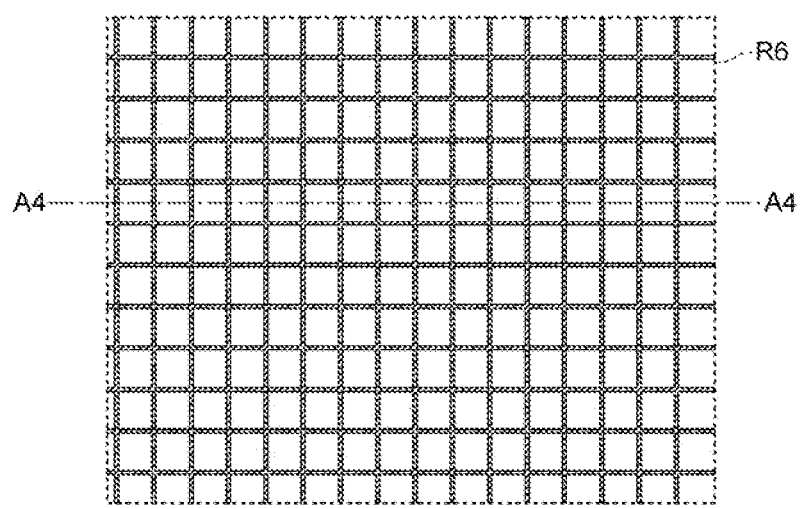
Figure 20:
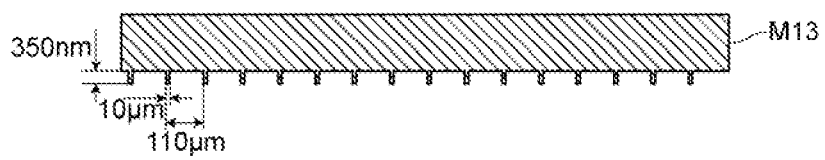

FIGS. 19(a) to 19(c) are explanatory views of a convexoconcave mold M12 used in Example 1. FIG. 19(a) is a plan view of the convexoconcave mold M12. FIG. 19(b) is an enlarged plan view of a region R5 indicated in FIG. 19(a). FIG. 19(c) is a sectional view taken along line A3-A3 indicated in FIG. 19(b). FIGS. 20(a) to 20(c) are explanatory views of a convexoconcave mold M13 used in Example 1. FIG. 20(a) is a plan view of the convexoconcave mold M13. FIG. 20(b) is an enlarged plan view of a region R6 indicated in FIG. 20(a). FIG. 20(c) is a sectional view taken along line A4-A4 indicated in FIG. 20(b).

As shown in FIGS. 17(a) to 17(e), the thin film transistor 400 (not shown) according to Example 1 was produced by performing the following processes, namely, the "gate electrode formation process", the "gate insulating layer formation process", and the "oxide conductor layer formation process" in this order.

(1) Gate Electrode Formation Process

There was formed a gate electrode 420 that is made of lanthanum nickel oxide (LNO), in a manner similar to the gate electrode formation process in the method of producing a thin film transistor according to Embodiment 6 (see FIGS. 17(a) and 17(b)). The gate electrode 420 is 100 nm thick.

The imprinting was performed with use of the imprinting apparatus 700 (imprinting apparatus ST50 manufactured by Toshiba Machine Co., Ltd.) shown in FIG. 18. The convexoconcave mold M12 shown in FIGS. 19(a) to 19(c) was used in the imprinting process. As shown in FIGS. 19(a) to 19(c), the convexoconcave mold M12 has a pattern region R4 of 2 mm×2 mm at the center of a square shape of 10 mm×10 mm. In the pattern region R4, there is provided a convexoconcave pattern of a shape corresponding to the gate electrode 420 (50 μm wide and 350 nm high at pitches of 300 μm along line A3-A3 indicated in FIG. 19(b)). The convexoconcave mold M12 is fixed to a base material 726 made of quartz glass by means of a double sided tape. In this case, the imprinting process was performed at 150° C. by applying the pressure of 4 MPa.

(2) Gate Insulating Layer Formation Process

There was formed a gate insulating layer 430 that is made of PZT, in a manner similar to the gate insulating layer formation process in the method of producing a thin film transistor according to Embodiment 6 (see FIG. 17(c)). The gate insulating layer 430 is 140 nm thick.

(3) Oxide Conductor Layer Formation Process

There was formed an oxide conductor layer 440 that is made of ITO, in a manner similar to the oxide conductor layer formation process in the method of producing a thin film transistor according to Embodiment 6 (see FIGS. 17(d) and 17(e)). The oxide conductor layer 440 is 20 nm thick at a channel region 442, and is 100 nm thick at a source/drain region 444.

The imprinting was performed with use of the imprinting apparatus 700 (imprinting apparatus ST50 manufactured by Toshiba Machine Co., Ltd.) shown in FIGS. 19(a) to 19(c), similarly to the gate electrode formation process. The convexoconcave mold M13 shown in FIGS. 20(a) to 20(c) was used in the imprinting process. As shown in FIGS. 19(a) to 19(c), the convexoconcave mold M13 has the pattern region R4 of 2 mm×2 mm at the center of a square shape of 10 mm×10 mm. In the pattern region R4, there is provided a convexoconcave pattern of a latticed shape corresponding to the channel region 442 (10 µm wide and 350 nm high at pitches of 110 µm along line A4-A4 indicated in FIG. 20(b)). The convexoconcave mold M13 is fixed to the base material 726 made of quartz glass by means of a double sided tape.

In the imprinting process, the temperature was raised from 70° C. when the pressure of 3 MPa was applied, and the heating process was performed until the temperature reached 180° C. while the pressure was kept at the same level. The pressure was kept for 15 minutes. Then, the mold was cooled with water, and was released when the temperature was decreased to 70° C.

The thin film transistor 400 according to Example 1 was completed by performing the above processes.

2. Evaluation of Thin Film Transistor 400
(1) Structure of Thin Film Transistor 400

Figure 21:
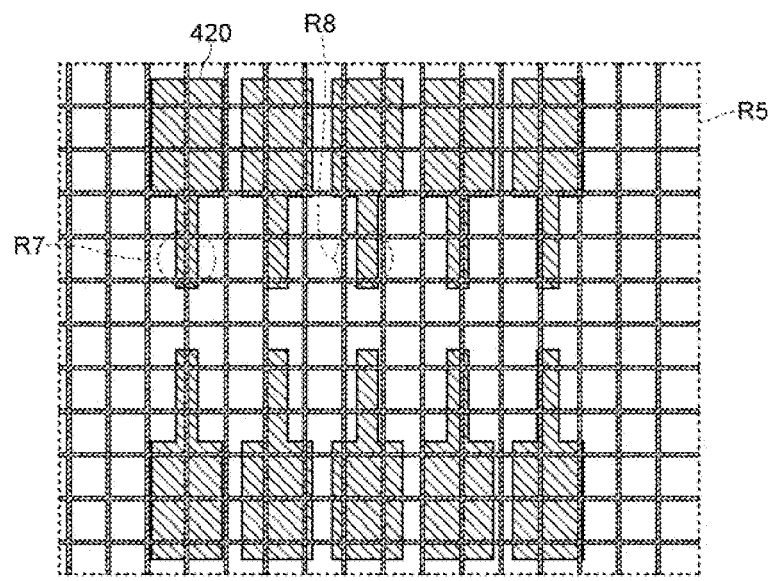
FIGS. 21(a) to 21(c) are views showing measurement of electrical properties of a thin film transistor 400 according to Example 1.
Figure 21:
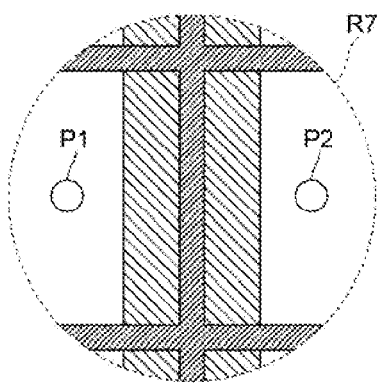
Figure 21:
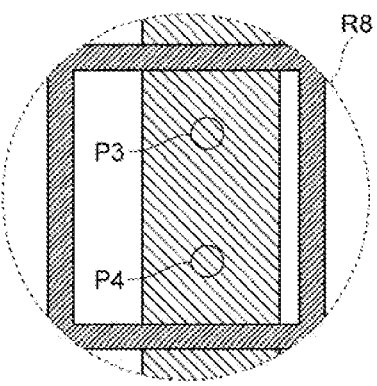

FIGS. 21(a) to 21(c) are explanatory views of the thin film transistor 400 according to Example 1. FIG. 21(a) is a plan view showing the state where the plurality of thin film transistors 400 are aligned. FIG. 21(b) is an enlarged view of a region that is denoted by reference sign R7 indicated in FIG. 21(a). FIG. 21(c) is an enlarged view of a region that is denoted by reference sign R8 indicated in FIG. 21(a).

In the thin film transistor 400 according to Example 1, the pitches along line A3-A3 in the convexoconcave pattern of the convexoconcave mold M12 are slightly differed from the pitches along line A4-A4 in the convexoconcave pattern of the convexoconcave mold M13. Therefore, in the thin film transistor 400 according to Example 1, even though the pattern on the gate electrode 420 and the pattern on the oxide conductor layer 440 are not aligned with each other, the gate electrode 420 and the oxide conductor layer 440 establish a first positional relationship, which is ideal, in a certain region on the base material (the positional relationship by which the channel region 442 serves as an original channel region, see the region denoted by reference sign R7 in FIG. 21(a)). Further, in the thin film transistor 400 according to Example 1, the gate electrode 420 and the oxide conductor layer 440 establish a second positional relationship, which is different from the first positional relationship, in a certain region (the positional relationship by which the source/drain region 444 serves as the channel region and each probe serves as a source electrode/drain electrode, see the region denoted by reference sign R8 in FIG. 21(a)).

There were measured the electrical properties in the case where the gate electrode 420 and the oxide conductor layer 440 establish the first positional relationship. In this case, as shown in FIG. 21(b), the probes were brought into contact respectively with a region P1 and a region P2 in the source/drain region 444. Also measured were the electrical properties in the case where the gate electrode 420 and the oxide conductor layer 440 establish the second positional relationship. In this case, as shown in FIG. 21(c), the probes were brought into contact respectively with a region P3 and a region P4 in the source/drain region 444.

(2) Electrical Properties of Thin Film Transistor 400

Initially, an end of the oxide conductor layer 440 was wet etched with use of 1% hydrofluoric acid so as to expose the gate electrode 420 located therebelow, and a gate electrode probe was pressed against the exposed gate electrode. Then, as described above, the corresponding probes were brought into contact with the region P1 and the region P2, respectively. The corresponding probes were also brought into contact with the region P3 and the region P4, respectively. In this state, the electrical properties (the property $I_D$-$V_G$ between a drain current $I_D$ and a gate voltage $V_G$, and the property $I_D$-$V_D$ between the drain current $I_D$ and a drain voltage $V_D$) of the thin film transistor 400 were measured with use of a semiconductor parameter analyzer (manufactured by Agilent Technologies, Inc.).

Figure 22:
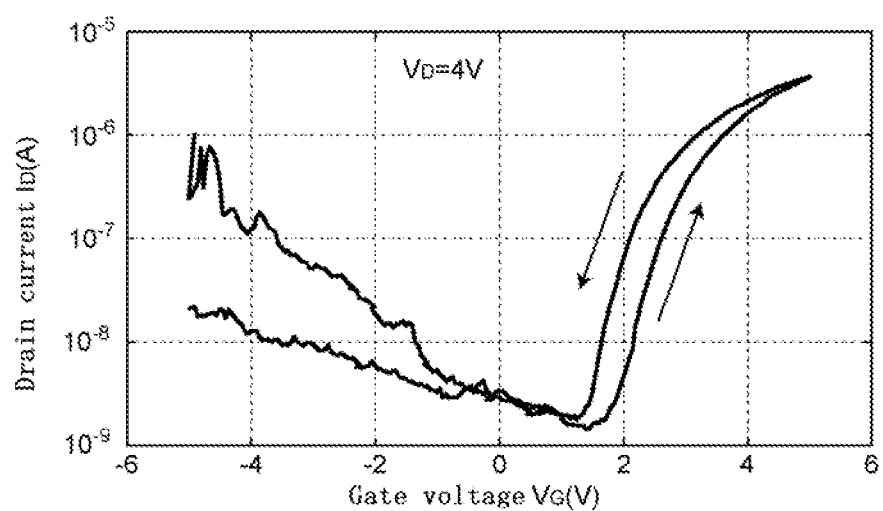
FIGS. 22(a) and 22(b) are explanatory graphs indicating the electrical properties of the thin film transistor 400 according to Example 1.
Figure 22:
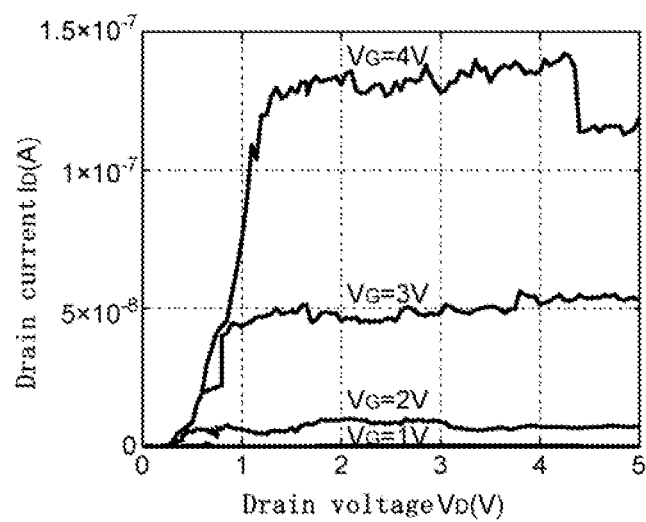
Figure 23:
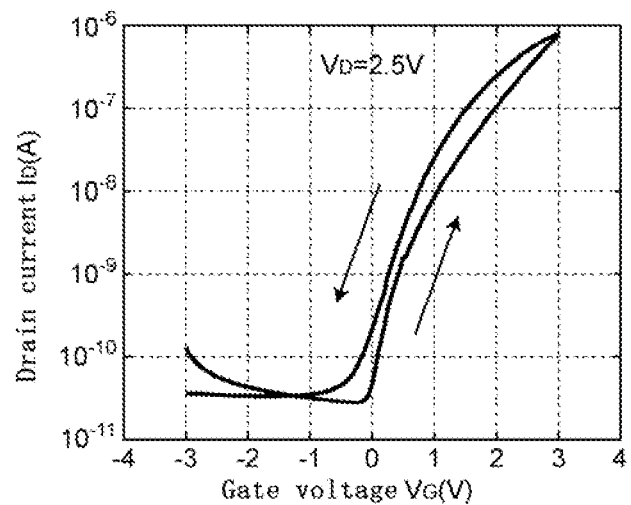
FIGS. 23(a) and 23(b) are explanatory graphs indicating the electrical properties of the thin film transistor 400 according to Example 1.
Figure 23:
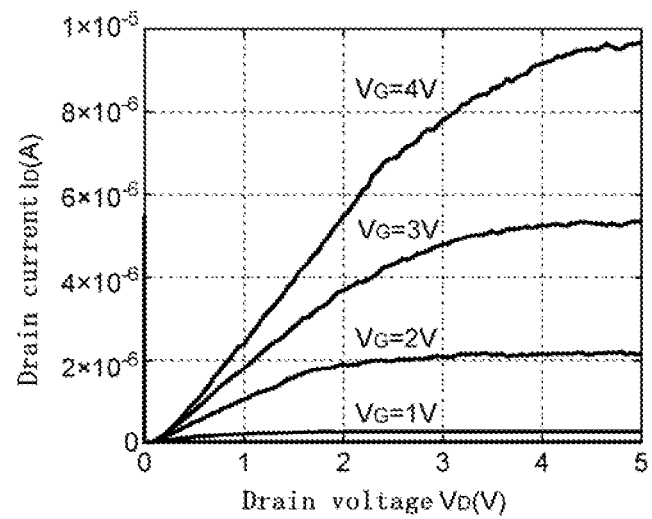

FIGS. 22(a) to 23(b) are explanatory graphs indicating the electrical properties of the thin film transistor 400 according to Example 1. FIGS. 22(a) and 22(b) are graphs of the case where the gate electrode 420 and the oxide conductor layer 440 establish the first positional relationship. FIGS. 23(a) and 23(b) are graphs of the case where the gate electrode 420 and the oxide conductor layer 440 establish the second positional relationship. FIGS. 22(a) and 23(a) each indicate the property $I_D$-$V_G$. FIGS. 22(b) and 23(b) each indicate the property $I_D$-$V_D$. In the measurement of the property $I_D$-$V_G$, in the case where the gate electrode 420 and the oxide conductor layer 440 establish the first positional relationship, the gate voltage $V_G$ was scanned in the range from −5 V to +5 V with the drain voltage $V_D$ being kept at 4.0 V. In the other case where the gate electrode 420 and the oxide conductor layer 440 establish the second positional relationship, the gate voltage $V_G$ was scanned in the range from −3 V to +3 V with the drain voltage $V_D$ being kept at 2.5 V.

In the case where the gate electrode 420 and the oxide conductor layer 440 establish the first positional relationship, the thin film transistor 400 according to Example 1 exhibits an ON/OFF ratio of approximately 3 digits and conducts as a transistor, as apparent also from FIGS. 21(a) and 21(b). In the other case where the gate electrode 420 and the oxide conductor layer 440 establish the second positional relationship, this thin film transistor exhibits an ON/OFF ratio of approximately 5 digits and conducts as a transistor, as apparent also from FIGS. 22(a) and 22(b).

Example 2

Example 2 indicates that the plastic deformability of a precursor layer is improved by heating the precursor layer to the second temperature in the range from 80° C. to 300° C.

The plastic deformability of the precursor layer was evaluated in the following processes.

1. Preparation of Test Pieces

A functional liquid material was applied onto a base material so as to be 100 nm thick in accordance with the spin coat technique (200 rpm for 25 seconds, for example). Then, the base material was laid on a hot plate to be dried at 150° C. for 30 seconds. There was thus formed a precursor layer of 100 nm thick. As options of the base material, there were adopted a "substrate obtained by oxidizing a surface of a silicon substrate to form an $SiO_2$ layer" and a "Pt substrate". As options of the functional liquid material, there were adopted a "solution containing metal alkoxide (manufactured by Mitsubishi Materials Corporation, PZT sol-gel solution)" and a "solution containing metal carboxylate (manufactured by Toshima Manufacturing Co., Ltd., PZT sol-gel solution)".

2. Pressing with Use of Cantilever

A nano thermal microscope is obtained by attaching a cantilever unit "nano-TA2" manufactured by Anasys Instruments Corporation (United States) to a probe microscope "S-IMAGE" manufactured by SII NanoTechnology Inc. The cantilever of the nano thermal microscope is pressed into the precursor layer under various weighting conditions, temperature conditions (room temperature, 100° C., 200° C., 300° C., and 400° C.), mold releasing conditions (mold releasing being performed, and mold releasing not being performed). The state how the cantilever is pressed into the precursor layer is observed in a DFM mode of the probe microscope.

3. Results

The cantilever was not pressed into any one of the precursor layer formed with use of the "solution containing metal alkoxide (manufactured by Mitsubishi Materials Corporation, PZT sol-gel solution)" and the precursor layer formed with use of the "solution containing metal carboxylate (manufactured by Toshima Manufacturing Co., Ltd., PZT sol-gel solution)", at room temperature and at 400° C. under any one of the weighting conditions. To the contrary, the cantilever was pressed into the precursor layer at 100° C., 200° C., and 300° C.

These results have indicated that the plastic deformability of the precursor layer is improved by heating the precursor layer to the second temperature in the range from 100° C. to 300° C.

Figure 24:
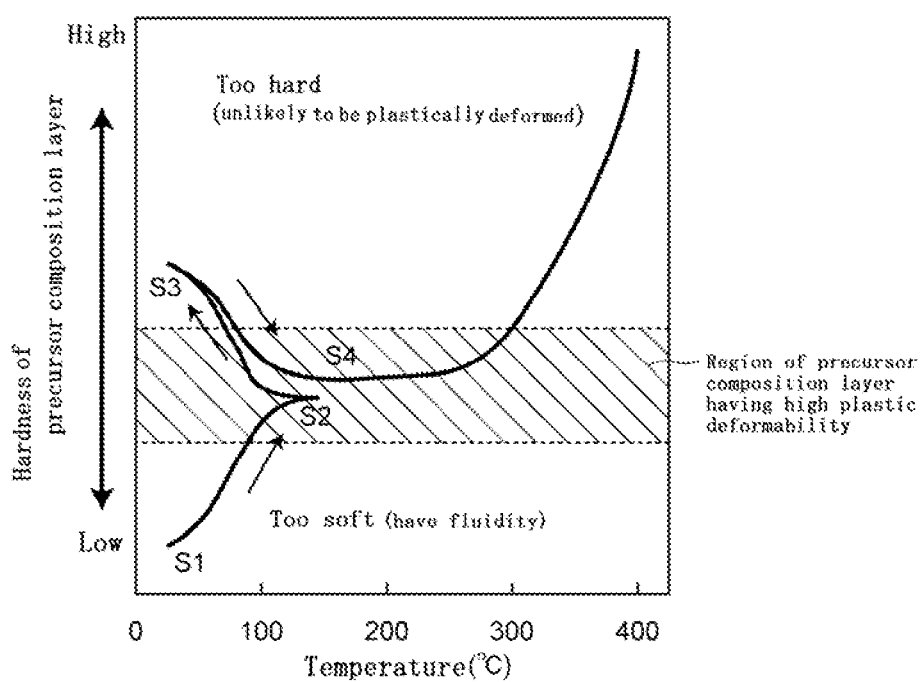
FIG. 24 is an explanatory view of plastic deformability of a precursor layer.

FIG. 24 is an explanatory view of the plastic deformability of the precursor layer.

As seen from FIG. 24, in the case where a precursor layer of a functional solid material is formed by applying a functional liquid material onto a base material, the precursor layer thus obtained is too soft and has poor plastic deformability at the initial stage to perform fine imprinting (see reference sign S1). To the contrary, in the case where the precursor layer is heated and dried, the precursor layer is solidified to some extent and the main solvent is removed. Accordingly, the precursor layer is decreased in fluidity to have hardness of an appropriate degree (see reference sign S2). However, in the case where the precursor layer is imprinted at room temperature, the precursor layer is hardened excessively and the plastic deformability thereof is deteriorated again (see reference sign S3). In this regard, the precursor layer, which is solidified to some extent, is heated again to the second temperature in the range from 100° C. to 300° C. In this manner, the hardness of the precursor layer is decreased to improve again the plastic deformability of the precursor layer, thereby realizing fine imprinting (see reference sign S4).

Thereafter, in view of the results described above, the precursor layer was actually imprinted by applying the pressure of 4 MPa under a temperature condition in the range from room temperature to 400° C. Found as a result was that the precursor layer obtains a predetermined imprinted structure by applying a relatively low pressure from 1 MPa to 20 MPa when the precursor layer is heated to certain temperature in the range from 80° C. to 300° C.

There have been described the methods of producing a functional device according to several embodiments of the present invention as well as the thin film transistor and the piezoelectric ink jet head. However, the present invention is not limited to these examples. These examples can be performed in the scope not departing from the purposes thereof, and can be modified in the following manners, for example.

(1) In Embodiments 6 and 7 described above, indium tin oxide (ITO) was used as the oxide conductor material. However, the present invention is not limited to the above. For example, it is possible to use the oxide conductor material such as indium oxide ($In_2O_3$), antimony doped tin oxide (Sb—$SnO_2$), zinc oxide (ZnO), aluminum doped zinc oxide (Al—ZnO), gallium doped zinc oxide (Ga—ZnO), ruthenium oxide ($RuO_2$), iridium oxide ($IrO_2$), tin oxide ($SnO_2$), tin monoxide SnO, or niobium doped titanium dioxide (Nb—$TiO_2$). Other examples of the oxide conductor material include amorphous conductive oxide such as indium gallium zinc complex oxide (IGZO), gallium doped indium oxide (In—Ga—O (IGO)), and indium doped zinc oxide (In—Zn—O (IZO)). Still other examples of the oxide conductor material include strontium titanate ($SrTiO_3$), niobium doped strontium titanate (Nb—$SrTiO_3$), strontium barium complex oxide ($SrBaO_2$), strontium calcium complex oxide ($SrCaO_2$), strontium ruthenate ($SrRuO_3$), lanthanum nickel oxide ($LaNiO_3$), lanthanum titanium oxide ($LaTiO_3$), lanthanum copper oxide ($LaCuO_3$), neodymium nickel oxide ($NdNiO_3$), yttrium nickel oxide ($YNiO_3$), lanthanum calcium manganese complex oxide (LCMO), barium plumbate ($BaPbO_3$), LSCO ($La_xSr_{1-x}CuO_3$), LSMO ($La_{1-x}Sr_xMnO_3$), YBCO ($YBa_2Cu_3O_{7-x}$), LNTO ($La(Ni_{1-x}Ti_x)O_3$), LSTO (($La_{1-x}Sr_x)TiO_3$), STRO ($Sr(Ti_{1-x}Ru_x)O_3$), any other perovskite conductive oxide, and any other pyrochlore conductive oxide.

(2) In Embodiments 6 and 7 described above, PZT (Pb($Zr_xTi_{1-x}$)$O_3$) was used as the ferroelectric material. However, the present invention is not limited to the above. There may be alternatively used Nb doped PZT, La doped PZT, barium titanate ($BaTiO_3$), lead titanate ($PbTiO_3$), BTO ($Bi_4Ti_3O_{12}$), BLT ($Bi_4La_xTi_3O_{12}$), SBT ($SrBi_2Ta_2O_9$), BZN ($Bi_{1.5}Zn_{1.0}Nb_{1.5}O_7$), or bismuth ferrite ($BiFeO_3$).

(3) Embodiments 6 and 7 described above each adopt the gate insulating layer made of a ferroelectric material. However, the present invention is not limited to the above. For example, it is possible to use a gate insulating layer made of a paraelectric material (such as BZN ($Bi_{1.5}Zn_{1.0}Nb_{1.5}O_7$) or BST ($Ba_xSr_{1-x}$)$Ti_3O_{12}$).

(4) Embodiments 6 and 7 described above each adopt lanthanum nickel oxide ($LaNiO_3$) as the material for the gate electrode. However, the present invention is not limited to the above. For example, it is possible to use Pt, Au, Ag, Al, Ti, ITO, $In_2O_3$, Sb—$In_2O_3$, Nb—$TiO_2$, ZnO, Al—ZnO, Ga—ZnO, IGZO, $RuO_2$, $IrO_2$, Nb—STO, $SrRuO_3$, $LaNiO_3$, $BaPbO_3$, LSCO, LSMO, YBCO, or any other perovskite conductive oxide. Still alternatively, there may be used any other pyrochlore conductive oxide or any other amorphous conductive oxide.

(5) Embodiments 6 and 7 each adopt the insulating substrate obtained by forming the STO ($SrTiO_3$) layer on the surface of the Si substrate, with the $SiO_2$ layer and the Ti layer being interposed therebetween, or there is used the substrate made of quartz glass ($SiO_2$). However, the present invention is not limited to the above. There may be alternatively used an $SiO_2$/Si substrate, an alumina ($Al_2O_3$) substrate, an STO ($SrTiO_3$) substrate, or an SRO ($SrRuO_3$) substrate.

(6) In the present invention, Embodiments 6 and 7 each exemplify the thin film transistor, while Embodiment 8 exemplifies the piezoelectric ink jet head. However, the present invention is not limited to the above. For example, the method of producing a functional device according to any other embodiment of the present invention is also applicable to a case of producing any optical device such as a reflective polarizing plate, in which a base material is provided thereon with a metal oxide ceramics layer or a metal layer in a latticed shape.

(7) In the present invention, other examples of the functional solid material include High-k materials (such as $HfO_2$, $Ta_2O_5$, $ZrO_2$, $HfSi_xO_y$, $ZrSi_xO_y$, $LaAlO_3$, $La_2O_3$, $(Ba_{1-x}Sr_x)TiO_3$, $Al_2O_3$, $(Bi_{2-x}Zn_x)(Zn_yNb_{2-y})O_7$, $Y_2O_3$, $GeO_2$, and $Gd_2O_3$), whistler alloys (alloys such as Co, Co—Pt, Co—Fe, Mn—Pt, Ni—Fe, and CoFeB, as well as Co—Cr—Fe—Al $Co_2MnAl$, and the like), MRAM barrier materials (MRAM electrode materials including an oxide-based semimetal such as $(La_{1-x}Sr_x)MnO_3$, as well as AlAs, MgO, $Al_2O_3$, and the like), multiferroic materials (such as perovskite $BiMnO_3$, $BiFeO_3$, and $YbMnO_3$, as well as garnet $R_3Fe_2O_{12}$ (R=Dy, Ho, Er, Tm, Tb, Lu), $Y_3Al_5O_{12}$, $Gd_3Ga_5O_{12}$, and SGGG $(Gd_{2.7}Ca_{0.3})$ $(Ga_{4.0}Mg_{0.32}Zr_{0.65}Ca_{0.03})O_{12}$), PRAM materials (of chalcogenide base such as $Ge_xTe_{1-x}$ and $Ge_2Sb_2Te_5$, Sb—X alloys (such as X=Ge, Ga, In, Se, Te), and the like), and photocatalytic rutile titanium dioxide ($TiO_2$).

Embodiment 9

Described in Embodiment 9 is a method of producing a ferroelectric material layer according to the present embodiment with use of a capacitor including a ferroelectric material layer as an insulating layer.

FIGS. 25(a) to 25(h) are explanatory views of a method of producing a capacitor 12A according to Embodiment 9. FIGS. 25(a) to 25(h) show the respective processes.

Figure 26:
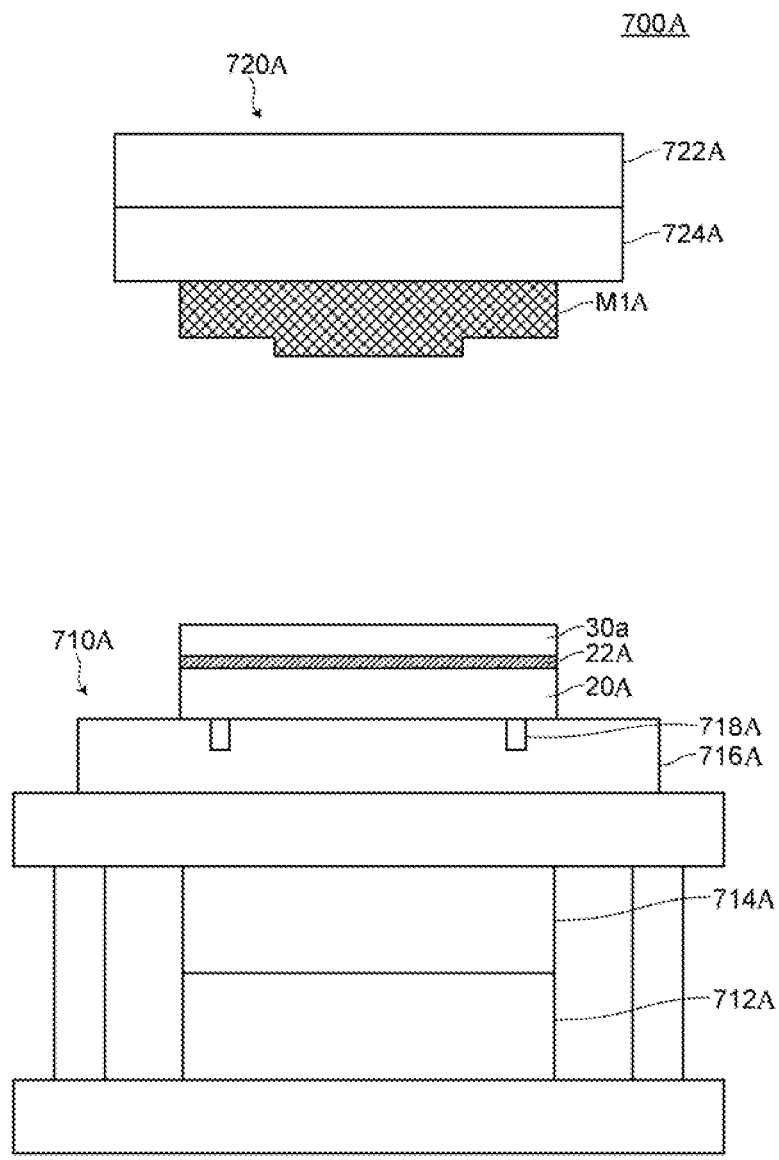
FIG. 26 is an explanatory view of an imprinting apparatus 700A.

FIG. 26 is an explanatory view of an imprinting apparatus 700A. In FIG. 26, reference sign 710A denotes a lower mold, reference sign 712A denotes a heat shield plate, reference sign 714A denotes a heater, reference sign 716A denotes a mount portion, reference sign 718A denotes a suction portion, reference sign 720A denotes an upper mold, reference sign 722A denotes a heater, reference sign 724A denotes a fixing portion, and reference sign M1A denotes a convexoconcave mold.

Figure 27:
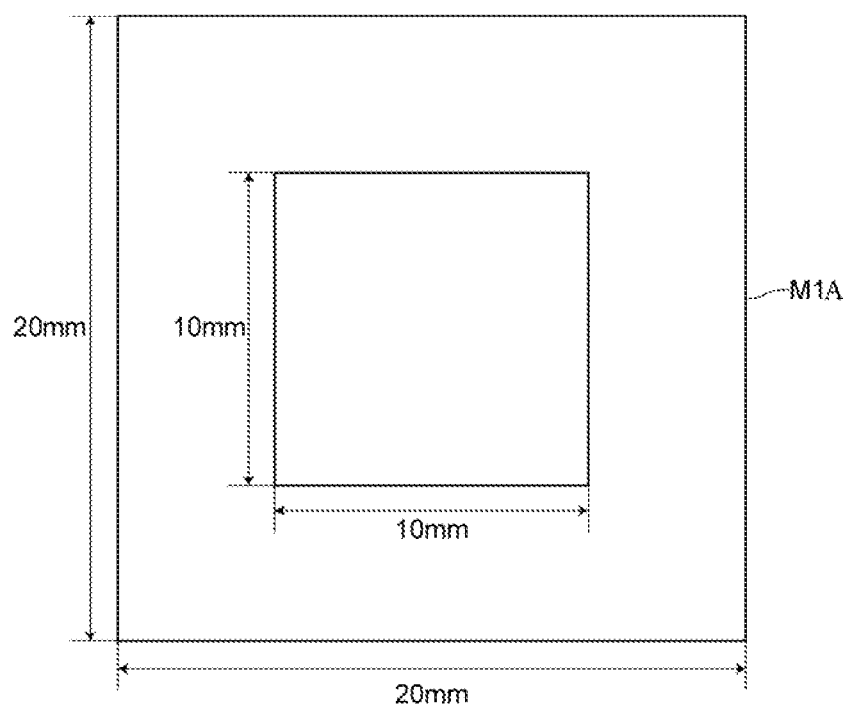
FIGS. 27(a) and 27(b) are explanatory views of a convexoconcave mold M1A.
Figure 27:
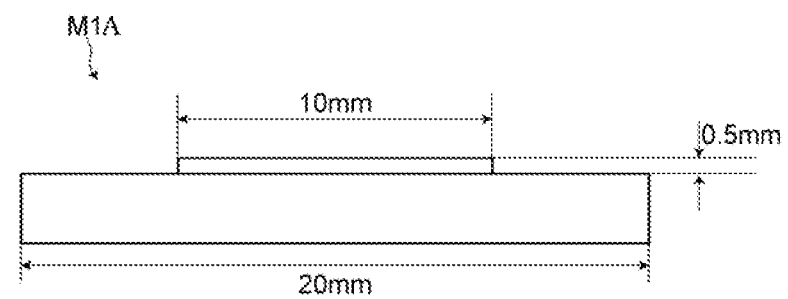

FIGS. 27(a) and 27(b) are explanatory views of the convexoconcave mold M1A. FIG. 27(a) is a plan view of the convexoconcave mold M1A, and FIG. 27(b) is a sectional view of the convexoconcave mold M1A.

As shown in FIGS. 25(a) to 25(h), a capacitor 10A according to Example 3 was produced by performing the "base material preparation process", the "ferroelectric material layer formation process", the "upper electrode formation process", and the "lower electrode exposure step" in this order, as to be described below.

(1) Base Material Preparation Process

Figure 25:
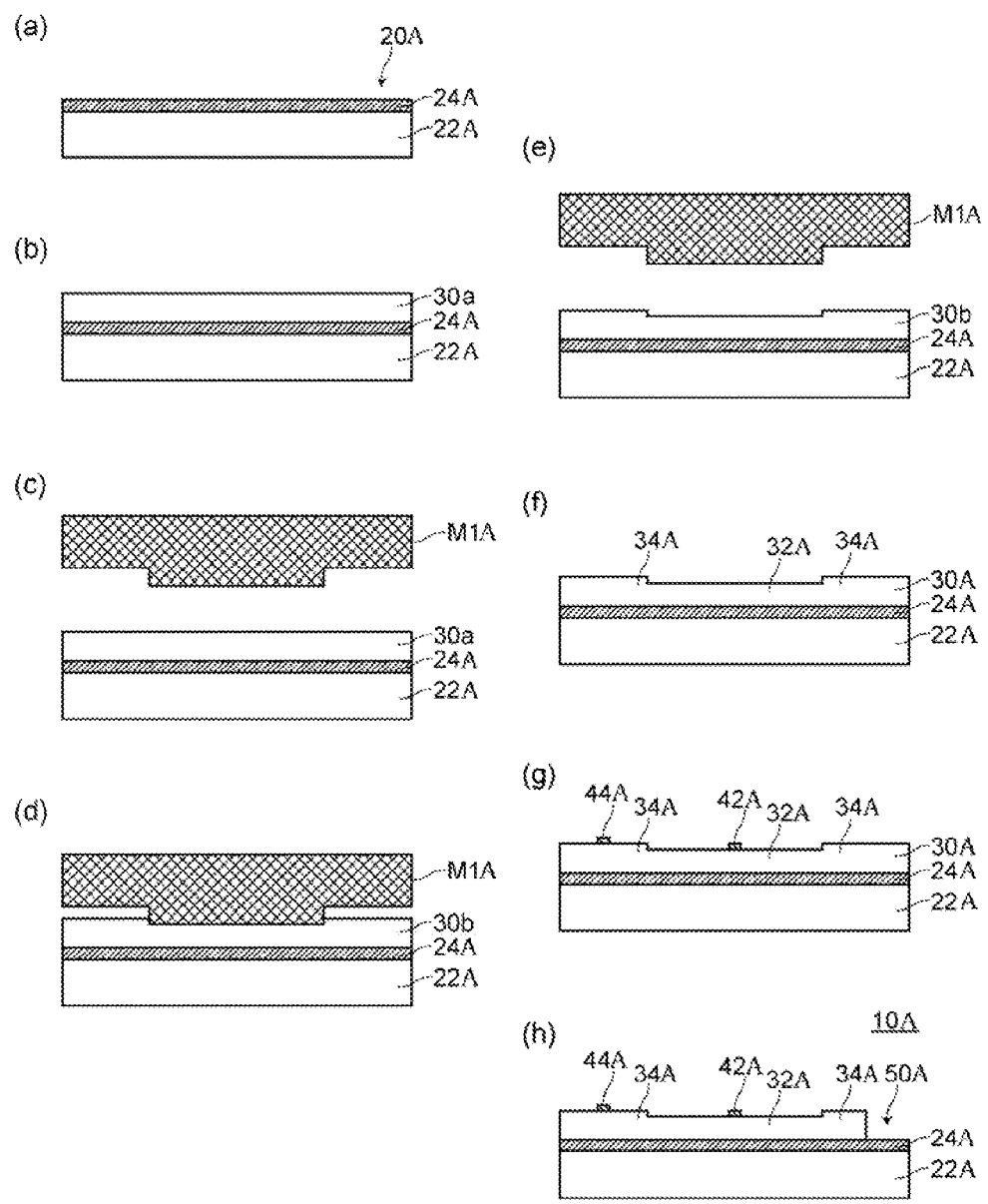
FIGS. 25(a) to 25(h) are explanatory views of a method of producing a capacitor 12A according to Embodiment 9.

There is prepared a base material 20A by forming a lower electrode 24A made of a "film obtained by laminating Ti (10 nm) and Pt (40 nm)" on an insulating substrate 22A that is obtained by forming an $SiO_2$ layer on a surface of an Si substrate (see FIG. 25(a), manufactured by TANAKA KIKINZOKU KOGYO K.K.). The base material has a planar size of 20 mm×20 mm.

(2) Ferroelectric Material Layer Formation Process

Prepared is a sol-gel solution to be transformed into a ferroelectric material layer (PZT layer) by heat treatment (manufactured by Mitsubishi Materials Corporation/metal alkoxide type of 8% by weight) (the sol-gel solution preparation step).

Next, "this functional liquid material is applied onto the lower electrode 24A of the base material 20A in accordance with the spin coat technique (2500 rpm for 25 seconds, for example), and subsequently, the base material 20A is laid on a hot plate to be dried at 150° C. for 5 minutes" repetitively for 3 times. There is thus formed a precursor layer 30a (300 nm thick) of the ferroelectric material (PZT) (the ferroelectric material precursor layer formation step to the drying step, see FIG. 25(b)).

Subsequently, the precursor layer 30a is imprinted with use of the convexoconcave mold M1A (having the difference in height of 500 μm) formed such that the center is convex (the imprinting step, see FIGS. 25(c) to 25(e)). The imprinting is performed with use of the imprinting apparatus 700A (imprinting apparatus ST50 manufactured by Toshiba Machine Co., Ltd.) shown in FIG. 26. The convexoconcave mold M1A used in this case is shown in FIGS. 27(a) and 27(b). As shown in FIGS. 27(a) and 27(b), the convexoconcave mold M1A has a convex portion (500 μm high) of 10 mm×10 mm at the center of a square shape of 20 mm×20 mm. The imprinting is performed by applying a pressure up to 5 MPa. There is thus obtained a precursor layer 30b in which only the center region of 10 mm×10 mm is imprinted. In the above process, the precursor layer 30a is imprinted in the state of being heated to 225° C. with use of the convexoconcave mold M1A also heated to 225° C.

Thereafter, the precursor layer 30b is laid on a hot plate having a surface temperature of 400° C. for 10 minutes, and is then heat treated with use of an RTA apparatus for 30 minutes at 650° C., which is set as the third temperature. A ferroelectric material layer (PZT layer) 30 is completed in this manner (the ferroelectric material layer formation step, see FIG. 25(f)). In the following description, the imprinted portion of the ferroelectric material layer is referred to as a ferroelectric material layer 32A according to Embodiment 9, while the portion being not imprinted of the ferroelectric material layer is referred to as a ferroelectric material layer 34A according to Comparative Example.

(3) Upper Electrode Formation Process

There are formed upper electrodes 42A and 44A made of gold (each having 400 μm in diameter) respectively at the center (the ferroelectric material layer 32A) and the periphery (the ferroelectric material layer 34A) of the ferroelectric material layer (PZT layer) 30.

(4) Lower Electrode Exposure Process

The periphery (the ferroelectric material layer 34A) of the ferroelectric material layer (PZT layer) 30 is partially removed with use of 1% hydrofluoric acid, so as to expose the lower electrode 24A.

The capacitor 12A according to Embodiment 9 and the capacitor 14A according to Comparative Example are completed by performing the above processes (see FIG. 28(a) to be referred to later). In this state, the ferroelectric material layer 32A (at the center of the ferroelectric material layer 30A) according to Embodiment 9 was 170 nm thick. On the other hand, the ferroelectric material layer 34A (at the periphery of the ferroelectric material layer 30A) according to Comparative Example was 180 nm thick.

2. Measurement of Electrical Properties

Figure 28:
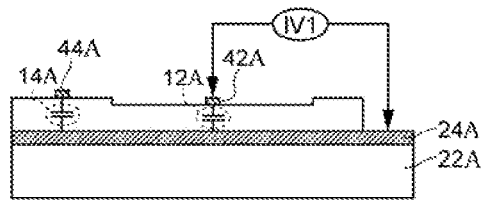
FIGS. 28(a) and 28(b) are views respectively showing measurement of electrical properties of the capacitor 12A according to Embodiment 9 and those of a capacitor 14A according to Comparative Example.
Figure 28:
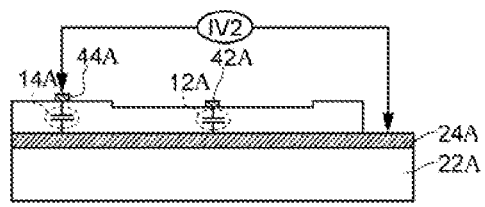

FIGS. 28(a) and 28(b) are views respectively showing measurement of electrical properties of the capacitor 12A according to Embodiment 9 and those of the capacitor 14A according to Comparative Example. FIG. 28(a) shows measurement of the electrical properties of the capacitor 12A according to Embodiment 9. FIG. 28(b) shows measurement of the electrical properties of the capacitor 14A according to Comparative Example.

Figure 29:
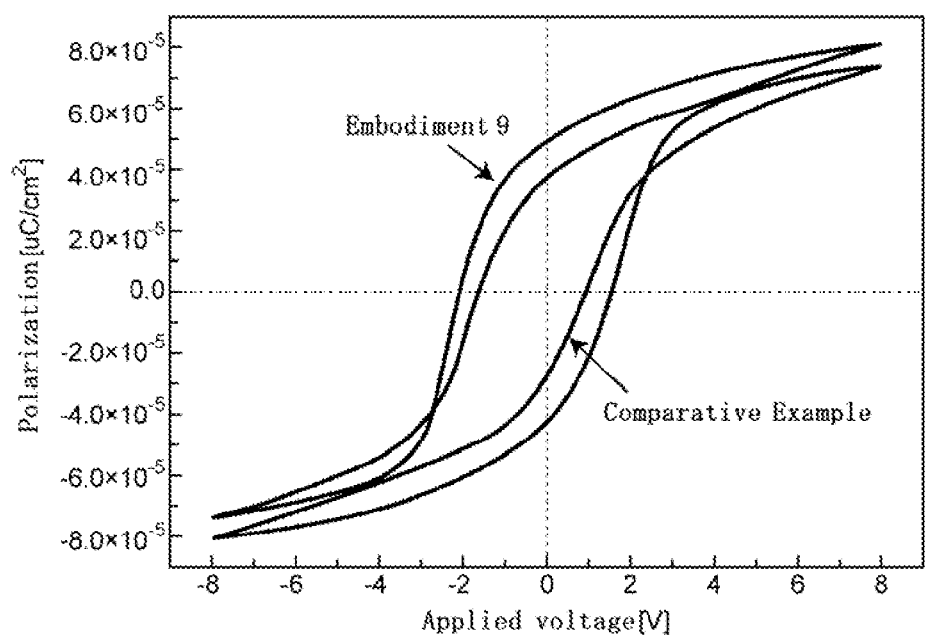
FIG. 29 is a graph indicating the electrical properties (residual polarization properties) of the capacitor 12A according to Embodiment 9 and those of the capacitor 14A according to Comparative Example.
Figure 30:
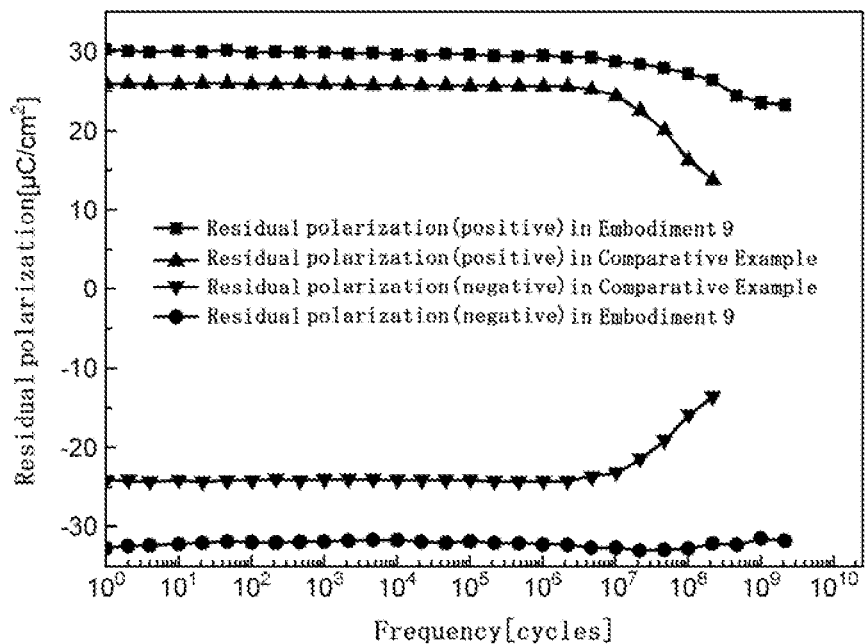
FIG. 30 is a graph indicating the electrical properties (fatigue properties of residual polarization) of the capacitor 12A according to Embodiment 9 and those of the capacitor 14A according to Comparative Example.
Figure 31:
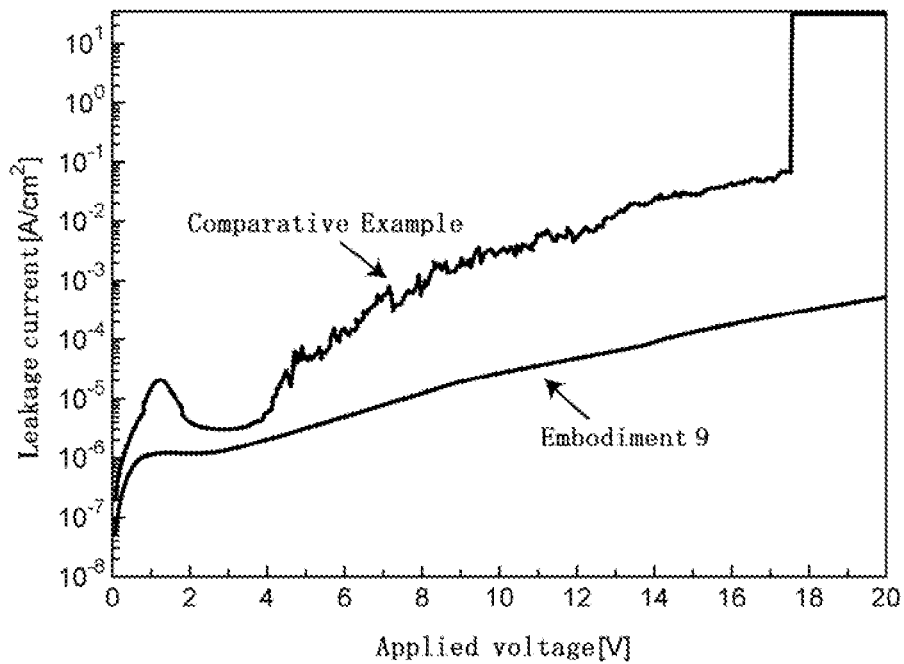
FIG. 31 is a graph indicating the electrical properties (leakage current properties) of the capacitor 12A according to Embodiment 9 and those of the capacitor 14A according to Comparative Example.

FIG. 29 is a graph indicating the electrical properties (residual polarization properties) of the capacitor 12A according to Embodiment 9 and those of the capacitor 14A according to Comparative Example. FIG. 30 is a graph indicating the electrical properties (fatigue properties of residual polarization) of the capacitor 12A according to Embodiment 9 and those of the capacitor 14A according to Comparative Example. FIG. 31 is a graph indicating the electrical properties (leakage current properties) of the capacitor 12A according to Embodiment 9 and those of the capacitor 14A according to Comparative Example.

As shown in FIGS. 28(a) and 28(b), the electrical properties were measured by adopting the capacitor 12A according to Embodiment 9 and the capacitor 14A according to Comparative Example. The residual polarization properties and the fatigue properties of residual polarization were measured with use of a ferroelectric properties evaluation system (manufactured by TOYO Corporation, FCE). The leakage properties were measured with use of a semiconductor parameter analyzer (manufactured by Agilent Technologies, Inc., 4155C). The fatigue properties of residual polarization were measured under the conditions of 500 MHz and ±8 V.

As apparent from FIG. 29, the capacitor 14A according to Comparative Example had the residual polarization of 36 $\mu C/cm^2$, while the capacitor 12A according to Embodiment 9 had the residual polarization of 48 $\mu C/cm^2$. Found as a result was that the ferroelectric material layer 32A according to Embodiment 9 exhibits better residual polarization properties.

Furthermore, as apparent from FIG. 30, the frequency of the capacitor 14A according to Comparative Example, at which the residual polarization exhibited a value corresponding to 80% of the initial value, had $4 \times 10^7$ cycles as the positive frequency, and $4 \times 10^7$ cycles as the negative frequency. To the contrary, the frequency of the capacitor 12A according to Embodiment 9, at which the residual polarization exhibited a value corresponding to 80% of the initial value, had $4 \times 10^8$ cycles as the positive frequency, and at least $2 \times 10^9$ cycles as the negative frequency. Found as a result was that the ferroelectric material layer 32A according to Embodiment 9 exhibits better fatigue properties of residual polarization.

As indicated in FIG. 31, the capacitor 12A according to Embodiment 9 has the leakage current smaller by 0.5 to 3 digits than the leakage current of the capacitor 14A according to Comparative Example. Found as a result was that the ferroelectric material layer 32A according to Embodiment 9 exhibits better low leakage current properties. In the range from 0 V to 20 V, the capacitor 12A according to Embodiment 9 did not exhibit any dielectric breakdown phenomenon (approximately 17 V), which is observed in the capacitor 14A according to Comparative Example. Also found as a result was that the ferroelectric material layer 32A according to Embodiment 9 exhibits better insulation properties.

There were prepared, under the same conditions, a plurality of test pieces of the capacitor 12A according to Embodiment 9 and a plurality of test pieces of the capacitor 14A according to Comparative Example. The residual polarization properties indicated in FIG. 29 and the fatigue properties of residual polarization indicated in FIG. 30 were measured with use of the different test pieces. Therefore, the residual polarization properties exhibit slightly varied absolute values.

3. Observation of State of Surface of Ferroelectric Material Layer

Figure 32:
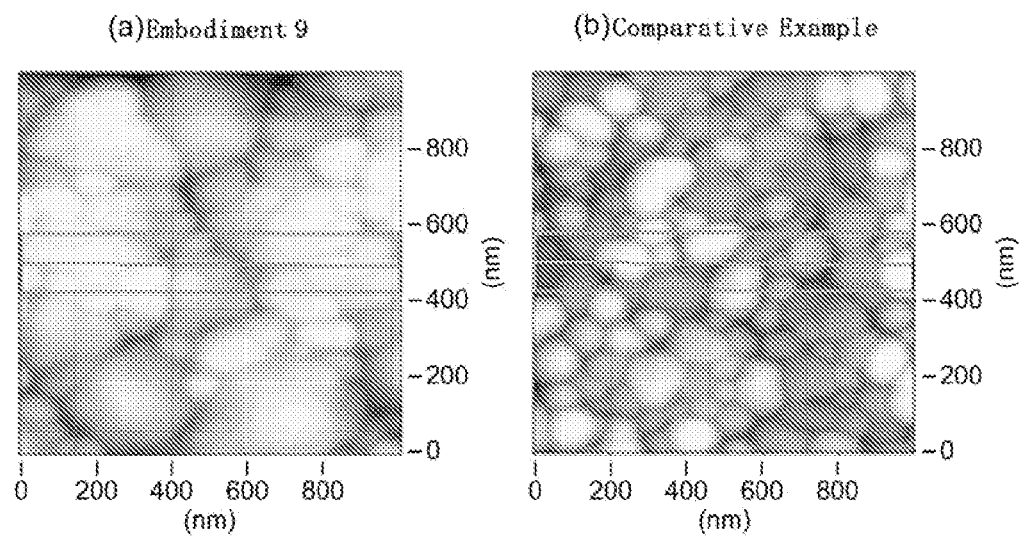
FIGS. 32(a) and 32(b) are views showing states of a surface of a ferroelectric material layer 32A according to Embodiment 9 and that of a ferroelectric material layer 34A according to Comparative Example.

FIGS. 32(a) and 32(b) are views showing the state of a surface of the ferroelectric material layer 32A according to Embodiment 9 and that of the ferroelectric material layer 34A according to Comparative Example. FIG. 32(a) shows the state of the surface of the ferroelectric material layer 32A according to Embodiment 9. FIG. 32(b) shows the state of the surface of the ferroelectric material layer 34A according to Comparative Example.

The states of the surfaces were observed with use of a scanning probe microscope (manufactured by SII NanoTechnology Inc., S-image). As apparent also from FIGS. 32(a) and 32(b), the ferroelectric material layer 32A according to Embodiment 9 had crystal grains of 50 nm to 400 nm, while the ferroelectric material layer 34A according to Comparative Example had crystal grains of 30 nm to 200 nm. These results have indicated that the ferroelectric material layer 32A according to Embodiment 9 had the crystal grains of the larger size.

4. Evaluation of Crystallinity by X-ray Diffraction

Figure 33:
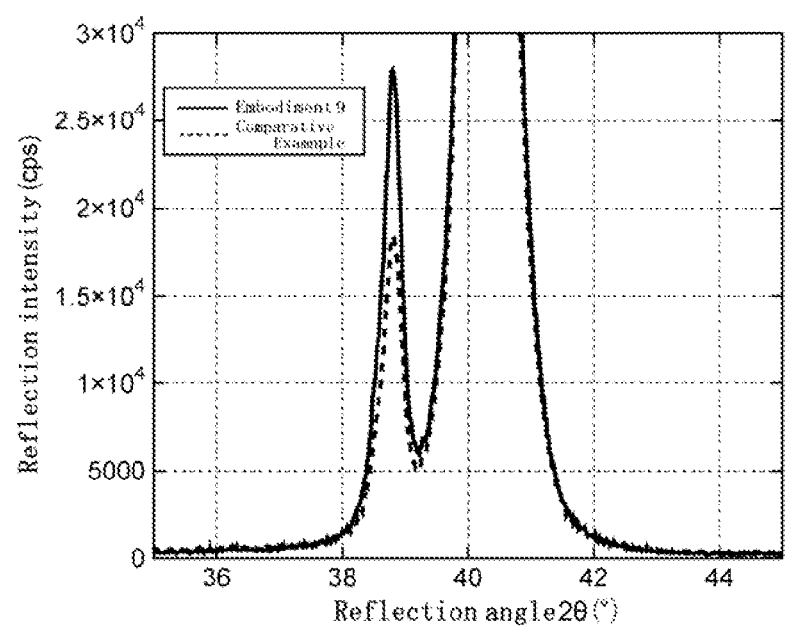
FIG. 33 is a graph indicating X-ray diffraction results of the ferroelectric material layer 32A according to Embodiment 9 as well as those of the ferroelectric material layer 34A according to Comparative Example.

FIG. 33 is a graph indicating X-ray diffraction results of the ferroelectric material layer 32A according to Embodiment 9 as well as of the ferroelectric material layer 34A according to Comparative Example. In FIG. 33, the solid line indicates the X-ray diffraction result of the ferroelectric material layer 32A according to Embodiment 9, while the dashed line indicates the X-ray diffraction result of the ferroelectric material layer 34A according to Comparative Example.

The crystallinity was evaluated by X-ray diffraction with use of an X-ray diffraction apparatus (manufactured by Mac Science, M18XHF). When being compared to each other at the peaks of the PZT (111) ($2\theta=39°$), the ferroelectric material layer 32A according to Embodiment 9 had a peak intensity of approximately 1.5 times higher than that of the ferroelectric material layer 34A according to Comparative Example. These results have indicated that the ferroelectric material layer 32A according to Embodiment 9 has the crystallinity of the higher level.

5. Studies

FIGS. 34(a) and 34(b) are explanatory views of the difference between the leakage current of the ferroelectric material layer 32A according to Embodiment 9 and the leakage current of the ferroelectric material layer 34A according to Comparative Example.

As apparent also from the above description in "3. Observation of state of surface of ferroelectric material layer" and "4. Evaluation of crystallinity by X-ray diffraction", the ferroelectric material layer 32A according to Embodiment 9 is estimated to have less crystal grain boundary, because the ferroelectric material layer 32A according to Embodiment 9 has the crystal grains larger than those of the ferroelectric material layer 34A according to Comparative Example. In addition, because of exhibiting the crystallinity of the higher level, the ferroelectric material layer 32A according to Embodiment 9 is estimated to have less leakage paths as compared with the ferroelectric material layer 34A according to Comparative Example. Consequently, the level of the leakage current is estimated to have been decreased (see FIGS. 34(a) and 34(b)).

Examples 3 and 4

Example 3 is executed to determine the ranges of the first temperature (exclusively for the production of a ferroelectric material layer) and the second temperature (exclusively for the production of a ferroelectric material layer) in order to enhance the residual polarization. Example 4 is executed to determine the ranges of the first temperature (exclusively for the production of a ferroelectric material layer) and the second temperature (exclusively for the production of a ferroelectric material layer) in order to decrease the leakage current. In Examples 3 and 4, capacitors were produced in accordance with a method similar to the method of producing a capacitor according to Embodiment 9, under the conditions of varying the first temperature (exclusively for the production of a ferroelectric material layer) and the second temperature (exclusively for the production of a ferroelectric material layer). The residual polarization and the leakage current of each of the capacitors (ferroelectric material layers) thus obtained were measured.

Figures 34, 35:
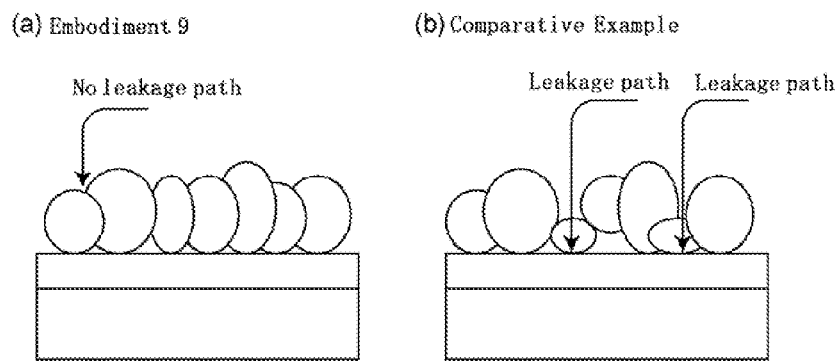
FIG. 35 is a chart indicating the relationship between the first temperature and the second temperature with regards to residual polarization.

FIG. 35 is a chart indicating the relationship between the first temperature (exclusively for the production of a ferroelectric material layer) and the second temperature (exclusively for the production of a ferroelectric material layer) with regards to the residual polarization. In FIG. 35, the symbol "○ (Good)" was indicated in each case where "the residual polarization of the ferroelectric material layer obtained from a precursor layer having been imprinted" was larger than "the residual polarization of the ferroelectric material layer obtained from a precursor layer not imprinted". The symbol "Δ (Not bad)" was indicated in each case where "the residual polarization of the ferroelectric material layer obtained from a precursor layer having been imprinted" was substantially the same as "the residual polarization of the ferroelectric material layer obtained from a precursor layer not imprinted". The symbol "x (Bad)" was indicated in each case where "the residual polarization of the ferroelectric material layer obtained from a precursor layer having been imprinted" was smaller than "the residual polarization of the ferroelectric material layer obtained from a precursor layer not imprinted". The blank columns are indicative of the cases where no test was executed.

As a result, in Example 3, as apparent also from FIG. 35, when the first temperature (exclusively for the production of a ferroelectric material layer) was set to be in the range from 120° C. to 250° C. and the second temperature (exclusively for the production of a ferroelectric material layer) was set to be higher than the first temperature (exclusively for the production of a ferroelectric material layer) as well as in the range from 150° C. to 300° C. (more preferably in the range from 200° C. to 300° C.), the ferroelectric material layer realized larger residual polarization.

Figures 36, 37:
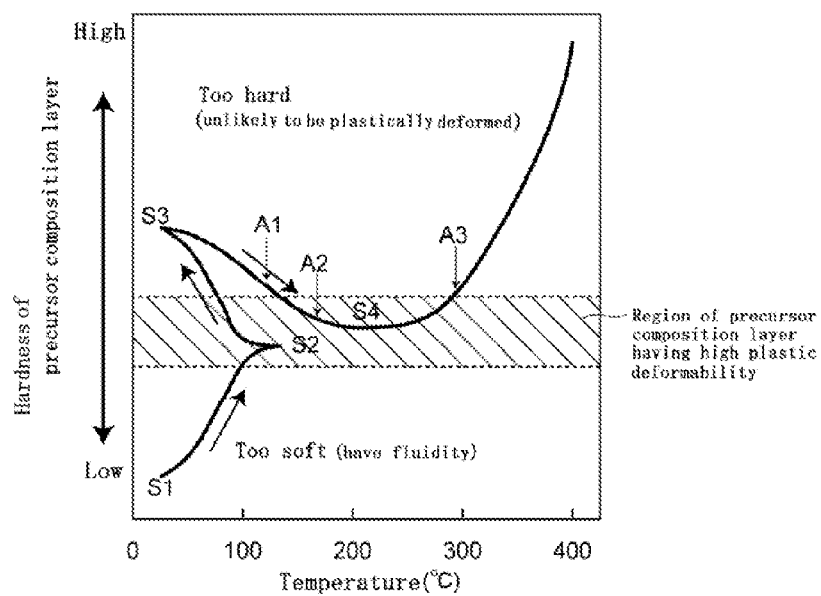
FIG. 36 is a chart indicating the relationship between the first temperature and the second temperature with regards to the leakage current.
FIG. 37 is an explanatory view of plastic deformability of a precursor layer.

FIG. 36 is a chart indicating the relationship between the first temperature (exclusively for the production of a ferroelectric material layer) and the second temperature (exclusively for the production of a ferroelectric material layer) with regards to the leakage current. In FIG. 36, the symbol "○ (Good)" was indicated in each case where "the leakage current of the ferroelectric material layer obtained from a precursor layer having been imprinted" was lower than "the leakage current of the ferroelectric material layer obtained from a precursor layer not imprinted". The symbol "Δ (Not bad)" was indicated in each case where "the leakage current of the ferroelectric material layer obtained from a precursor layer having been imprinted" was substantially the same as "the leakage current of the ferroelectric material layer obtained from a precursor layer not imprinted". The symbol "x (Bad)" was indicated in each case where "the leakage current of the ferroelectric material layer obtained from a precursor layer having been imprinted" was smaller than "the leakage current of the ferroelectric material layer obtained from a precursor layer not imprinted". The blank columns are indicative of the cases where no test was executed.

As a result, in Example 4, as apparent also from FIG. 36, when the first temperature (exclusively for the production of a ferroelectric material layer) was set to be in the range from 120° C. to 200° C. and the second temperature (exclusively for the production of a ferroelectric material layer) was set to be higher than the first temperature (exclusively for the production of a ferroelectric material layer) as well as in the range from 175° C. to 300° C. (more preferably in the range from 200° C. to 300° C.), the ferroelectric material layer realized the lower leakage current.

FIG. 37 is an explanatory view of the plastic deformability of the precursor layer.

As seen also from FIG. 37, in the case where a precursor layer of a ferroelectric material layer is formed by applying a sol-gel solution onto a base material, the precursor layer thus obtained is too soft and has poor plastic deformability at the initial stage to perform the fine imprinting process (see reference sign S1). To the contrary, in the case where the precursor layer is heated and then dried, the precursor layer is solidified to some extent and the main solvent is removed. Accordingly, the precursor layer is decreased in fluidity to have hardness of a preferred degree (see reference sign S2). However, in the case where the precursor layer is imprinted at room temperature, the precursor layer is hardened excessively when the precursor layer is adjusted again to room temperature and the plastic deformability thereof is deteriorated again (see reference sign S3). In this regard, the precursor layer, which is solidified to some extent, is heated again to the second temperature (exclusively for the production of a ferroelectric material layer) in the range specified above. By processing in this manner, the precursor layer is sufficiently softened so as to enhance again the plastic deformability of the precursor layer. Therefore, it is possible to perform the fine imprinting process (see reference sign S4). In this case, as apparent also from FIG. 37, the fine imprinting is difficult to be performed if the second temperature (exclusively for the production of a ferroelectric material layer) is too low (see reference sign A1) or the second temperature (exclusively for the production of a ferroelectric material layer) is too high (see reference sign A3). To the contrary, the fine imprinting is possible when the second temperature (exclusively for the production of a ferroelectric material layer) is in the range specified above (see reference sign A2). As a result, it is possible to obtain the desired electrical properties improvement effects (such as high residual polarization properties and low leakage current properties).

Thereafter, according to the results described above, the precursor layer was actually imprinted by applying the pressure of various levels under the various temperature conditions in the range from room temperature to 400° C. Found as a result was that the precursor layer obtains a predetermined imprinted structure by applying a relatively low pressure from 1 MPa to 20 MPa when the precursor layer is heated to certain temperature in the range specified above, so as to exert the electrical properties improvement effects.

Embodiment 10

1. Thin Film Transistor 100A According to Embodiment 10

Figure 38:
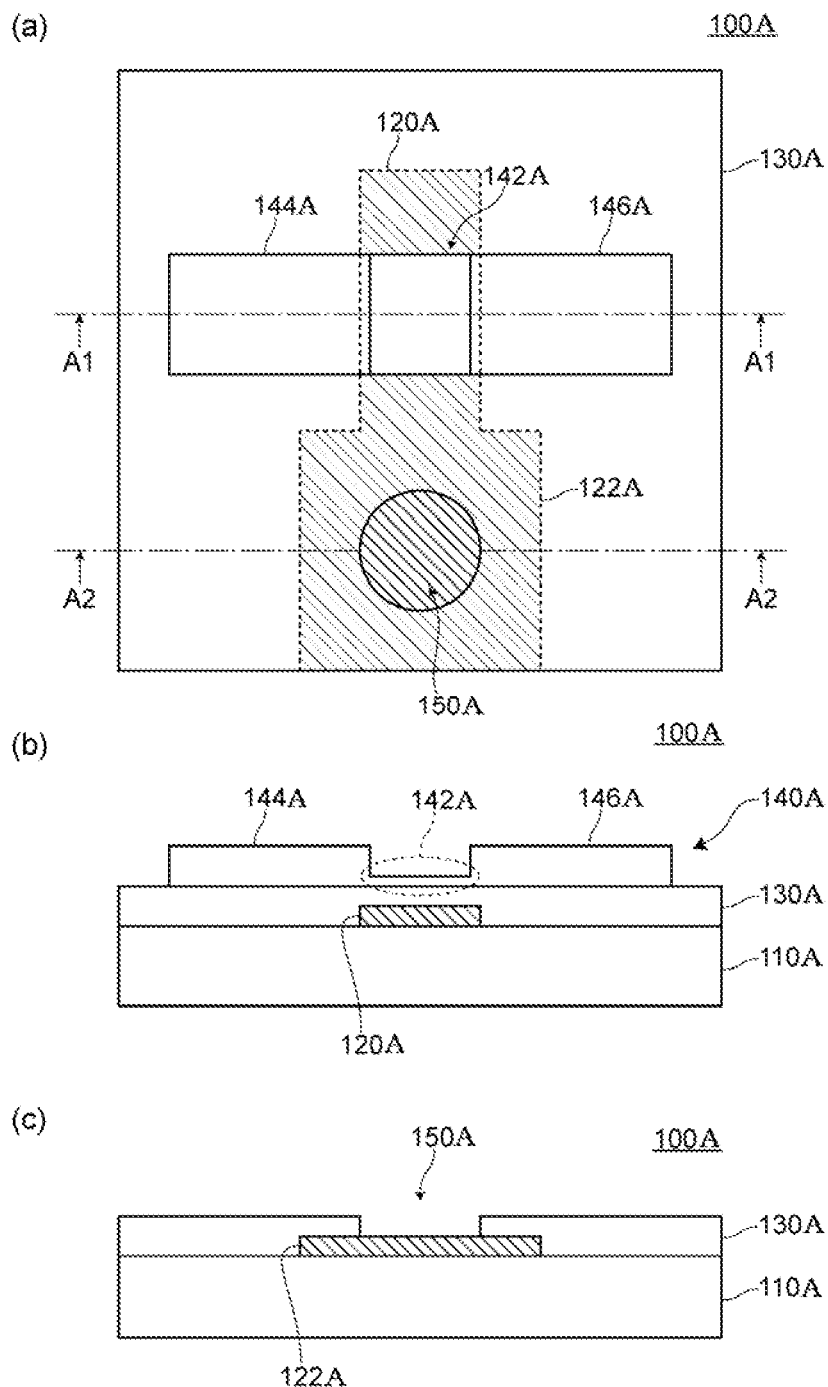
FIGS. 38(a) to 38(c) are explanatory views of a thin film transistor 100A according to Embodiment 10.
Figure 39:
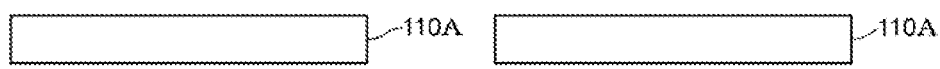
FIGS. 39(a) to 39(e) are views showing a method of producing a thin film transistor according to Embodiment 10.
Figure 39:
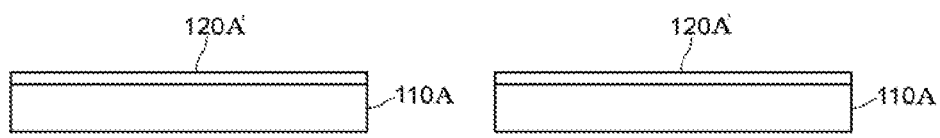
Figure 39:
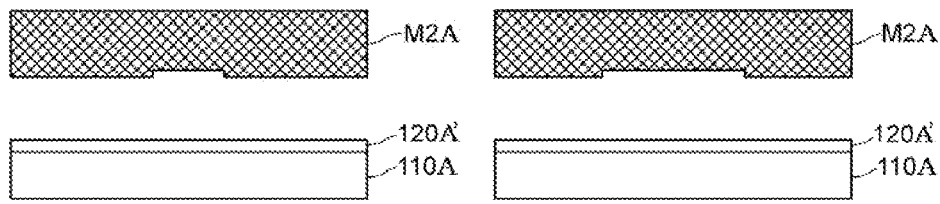
Figure 39:
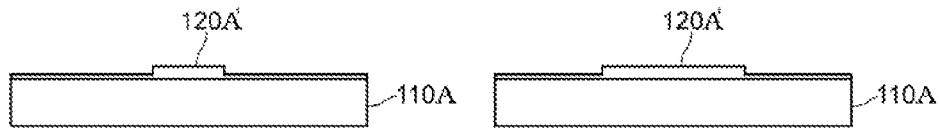
Figure 39:
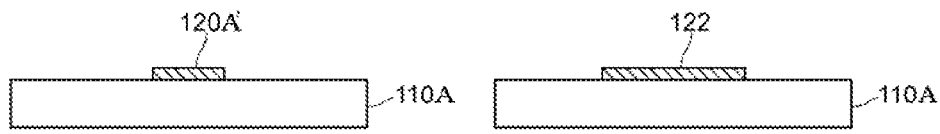
Figure 40:
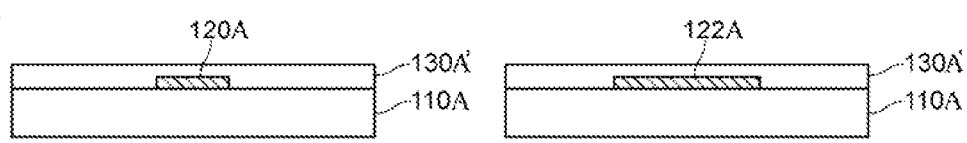
FIGS. 40(a) to 40(e) are views showing the method of producing a thin film transistor according to Embodiment 10.
Figure 40:
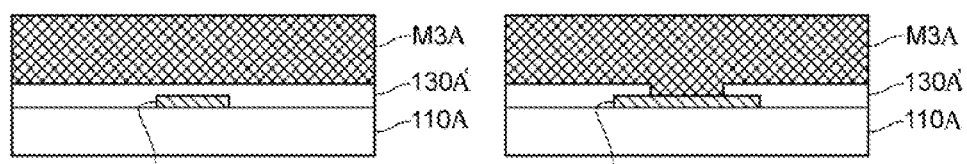
Figure 40:
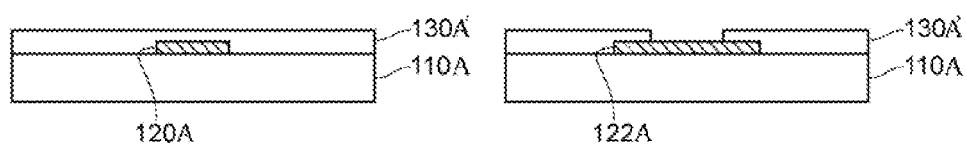
Figure 40:
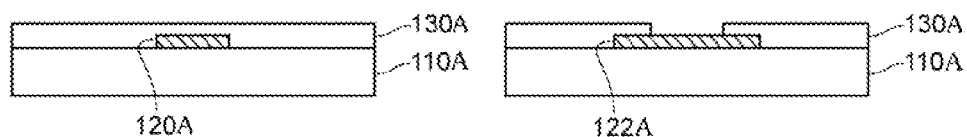
Figure 40:
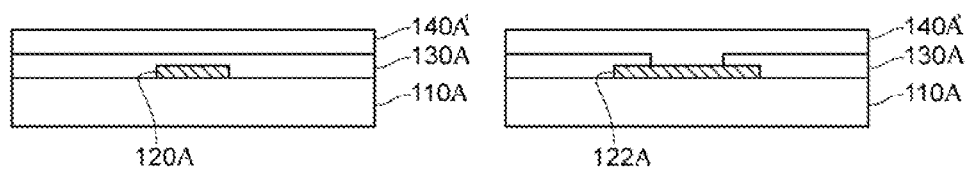
Figure 41:
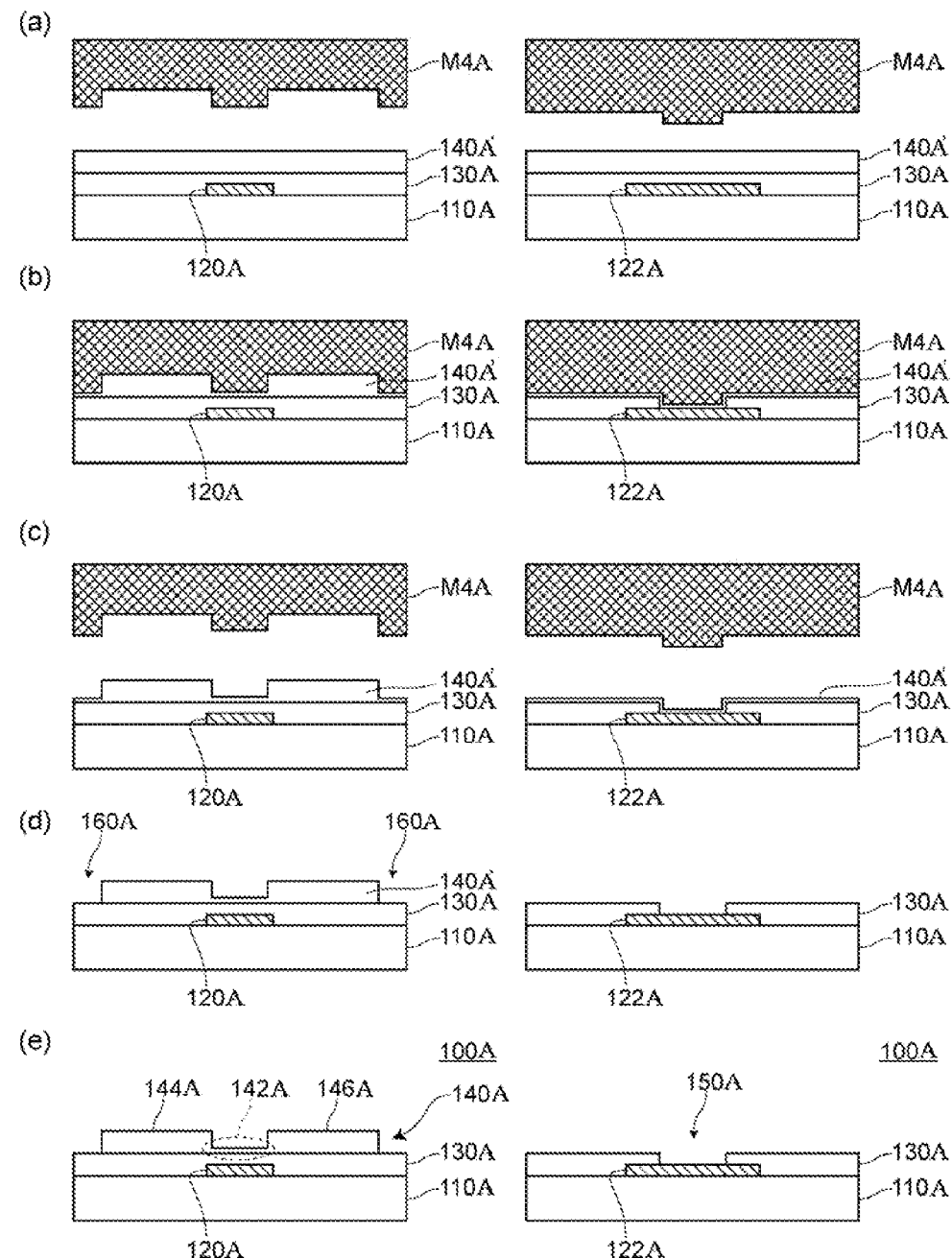
FIGS. 41(a) to 41(e) are views showing the method of producing a thin film transistor according to Embodiment 10.

FIGS. 38(a) to 38(c) are explanatory views of the thin film transistor 100A according to Embodiment 10. FIG. 38(a) is a plan view of the thin film transistor 100A. FIG. 38(b) is a sectional view taken along line A1-A1 indicated in FIG. 38(a). FIG. 38(c) is a sectional view taken along line A2-A2 indicated in FIG. 38(a).

As shown in FIGS. 38(a) and 38(b), the thin film transistor 100A according to Embodiment 10 includes an oxide conductor layer 140A having a source region 144A, a drain region 146A, and a channel region 142A, a gate electrode 120A for controlling a conductive state of the channel region 142A, and a gate insulating layer 130A provided between the gate electrode 120A and the channel region 142A and made of a ferroelectric material. The channel region 142A is thinner than the source region 144A and the drain region 146A. The thickness of the channel region 142A is preferably at most a half of the thickness of each of the source region 144A and the drain region 146A. As shown in FIGS. 38(a) and 38(c), the gate electrode 120A is connected to a gate pad 122A that is exposed to outside by way of a through hole 150A.

In the thin film transistor 100A according to Embodiment 10, the gate insulating layer 130A is formed in accordance with the method of producing a ferroelectric material layer according to the present embodiment.

In the thin film transistor 100A according to Embodiment 10, the oxide conductor layer 140A is formed such that the channel region 142A is thinner than the source region 144A and the drain region 146A, in accordance with the imprinting technique of the present embodiment.

In the thin film transistor 100A according to Embodiment 10, each of the oxide conductor layer 140A, the gate electrode 120A, and the gate insulating layer 130A is formed with use of a liquid material.

In the thin film transistor 100A according to Embodiment 10, all of the oxide conductor layer 140A, the gate electrode 120A, and the gate insulating layer 130A are formed without adopting the vacuum process.

In the thin film transistor 100A according to Embodiment 10, each of the oxide conductor layer 140A, the gate electrode 120A, and the gate insulating layer 130A is made of an oxide material.

In the thin film transistor 100A according to Embodiment 10, each of the oxide conductor layer 140A, the gate electrode 120A, and the gate insulating layer 130A has a perovskite structure.

In the thin film transistor 100A according to Embodiment 10, the channel region 142A has the carrier density and the thickness set to such values at which the channel region 142A is depleted when an OFF control voltage is applied to the gate electrode 120A. More specifically, the carrier density of the channel region 142A is in the range from $1\times10^{15}$ cm$^{-3}$ to $1\times10^{21}$ cm$^{-3}$. The thickness of the channel region 142A is in the range from 5 nm to 100 nm.

In the thin film transistor 100A according to Embodiment 10, the source region 144A and the drain region 146A each have thickness in the range from 50 nm to 1000 nm.

The oxide conductor layer 140A is made of indium tin oxide (ITO), for example. The gate insulating layer 130A is made of PZT (Pb(Zr$_x$Ti$_{1-x}$)O$_3$), for example. The gate electrode 120A is made of lanthanum nickel oxide (LNO (LaNiO$_3$)), for example. An insulating substrate 110A, which is solid, may be obtained by forming an STO (SrTiO) layer on a surface of an Si substrate, with an SiO$_2$ layer and a Ti layer being interposed therebetween.

2. Method of Producing Thin Film Transistor According to Embodiment 10

The thin film transistor 100A according to Embodiment 10 can be produced in accordance with the following method of producing a thin film transistor (the method of producing a thin film transistor according to Embodiment 10). Described step by step below is the method of producing the thin film transistor 100A according to the present embodiment.

FIGS. 39(a) to 41(e) are explanatory views of the method of producing a thin film transistor according to Embodiment 10. FIGS. 39(a) to 39(e), FIGS. 40(a) to 40(e), and FIGS. 41(a) to 41(e) show the respective processes. In each of the views showing the processes, the portion on the left corresponds to the illustration in FIG. 38(b), while the portion on the right corresponds to the illustration in FIG. 38(c).

(1) Formation of Gate Electrode 120A

Initially, there is prepared a functional liquid material, which is to be transformed by heat treatment into a functional solid material made of metal oxide ceramics (lanthanum nickel oxide). More specifically, there is prepared a solution (solvent: 2-methoxyethanol) containing, as metal salts, lanthanum nitrate (hexahydrate) and nickel acetate (tetrahydrate).

Next, as shown in FIGS. 39(a) and 39(b), the functional liquid material is applied onto one of the surfaces of the insulating substrate 110A in accordance with the spin coat technique (500 rpm for 25 seconds, for example). Then, the insulating substrate 110A is laid on a hot plate to be dried at 80° C. for 1 minute. There is thus formed a precursor layer 120' (300 nm thick) of the functional solid material (lanthanum nickel oxide).

Subsequently, as shown in FIGS. 39(c) and 39(d), the precursor layer 120' is imprinted at 150° C. with use of a convexoconcave mold M2A (having the difference in height of 300 nm) formed such that the regions corresponding to the gate electrode 120A and the gate pad 122A are concave. By performing this imprinting, the precursor layer 120' is deformed to have an imprinted structure (300 nm thick at the convex portion and 50 nm thick at the concave portion). In this case, the imprinting is performed by applying the pressure of 5 MPa. Therefore, the precursor layer is imprinted, which has obtained high plastic deformability by being heated to the second temperature (exclusively for the production of a ferroelectric material layer) in the range from 120° C. to 200° C. As a result, it is possible to form the desired imprinted structure with high accuracy.

Then, the precursor layer 120' is entirely etched so that the precursor layer is completely removed at the regions other than the region corresponding to the gate electrode 120A (the entire etching step). The entire etching process is performed in accordance with the wet etching technique without adopting the vacuum process.

Thereafter, the precursor layer 120' is heat treated for 10 minutes at 650° C., which is set as the third temperature, with use of an RTA apparatus. As shown in FIG. 39(e), by performing this heat treatment, the precursor layer 120' is transformed into the gate electrode 120A and the gate pad 122A, each of which is provided as the functional solid material layer (lanthanum nickel oxide).

(2) Formation of Gate Insulating Layer 130A

Initially, there is prepared a functional liquid material, which is to be transformed by heat treatment into a functional solid material made of metal oxide ceramics (PZT). More specifically, prepared as the functional liquid material is a solution containing metal alkoxide (manufactured by Mitsubishi Materials Corporation, sol-gel solution) (the sol-gel solution preparation step).

Then, "the functional liquid material is applied onto one of the surfaces of the insulating substrate 110A in accordance with the spin coat technique (2500 rpm for 25 seconds, for example), and subsequently, the insulating substrate 110A is laid on a hot plate to be dried at 150° C. for 5 minutes" repetitively for 3 times. As shown in FIG. 40(a), there is thus formed a precursor layer 130A' (300 nm thick) of the functional solid material (PZT) (the ferroelectric material precursor layer formation step to the drying step).

Thereafter, as shown in FIGS. 40(b) and 40(c), the precursor layer 130A' is imprinted at 225° C. with use of a convexoconcave mold M3A (having the difference in height of 300 nm) formed such that the region corresponding to the through hole 150A is convex. Accordingly, the precursor layer 130A' is deformed to have an imprinted structure corresponding to the through hole 150A (the imprinting step). The imprinting is performed by applying the pressure of 5 MPa. In this manner, the precursor layer is imprinted at 225° C., which has obtained high plastic deformability by being heated to 150° C. As a result, it is possible to obtain the desired electrical properties improvement effects (such as high residual polarization properties and low leakage current properties).

Thereafter, the precursor layer 130A' is heat treated for 10 minutes at 650° C., which is set as the third temperature, with use of an RTA apparatus. As shown in FIG. 40(d), by performing this heat treatment, the gate insulating layer 130A is formed as the functional solid material layer (PZT) (the ferroelectric material layer formation step).

(3) Formation of Oxide Conductor Layer 140A

Initially, there is prepared a functional liquid material, which is to be transformed by heat treatment into a functional solid material made of metal oxide ceramics (ITO). More specifically, prepared as the functional liquid material is a solution containing metal carboxylate, which is one of the metal organic acid salts (the functional liquid material manufactured by Kojundo Chemical Laboratory Co., Ltd. (trade name: ITO-05C), original solution:diluted solution=1:1.5). This functional liquid material additionally includes impurities at a concentration set such that the completed channel region 142A has the carrier density in the range from $1 \times 10^{15}$ cm$^{-3}$ to $1 \times 10^{21}$ cm$^{-3}$.

Then, as shown in FIG. 40(e), the functional liquid material is applied onto one of the surfaces of the insulating substrate 110A in accordance with the spin coat technique (2000 rpm for 25 seconds, for example). Subsequently, the insulating substrate 110A is laid on a hot plate to be dried at 150° C. for 3 minutes. There is thus formed a precursor layer 140A' (300 nm thick) of the functional solid material (ITO).

Thereafter, as shown in FIGS. 41(a) to 41(c), the precursor layer 140A' is imprinted with use of a convexoconcave mold M4A (having the difference in height of 350 nm) formed such that the region corresponding to the channel region 142A is convex relatively to the regions corresponding to the source region 144A and the drain region 146A. Therefore, the precursor layer 140A' is deformed to have an imprinted structure (350 nm thick at the convex portions and 100 nm thick at the concave portions). Accordingly, the portion to be transformed into the channel region 142A is made thinner than the other portions in the precursor layer 140A'.

In the above process, the precursor layer 140A' is imprinted in the state of being heated to 150° C. with use of the mold also heated to 150° C. In this case, the imprinting is performed by applying the pressure of approximately 4 MPa.

The convexoconcave mold M4A is configured such that the regions corresponding to an element isolation region 160A and the through hole 150A are further convex relatively to the region corresponding to the channel region 142A. When one of the surfaces of the insulating substrate 110A is entirely wet etched, the precursor layer 140A' can be completely removed at the regions corresponding to the element isolation region 160A and the through hole 150A while the portion to be transformed into the channel region 142A is made to have predetermined thickness (see FIG. 41(d)). The convexoconcave mold M4A may have a shape tapered at the portion corresponding to the element isolation region.

Lastly, the precursor layer 140A' is heat treated (the precursor layer 140A' is baked on a hot plate at 400° C. for 10 minutes, and then the precursor layer 140A' is heated with use of an RTA apparatus at 650° C. for 30 minutes (in the oxygen atmosphere for the first 15 minutes and in the nitrogen atmosphere for the second 15 minutes)). It is therefore possible to form the oxide conductor layer 140A including the source region 144A, the drain region 146A, and the channel region 142A. As a result, the thin film transistor 100A according to Embodiment 10 can be produced so as to have a bottom gate structure as shown in FIG. 41(e).

3. Effects Exerted by Thin Film Transistor 100A According to Embodiment 10

The thin film transistor 100A according to Embodiment 10 is superior to the conventional thin film transistor, because the thin film transistor according to the present embodiment includes the gate insulating layer, which has the "excellent electrical properties (such as high residual polarization properties and low leakage current properties). The gate insulating layer is formed such that the precursor layer is dried at the first temperature (exclusively for the production of a ferroelectric material layer) in the range from 120° C. to 250° C. and is imprinted while being heated to the second temperature (exclusively for the production of a ferroelectric material layer) higher than the first temperature (exclusively for the production of a ferroelectric material layer) as well as in the range from 150° C. to 300° C.

The thin film transistor 100A according to Embodiment 10 can be produced simply by forming the oxide conductor layer in which the channel region is thinner than the source region and the drain region. Therefore, there is no need to form the channel region, the source region, and the drain region with use of the different materials, unlike the conventional thin film transistor 900. As a result, the excellent thin film transistor as described above can be produced with use of the raw materials and production energy much less than the conventional case, as well as by the less processes as compared with the conventional method.

In the thin film transistor 100A according to Embodiment 10, the oxide conductive material is used as the material for the channel region 142A, thereby increasing the carrier density. Furthermore, the ferroelectric material is used as the material for the gate insulating layer 130A, thereby realizing quick switching at a low drive voltage. As a result, similarly to the conventional thin film transistor 900, a large current can be quickly controlled at a low drive voltage.

The thin film transistor 100A according to Embodiment 10 can be produced simply by forming the oxide conductor layer 140A in which the channel region 142A is thinner than the source region 144A and the drain region 146A. Therefore, there is no need to form the channel region, the source region, and the drain region with use of the different materials, unlike the conventional thin film transistor 900. As a result, the excellent thin film transistor as described above can be produced with use of the raw materials and production energy much less than the conventional case, as well as by the less processes as compared with the conventional method.

In the thin film transistor 100A according to Embodiment 10, each of the oxide conductor layer, the gate electrode, and the gate insulating layer is formed with use of a functional liquid material. Therefore, the thin film transistor can be produced in accordance with the imprinting technique. As a result, the excellent thin film transistor as described above can be produced with use of the raw materials and production energy much less than the conventional case, as well as by the less processes as compared with the conventional method.

In the thin film transistor 100A according to Embodiment 10, all of the oxide conductor layer, the gate electrode, and the gate insulating layer are formed without adopting the vacuum process. Because it is possible to produce the thin film transistor without adopting the vacuum process, the excellent thin film transistor as described above can be produced with use of production energy much less than the conventional case, as well as by the less processes as compared with the conventional method.

Furthermore, in the thin film transistor 100A according to Embodiment 10, the gate electrode and the gate insulating layer each have a perovskite structure. Therefore, the lattice defect is less likely to occur at the interface between the gate electrode and the gate insulating layer, so as to produce the thin film transistor of high quality.

Moreover, in the thin film transistor 100A according to Embodiment 10, the channel region 142A has the carrier density and the thickness set to such values at which the channel region 142A is depleted when an OFF control voltage is applied to the gate electrode 120A. As a result, the amount of the current flowing in the OFF state can be sufficiently decreased even when the carrier density of the oxide conductor layer is increased. Therefore, it is possible to control a large current at a low drive voltage while keeping a required ON/OFF ratio. In this case, if the thin film transistor is of the enhancement type, such a thin film transistor is turned into the OFF state upon application of a control voltage of 0 V to the gate electrode. Therefore, the values may be set such that the entire channel region is depleted in this case. On the other hand, if the thin film transistor is of the depression type, such a thin film transistor is turned into the OFF state upon application of a negative control voltage to the gate electrode. Therefore, the values may be set such that the entire channel region is depleted in this case.

Moreover, in the thin film transistor 100A according to Embodiment 10, the carrier density of the channel region 142A is in the range from $1 \times 10^{15}$ cm$^{-3}$ to $1 \times 10^{21}$ cm$^{-3}$, and the thickness of the channel region 142A is in the range from 5 nm to 100 nm. Therefore, it is possible to control a large current at a low drive voltage while keeping a required ON/OFF ratio.

Embodiment 11

1. Thin Film Transistor 200A According to Embodiment 11

FIGS. 10(a) to 10(c) are explanatory views of a thin film transistor 200A according to Embodiment 11. FIG. 10(a) is a plan view of the thin film transistor 200A. FIG. 10(b) is a sectional view taken along line A1-A1 indicated in FIG. 10(a). FIG. 10(c) is a sectional view taken along line A2-A2 indicated in FIG. 10(a).

The thin film transistor 200A according to Embodiment 11 is different from the thin film transistor 100A according to Embodiment 10 in having a top gate structure. The thin film transistor according to the present embodiment includes a gate insulating layer, which has "excellent electrical properties (such as high residual polarization properties and low leakage current properties). The gate insulating layer is formed such that the precursor layer is dried at the first temperature (exclusively for the production of a ferroelectric material layer) in the range from 120° C. to 250° C. and is imprinted while being heated to the second temperature (exclusively for the production of a ferroelectric material layer) higher than the first temperature (exclusively for the production of a ferroelectric material layer) as well as in the range from 150° C. to 300° C. As a result, similarly to the thin film transistor 100A according to Embodiment 10, the thin film transistor according to the present embodiment is superior to the conventional thin film transistor.

The method of producing the thin film transistor 200A according to Embodiment 11 includes the processes same as those of Embodiment 7, except for some of the processes to be described later. Accordingly, the description duplicating with that of Embodiment 7 may not be repeatedly provided.

FIGS. 11(a) to 12(e) are explanatory views of the method of producing the thin film transistor 200A according to Embodiment 11. FIGS. 11(a) to 11(f) and FIGS. 12(a) to 12(e) show the respective processes.

This method is different from that of Embodiment 7 in the process of forming a gate insulating layer 230A. More specifically, there is initially prepared a functional liquid material, which is to be transformed by heat treatment into a functional solid material made of metal oxide ceramics (PZT) (the sol-gel solution preparation step in the present embodiment). In the present embodiment, prepared as the functional liquid material is a solution containing metal alkoxide (manufactured by Mitsubishi Materials Corporation, sol-gel solution).

Then, "the functional liquid material is applied onto one of the surfaces of the insulating substrate 210 in accordance with the spin coat technique (2500 rpm for 25 seconds, for example), and subsequently, the insulating substrate 210 is laid on a hot plate to be dried at 150° C. for 5 minutes" repetitively for 3 times. There is thus formed a precursor layer 230A' (300 nm thick) of the functional solid material (PZT) (the ferroelectric material precursor layer formation step to the drying step).

Thereafter, as shown in FIG. 11(e), the precursor layer 230A' is imprinted at 225° C. with use of the convexoconcave mold M6 (having the difference in height of 300 nm) formed such that the regions corresponding to through holes 250 are convex. By performing this imprinting, the precursor layer 230A' is deformed to have an imprinted structure corresponding to the through holes 250 (the imprinting step). In this case, the imprinting is performed by applying the pressure of 5 MPa. In this manner, the precursor layer is imprinted, which has obtained high plastic deformability by being heated to 225° C. As a result, it is possible to obtain the desired electrical properties improvement effects.

Thereafter, the precursor layer 230A' is heat treated for 10 minutes at 650° C., which is set as the third temperature, with use of an RTA apparatus. As shown in FIG. 11(f), by performing this heat treatment, the gate insulating layer 230A is formed as the functional solid material layer (PZT) (the ferroelectric material layer formation step).

By performing the subsequent processes, there can be finally produced the thin film transistor 200A according to Embodiment 11, which has the top gate structure as shown in FIG. 12(e).

Embodiment 12

FIGS. 13(a) to 13(c) are explanatory views of a piezoelectric ink jet head 300A according to Embodiment 12. FIG. 13(a) is a sectional view of the piezoelectric ink jet head 300A. FIGS. 13(b) and 13(c) each show the state where the piezoelectric ink jet head 300A discharges ink.

1. Configuration of Piezoelectric Ink Jet Head 300A According to Embodiment 12

As shown in FIG. 13(a), the piezoelectric ink jet head 300A according to Embodiment 12 includes a cavity component 340, a vibration plate 350 that is attached to one side of the cavity component 340 and is provided with a piezoelectric element 320A, a nozzle plate 330 that is attached to another side of the cavity component 340 and is provided with a nozzle opening 332, and an ink chamber 360 that is defined by the cavity component 340, the vibration plate 350, and the nozzle plate 330. The vibration plate 350 is provided with an ink supply port 352 that is in communication with the ink chamber 360 and is used for supplying ink into the ink chamber 360.

In the piezoelectric ink jet head 300A according to Embodiment 12, initially, as shown in FIGS. 13(b) and 13(c), an appropriate voltage is applied to the piezoelectric element 320A, so that the vibration plate 350 is temporarily bent upward and ink is supplied from a reservoir (not shown) into the ink chamber 360. The vibration plate 350 is then bent downward, so that dripped ink i is discharged from the ink chamber 360 through the nozzle opening 332. Therefore, clear printing can be realized on a printing target.

2. Method of Producing Piezoelectric Ink Jet Head According to Embodiment 12

The method of producing the piezoelectric ink jet head 300A according to the present embodiment includes the processes same as those of Embodiment 8 described above, except for some of the heating conditions to be described later. Accordingly, the description duplicating with that of Embodiment 8 may not be repeatedly provided. In the piezoelectric ink jet head 300A according to the present embodiment, both of the piezoelectric element 320A (a first electrode layer 322, a piezoelectric layer 324A, and a second electrode layer 326) and the cavity component 340 are formed in accordance with the imprinting technique.

FIGS. 14(a) to 16(e) are explanatory views of the method of producing the piezoelectric ink jet head 300A according to Embodiment 12. FIGS. 14(a) to 14(f), FIGS. 15(a) to 15(d), and FIGS. 16(a) to 16(e) show the respective processes.

One of the differences from Embodiment 8 is the first temperature (exclusively for the production of a ferroelectric material layer) in the drying process and the processing manner. More specifically, as shown in FIG. 14(d), "the functional liquid material was applied onto one of surfaces of a dummy substrate 310 in accordance with the spin coat technique, and subsequently, the dummy substrate 310 was laid on a hot plate to be dried at 150° C. for 5 minutes" repetitively for a plurality of times. There is thus formed a precursor layer 324A' (1 μm to 10 μm thick, for example) of a functional solid material (PZT) (the ferroelectric material precursor layer formation step to the drying step). The drying process according to the present embodiment is performed preferably at the first temperature (exclusively for the production of a ferroelectric material layer) in the range from 120° C. to 250° C., in order to obtain the piezoelectric layer having "excellent electrical properties (such as high residual polarization properties and low leakage current properties)" to be described later.

Another one of the differences from Embodiment 8 is the second temperature (exclusively for the production of a ferroelectric material layer) in the imprinting process. More specifically, in the present embodiment, the precursor layer 324A' is imprinted in the state of being heated to 225° C. with use of the mold also heated to 225° C. In this case, the imprinting is performed by applying the pressure of approximately 4 MPa. The imprinting process according to the present embodiment is performed on the precursor layer 324A' preferably by heating the precursor layer 324A' to the second temperature (exclusively for the production of a ferroelectric material layer) higher than the first temperature (exclusively for the production of a ferroelectric material layer) as well as in the range from 150° C. to 300° C., in order to obtain the piezoelectric layer having "excellent electrical properties (such as high residual polarization properties and low leakage current properties)" to be described later.

3. Effects Exerted by Piezoelectric Ink Jet Head 300A According to Embodiment 12

The piezoelectric ink jet head 300A according to Embodiment 12 includes the piezoelectric layer having the "excellent electrical properties (such as high residual polarization properties and low leakage current properties)". The piezoelectric layer is formed by imprinting the precursor layer 324A' that is heated to the second temperature (exclusively for the production of a ferroelectric material layer) higher than the first temperature (exclusively for the production of a ferroelectric material layer) as well as in the range from 150° C. to 300° C.

As a result, the thin piezoelectric ink jet head 300A according to Embodiment 12 is superior to the conventional thin film transistor.

Furthermore, in the piezoelectric ink jet head 300A according to Embodiment 12, each of the first electrode layer 322, the piezoelectric layer 324A, the second electrode layer 326, and the cavity component 340 is formed with use of a liquid material. It is thus possible to produce the piezoelectric ink jet head in accordance with the imprinting technique. Therefore, the excellent piezoelectric ink jet head as described above can be produced with use of the raw materials and production energy, which are much less than the conventional case.

Furthermore, in the piezoelectric ink jet head 300A according to Embodiment 12, all of the first electrode layer 322, the piezoelectric layer 324A, the second electrode layer 326, and the cavity component 340 are formed without adopting the vacuum process. Therefore, the excellent piezoelectric ink jet head as described above can be produced with use of production energy much less than the conventional case, as well as by the less processes as compared with the conventional method.

There have been described the method of producing a ferroelectric material layer according to the present embodiment, as well as the thin film transistor and the piezoelectric ink jet head according to the embodiment. However, the present invention is not limited to the above. The present embodiment can be performed in the scope not departing from the purposes thereof, and can be modified in the following manners, for example.

(1) In Embodiments 9 to 12 described above, PZT (Pb(Zr$_x$Ti$_{1-x}$)O$_3$) was used as the ferroelectric material. However, the present invention is not limited to the above. There may be alternatively used Nb doped PZT, La doped PZT, barium titanate (BaTiO$_3$), lead titanate (PbTiO$_3$), BTO (Bi$_4$Ti$_3$O$_{12}$), BLT (Bi$_{4-x}$La$_x$Ti$_3$O$_{12}$), SBT (SrBi$_2$Ta$_2$O$_9$), BZN (Bi$_{1.5}$Zn$_{1.0}$Nb$_{1.5}$O$_7$), or bismuth ferrite (BiFeO$_3$).

(2) In the method of producing a ferroelectric material layer according to each of Embodiments 9 to 12, the ferroelectric material layer is imprinted with use of the imprinting apparatus 700A, which imprints a planar base material by pressing a mold at a right angle against the base material. However, the present invention is not limited to the above. For example, the ferroelectric material layer may be imprinted with use of an imprinting apparatus in which a mold is attached to a surface of a roller so as to imprint a planar base material while rotating the roller, or an imprinting apparatus in which a base material is attached to a surface of a roller so as to imprint the base material while rotating the roller on the planar mold. In the case where the mold is attached to the surface of the roller, the mold may be formed on the surface itself of the roller, instead of attaching the mold onto the surface of the roller.

(3) In Embodiments 10 and 11 described above, indium tin oxide (ITO) was used as the oxide conductor material. However, the present invention is not limited to the above. For example, it is possible to use the oxide conductor material such as indium oxide (In$_2$O$_3$), antimony doped tin oxide (Sb—SnO$_2$), zinc oxide (ZnO), aluminum doped zinc oxide (Al—ZnO), gallium doped zinc oxide (Ga—ZnO), ruthenium oxide (RuO$_2$), iridium oxide (IrO$_2$), tin oxide (SnO$_2$), tin monoxide SnO, or niobium doped titanium dioxide (Nb—TiO$_2$). Other examples of the oxide conductor material include amorphous conductive oxide such as indium gallium zinc complex oxide (IGZO), gallium doped indium oxide (In—Ga—O (IGO)), and indium doped zinc oxide (In—Zn—O (IZO)). Still other examples of the oxide conductor material include strontium titanate (SrTiO$_3$), niobium doped strontium titanate (Nb—SrTiO$_3$), strontium barium complex oxide (SrBaO$_2$), strontium calcium complex oxide (SrCaO$_2$), strontium ruthenate (SrRuO$_3$), lanthanum nickel oxide (LaNiO$_3$), lanthanum titanium oxide (LaTiO$_3$), lanthanum copper oxide (LaCuO$_3$), neodymium nickel oxide (NdNiO$_3$), yttrium nickel oxide (YNiO$_3$), lanthanum calcium manganese complex oxide (LCMO), barium plumbate (BaPbO$_3$), LSCO (La$_x$Sr$_{1-x}$CuO$_3$), LSMO (La$_{1-x}$Sr$_x$MnO$_3$), YBCO (YBa$_2$Cu$_3$O$_{7-x}$), LNTO (La(Ni$_{1-x}$Ti$_x$)O$_3$), LSTO ((La$_{1-x}$Sr$_x$)TiO$_3$), STRO (Sr(Ti$_{1-x}$Ru$_x$)O$_3$), any other perovskite conductive oxide, and any other pyrochlore conductive oxide.

(4) Embodiments 10 and 11 described above each adopt lanthanum nickel oxide (LaNiO$_3$) as the material for the gate electrode. However, the present invention is not limited to the above. For example, it is possible to use Pt, Au, Ag, Al, Ti, ITO, In$_2$O$_3$, Sb—In$_2$O$_3$, Nb—TiO$_2$, ZnO, Al—ZnO, Ga—ZnO, IGZO, RuO$_2$, IrO$_2$, Nb—STO, SrRuO$_3$, LaNiO$_3$, BaPbO$_3$, LSCO, LSMO, YBCO, or any other perovskite conductive oxide. Still alternatively, there may be used any other pyrochlore conductive oxide or any other amorphous conductive oxide.

(5) Embodiments 10 and 11 each adopt the insulating substrate obtained by forming the STO (SrTiO$_3$) layer on the surface of the Si substrate, with the SiO$_2$ layer and the Ti layer being interposed therebetween, or there is used the substrate made of quartz glass (SiO$_2$). However, the present invention is not limited to the above. There may be alternatively used an SiO$_2$/Si substrate, an alumina (Al$_2$O$_3$) substrate, an STO (SrTiO$_3$) substrate, or an SRO (SrRuO$_3$) substrate.

(6) In the present invention, Embodiment 9 exemplifies the capacitor, Embodiments 10 and 11 each exemplify the thin film transistor, and Embodiment 12 exemplifies the piezoelectric ink jet head. However, the present invention is not limited to the above. For example, the method of producing a ferroelectric material layer according to the present invention is also applicable to a case of producing any other functional device other than the above.

Embodiment 13

1. Field Effect Transistor 100B According to Embodiment 13

Figure 42:
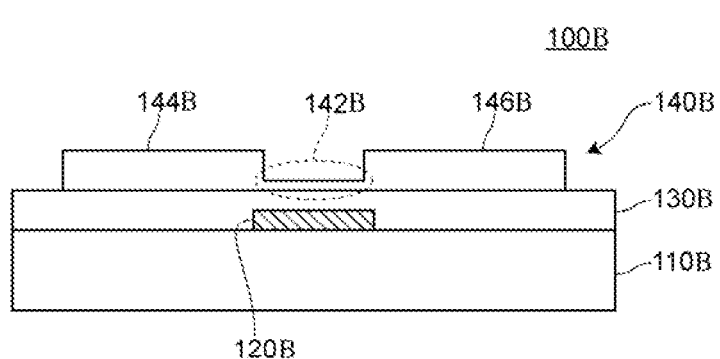
FIGS. 42(a) and 42(b) are explanatory views of a field effect transistor 100B according to Embodiment 13.
Figure 42:
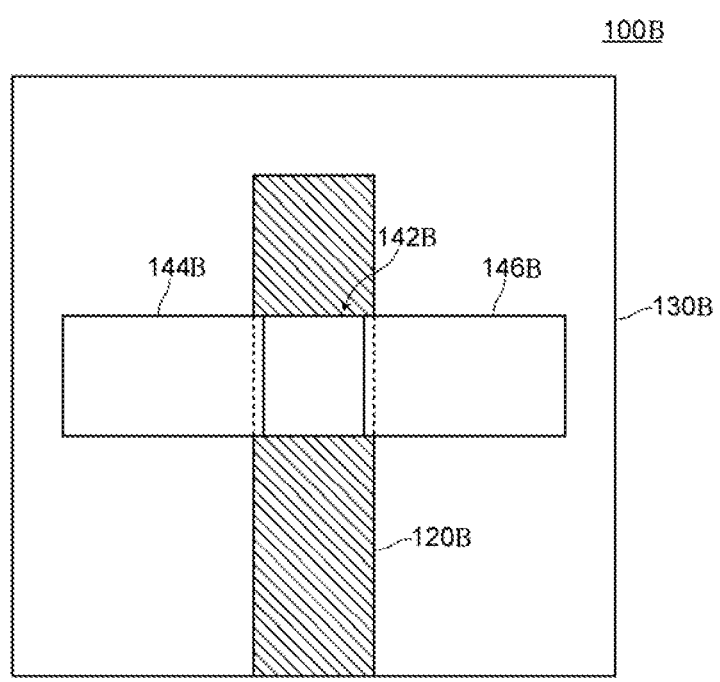
Figure 43:
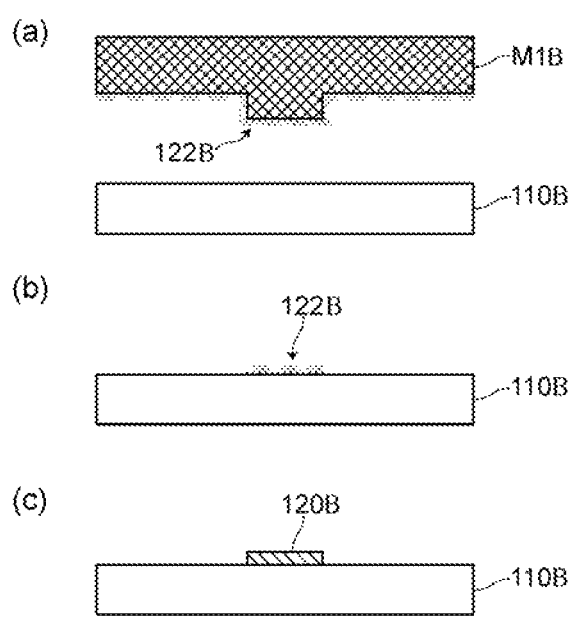
FIGS. 43(a) to 43(c) are explanatory views of a method of producing a field effect transistor according to Embodiment 13.
Figure 44:
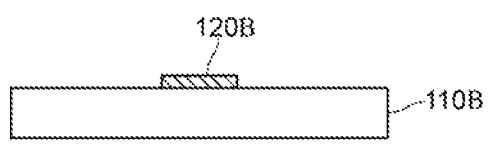
FIGS. 44(a) to 44(d) are explanatory views of the method of producing a field effect transistor according to Embodiment 13.
Figure 44:
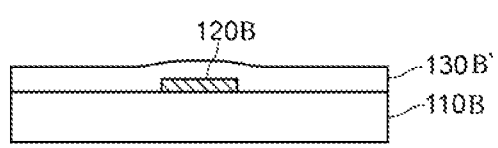
Figure 44:
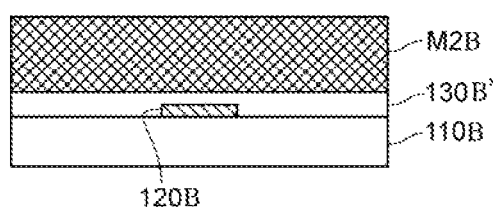
Figure 44:
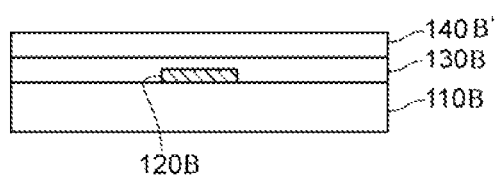
Figure 45:
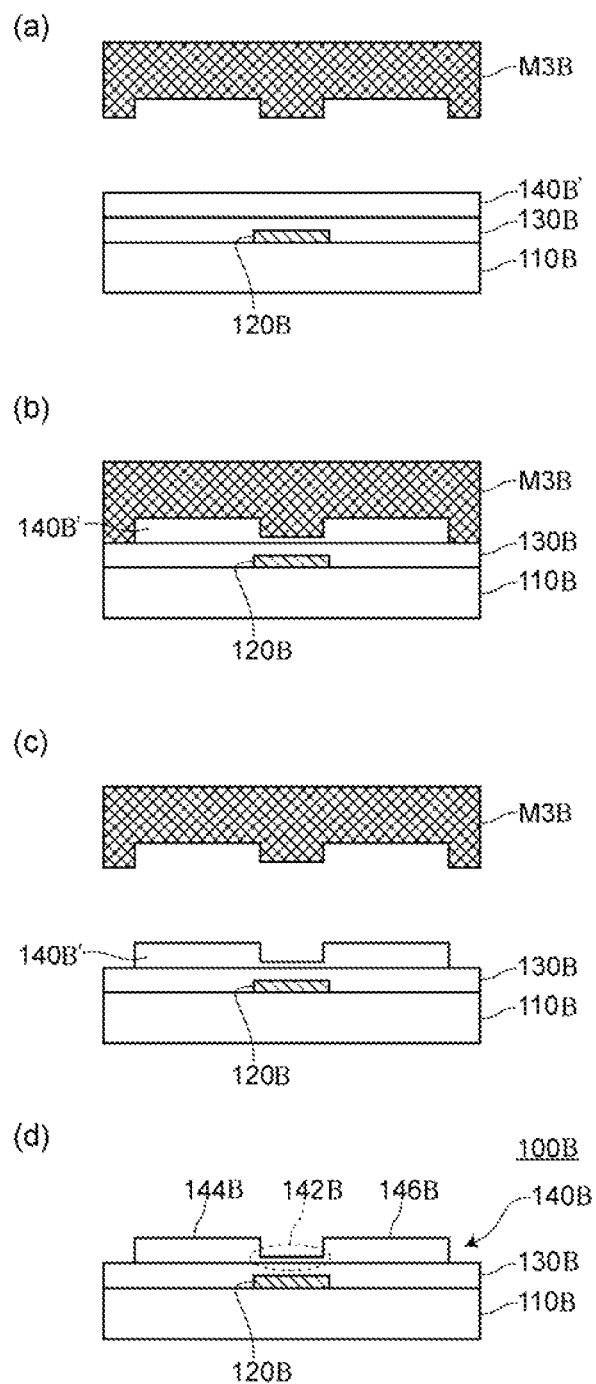
FIGS. 45(a) to 45(d) are explanatory views of the method of producing a field effect transistor according to Embodiment 13.

FIGS. 42(a) and 42(b) are explanatory views of a field effect transistor 100B according to Embodiment 13. FIG. 42(a) is a sectional view of the field effect transistor 100B, and FIG. 42(b) is a plan view of the field effect transistor 100B.

As shown in FIGS. 42(a) and 42(b), the field effect transistor 100B according to Embodiment 13 includes an oxide conductor layer 140B having a source region 144B, a drain region 146B, and a channel region 142B, a gate electrode 120B for controlling a conductive state of the channel region 142B, and a gate insulating layer 130B provided between the gate electrode 120B and the channel region 142B and made of a ferroelectric material. The channel region 142B is thinner than the source region 144B and the drain region 146B. The thickness of the channel region 142B is preferably at most a half of the thickness of each of the source region 144B and the drain region 146B.

In the field effect transistor 100B according to Embodiment 13, the oxide conductor layer 140B is formed such that the channel region 142B is thinner than the source region 144B and the drain region 146B, in accordance with the imprinting technique of the present embodiment.

In the field effect transistor 100B according to Embodiment 13, the channel region 142B has the carrier density and the thickness set to such values at which the channel region 142B is depleted when an OFF control voltage is applied to the gate electrode 120B. More specifically, the carrier density of the channel region 142B is in the range from $1 \times 10^{18}$ cm$^{-3}$ to $1 \times 10^{21}$ cm$^{-3}$. The thickness of the channel region 142B is in the range from 5 nm to 100 nm.

In the field effect transistor 100B according to Embodiment 13, the source region 144B and the drain region 146B each have thickness in the range from 50 nm to 1000 nm.

The oxide conductor layer 140B is made of indium tin oxide (ITO), for example. The gate insulating layer 130B is made of PZT (Pb(Zr$_x$Ti$_{1-x}$)O$_3$), for example. The gate electrode 120B is made of platinum (Pt), for example. An insulating substrate 110B, which is solid, is made of quartz glass (SiO$_2$), for example.

2. Method of Producing Field Effect Transistor 100B According to Embodiment 13

The field effect transistor 100B according to Embodiment 13 can be produced in accordance with a method of producing a field effect transistor, which includes the first to third processes in this order (the method of producing a field effect transistor according to Embodiment 13). Described step by step below is the method of producing the field effect transistor 100B according to Embodiment 13.

FIGS. 43(a) to 45(d) are explanatory views of the method of producing a field effect transistor according to Embodiment 13. FIGS. 43(a) to 43(c), FIGS. 44(a) to 44(d), and FIGS. 45(a) to 45(d) show the respective processes.

(1) First Process

In the first process, the gate electrode 120B is formed on one of the surfaces of the insulating substrate 110B (see FIGS. 43(a) to 43(c)).

Initially, as shown in FIG. 43(a), a convexoconcave mold (another Japanese expression indicated) M1B is pressed against one of the surfaces of the insulating substrate 110B. The convexoconcave mold is provided, at least on the convex portion, with a particulate plating catalyst 122B serving as a plating catalytic material. As shown in FIG. 43(b), the particulate plating catalyst 122B is caused to adhere to the insulating substrate 110B at the portion to be provided with the gate electrode 120B.

Then, there is formed, by performing nonelectrolytic plating, the gate electrode 120B made of platinum (Pt) or the like, at the region to which the particulate plating catalyst 122B adheres.

(2) Second Process

In the second process, the gate insulating layer 130B is formed on one of the surfaces of the insulating substrate 110B (see FIGS. 44(a) to 44(c)).

Initially, as shown in FIGS. 44(a) and 44(b), a solution containing a ferroelectric raw material (such as a PZT sol-gel solution) is applied onto one of the surfaces of the insulating substrate 110B, thereby forming a film 130B' containing the ferroelectric raw material.

Subsequently, as shown in FIG. 44(c), a flat mold (another Japanese expression indicated) M2B is pressed against the film 130B' containing the ferroelectric raw material. Accordingly, the film 130B' containing the ferroelectric raw material is flattened.

Thereafter, the flattened film 130B' containing the ferroelectric raw material is heat treated to form the gate insulating layer 130B on one of the surfaces of the insulating substrate 110B (not shown).

(3) Third Process

In the third process, there is formed, on the gate insulating layer 130B, the oxide conductor layer 140B that includes the source region 144B, the drain region 146B, and the channel region 142B (see FIGS. 44(d) to 45(d)).

Initially, as shown in FIG. 44(d), a solution containing an oxide conductive raw material (such as an ITO sol-gel solution) is applied onto the gate insulating layer 130B, thereby forming a film 140B' containing the oxide conductive raw material. The solution containing the oxide conductive raw material additionally includes impurities at a concentration set such that the completed channel region 142B has the carrier density in the range from $1 \times 10^{-3}$ to $1 \times 10^{21}$ cm$^{-3}$.

Next, as shown in FIGS. 45(a) to 45(c), the film 140B' containing the oxide conductive raw material is imprinted with use of a convexoconcave mold M3B formed such that the region corresponding to the channel region 142B is convex relatively to the regions corresponding to the source region 144B and the drain region 146B. In this case, the imprinting is performed such that the film 140B' containing the oxide conductive raw material at the region corresponding to the channel region 142B has predetermined thickness in the range from 5 nm to 100 nm. Accordingly, in the film 140B' containing the oxide conductive raw material, the portion to be transformed into the channel region 142B is made thinner than the other portions. The convexoconcave mold M3B is configured such that the region corresponding to the element isolation region is further convex relatively to the region corresponding to the channel region 142B. Therefore, the film 140B' containing the oxide conductive raw material is removed at the element isolation region (see FIG. 45(c)). The convexoconcave mold M3B may have a shape tapered at the portion corresponding to the element isolation region.

Then, the film 140B' containing the oxide conductive raw material is heat treated to form the oxide conductor layer 140B that includes the source region 144B, the drain region 146B, and the channel region 142B. As a result, the field effect transistor 100B according to Embodiment 13 can be produced so as to have a bottom gate structure as shown in FIG. 45(d).

3. Effects Exerted by Field Effect Transistor 100B According to Embodiment 13

In the field effect transistor 100B according to Embodiment 13 thus produced, the oxide conductive material is used as the material for the channel region 142B, thereby increasing the carrier density. Furthermore, the ferroelectric material is used as the material for the gate insulating layer 130B, thereby realizing quick switching at a low drive voltage. As a result, similarly to the conventional thin film transistor (field effect transistor) 900, a large current can be quickly controlled at a low drive voltage.

The field effect transistor 100B according to Embodiment 13 can be produced simply by forming the oxide conductor layer 140B in which the channel region 142B is thinner than the source region 144B and the drain region 146B. Therefore, there is no need to form the channel region as well as the source region and the drain region with use of different materials, unlike the conventional field effect transistor. As a result, the excellent field effect transistor as described above can be produced with use of the raw materials and production energy, which are much less than the conventional case.

In the field effect transistor 100B according to Embodiment 13, the oxide conductor layer 140B is formed such that the channel region is thinner than the source region and the drain region, in accordance with the imprinting technique. It is therefore possible to simply and easily produce the field effect transistor without performing, after performing the imprinting, the so-called "post process" such as the photolithography process. The field effect transistor can be produced with use of the raw materials and production energy, which are much less than the conventional case.

In the field effect transistor 100B according to Embodiment 13, the channel region 142B has the carrier density and the thickness set to such values at which the channel region 142B is depleted when an OFF control voltage is applied to the gate electrode 120B. Accordingly, the amount of the current flowing in the OFF state can be sufficiently decreased even when the carrier density of the oxide conductor layer is increased. Therefore, it is possible to control a large current at a low drive voltage while keeping a required ON/OFF ratio.

Moreover, in the field effect transistor 100B according to Embodiment 13, the carrier density of the channel region 142B is in the range from $1 \times 10^{18}$ cm$^{-3}$ to $1 \times 10^{21}$ cm$^{-3}$, and the thickness of the channel region 142B is in the range from 5 nm to 100 nm. Accordingly, it is possible to control a large current at a low drive voltage while keeping a required ON/OFF ratio.

4. Effects Exerted by Method of Producing Field Effect Transistor According to Embodiment 13

In the method of producing a field effect transistor according to Embodiment 13, the field effect transistor can be simply and easily produced without performing, after performing the imprinting, any post process such as the photolithography process. Therefore, the excellent field effect transistor as described above can be produced with use of the raw materials and production energy, which are much less than the conventional case.

As described earlier, the method of producing a field effect transistor according to Embodiment 13 includes, in the following order, the first process of forming the gate electrode 120B, the second process of forming the gate insulating layer 130B, and the third process of forming the oxide conductor layer 140B that has the source region 144B, the drain region 146B, and the channel region 142B. Therefore, the field effect transistor 100B according to Embodiment 13 can be produced so as to have the bottom gate structure.

In the method of producing a field effect transistor according to Embodiment 13, the imprinting is performed in the third process such that the film 140B' containing the oxide conductive raw material at the region corresponding to the channel region 142B has predetermined thickness in the range from 5 nm to 100 nm. There is thus obtained the structure in which the channel region 142B is depleted when an OFF control voltage is applied to the gate electrode 120B. As a result, it is possible to produce the field effect transistor that can control a large current at a low drive voltage while keeping a required ON/OFF ratio.

According to the method of producing a field effect transistor of Embodiment 13, the third process includes the process of isolating the element by partially removing the film 140B' containing the oxide conductive raw material, in accordance with the imprinting technique. It is thus possible to produce a plurality of field effect transistors, which are independent from each other, on one substrate.

According to the method of producing a field effect transistor of Embodiment 13, in the first process, the particulate plating catalyst 122B is caused to adhere to the portion to be provided with the gate electrode 120B in accordance with the contact printing technique. Thereafter, nonelectrolytic plating is provided to the region, to which the particulate plating catalyst 122B adheres, so as to form the gate electrode 120B. It is therefore possible to supply the material for the gate electrode only to the portion to be provided with the gate electrode 120B.

In the method of producing a field effect transistor according to Embodiment 13, the solution containing the oxide conductive raw material additionally includes impurities at a concentration set such that the completed channel region 142B has the carrier density in the range from $1 \times 10^{18}$ cm$^{-3}$ to $1 \times 10^{21}$ cm$^{-3}$. Accordingly, it is possible to produce the field effect transistor that can control a large current at a low drive voltage while keeping a required ON/OFF ratio.

Modification 1 of Embodiment 13

Figure 46:
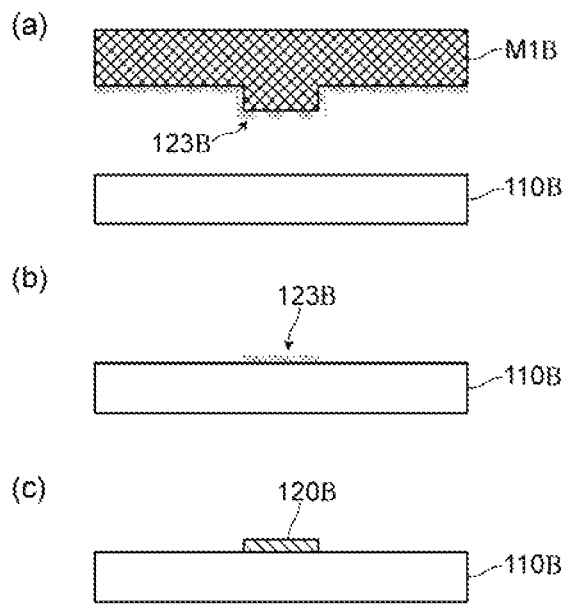
FIGS. 46(a) to 46(c) are explanatory views of a method of producing a field effect transistor according to Modification 1 of Embodiment 13.

FIGS. 46(a) to 46(c) are explanatory views of a method of producing a field effect transistor according to Modification 1 of Embodiment 13. FIGS. 46(a) to 46(c) show the respective processes.

The method of producing a field effect transistor according to Modification 1 of Embodiment 13 basically includes processes similar to those of the method of producing a field effect transistor according to Embodiment 13. However, the first process is different from that of the method of producing a field effect transistor according to Embodiment 13. More specifically, as shown in FIGS. 46(a) and 46(b), in the first process of the method of producing a field effect transistor according to Modification 1 of Embodiment 13, a nonelectrolytic plating catalytic solution (a solution of a salt of nickel, palladium, silver, platinum, or the like) is initially brought into contact with the insulating substrate 110B at the portion to be provided with the gate electrode 120B in accordance with the contact printing technique, so as to cause ions 123B having plating catalytic ability to adhere thereto. By subsequently performing the nonelectrolytic plating, as shown in FIG. 46(c), the gate electrode 120B made of platinum (Pt) is formed at the region to which the ions 123B having plating catalytic ability adheres. Also in this method, the gate electrode 120B can be formed similarly to the case of adopting the method of producing a field effect transistor according to Embodiment 13.

Modification 2 of Embodiment 13

Figure 47:
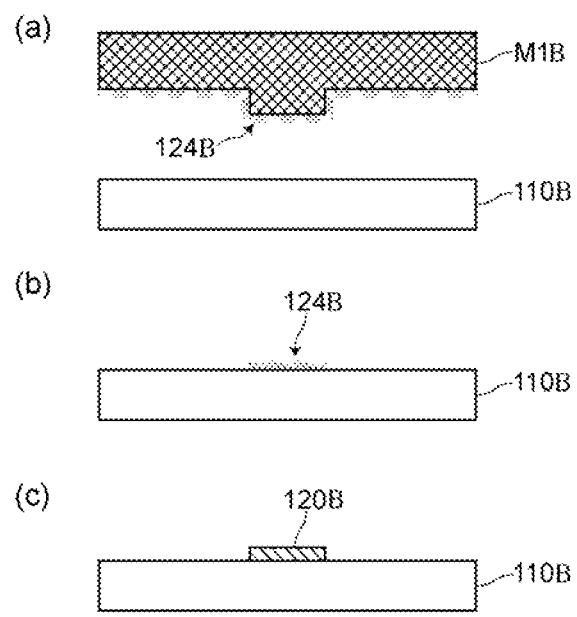
FIGS. 47(a) to 47(c) are explanatory views of a method of producing a field effect transistor according to Modification 2 of Embodiment 13.

FIGS. 47(a) to 47(c) are explanatory views of a method of producing a field effect transistor according to Modification 2 of Embodiment 13. FIGS. 47(a) to 47(c) show the respective processes.

The method of producing a field effect transistor according to Modification 2 of Embodiment 13 basically includes processes similar to those of the method of producing a field effect transistor according to Embodiment 13. However, the first process is different from that of the method of producing a field effect transistor according to Embodiment 13. More specifically, as shown in FIGS. 47(a) and 47(b), in the first process of the method of producing a field effect transistor according to Modification 2 of Embodiment 13, the lyophilization treatment is initially performed by bringing a lyophilization agent (such as FAS 17) into contact with the insulating substrate 110B at the portion to be provided with the gate electrode 120B in accordance with the contact printing technique. Thereafter, ink containing the raw material for the gate electrode is supplied to a region 124B thus lyophilized and heat treatment is performed, so that the gate electrode 120B is formed as shown in FIG. 47(c). Also in this method, the gate electrode 120B can be formed similarly to the case of adopting the method of producing a field effect transistor according to Embodiment 13.

Modification 3 of Embodiment 13

FIGS. 48(a) to 48(e) are explanatory views of a method of producing a field effect transistor according to Modification 3 of Embodiment 13. FIGS. 48(a) to 48(e) show the respective processes.

Figure 48:
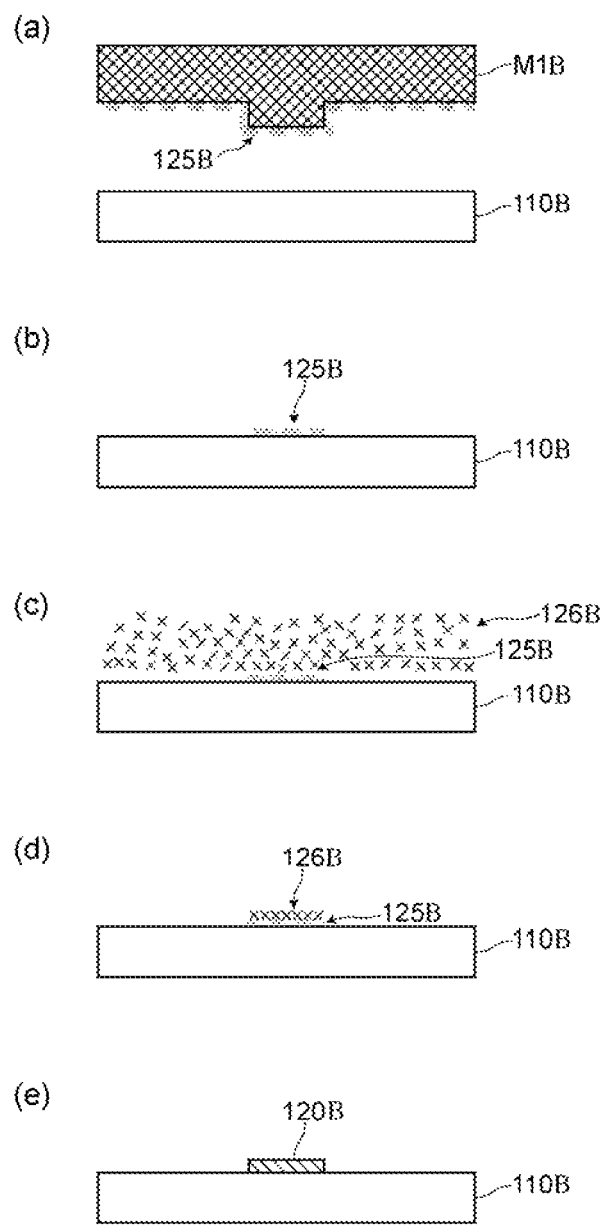
FIGS. 48(a) to 48(e) are explanatory views of a method of producing a field effect transistor according to Modification 3 of Embodiment 13.

The method of producing a field effect transistor according to Modification 3 of Embodiment 13 basically includes processes similar to those of the method of producing a field effect transistor according to Embodiment 13. However, the first process is different from that of the method of producing a field effect transistor according to Embodiment 13. More specifically, as shown in FIGS. 48(a) and 48(b), in the first process of the method of producing a field effect transistor according to Modification 3 of Embodiment 13, the portion to be provided with the gate electrode 120B on the insulating substrate 110B is initially lyophilized in accordance with the contact printing technique. Then, as shown in FIGS. 48(c) and 48(d), the substrate is immersed in a solution containing ions having plating catalytic ability, so that the ions 126B having plating catalytic ability adheres to a region 125B thus lyophilized, which is subsequently nonelectrolytically plated. By performing these processes, as shown in FIG. 48(e), the gate electrode 120B made of platinum (Pt) is formed at the region to which the ions 126B having plating catalytic ability adheres. Also in this method, the gate electrode 120B can be formed similarly to the case of adopting the method of producing a field effect transistor according to Embodiment 13.

Modification 4 of Embodiment 13

FIGS. 49(a) to 49(e) are explanatory views of a method of producing a field effect transistor according to Modification 4 of Embodiment 13. FIGS. 49(a) to 49(e) show the respective processes.

The method of producing a field effect transistor according to Modification 4 of Embodiment 13 basically includes processes similar to those of the method of producing a field effect transistor according to Embodiment 13. However, the first process is different from that of the method of producing a field effect transistor according to Embodiment 13. More specifically, in the first process of the method of producing a field effect transistor according to Modification 4 of Embodiment 13, as to be described below, the gate electrode 120B is formed in accordance with the imprinting technique.

Initially, there is prepared a functional liquid material, which is to be transformed by heat treatment into lanthanum nickel oxide ($LaNiO_3$). More specifically, there is prepared a solution (solvent: 2-methoxyethanol) containing metal inorganic salts (lanthanum nitrate (hexahydrate) and nickel acetate (tetrahydrate)).

Figure 49:
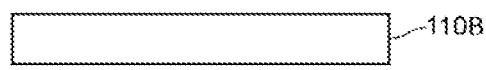
FIGS. 49(a) to 49(e) are explanatory views of a method of producing a field effect transistor according to Modification 4 of Embodiment 13.
Figure 49:
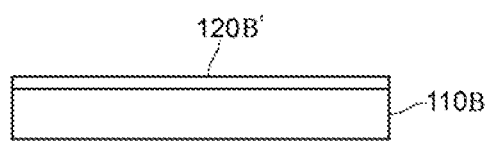
Figure 49:
Figure 49:
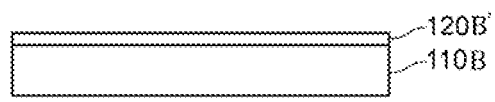
Figure 49:
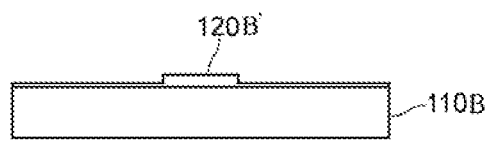

Next, as shown in FIGS. 49(a) and 49(b), the functional liquid material is applied onto one of the surfaces of the insulating substrate 110B in accordance with the spin coat technique (500 rpm for 25 seconds, for example). Then, the insulating substrate 110B is laid on a hot plate to be dried at 80° C. for 1 minute. There is thus formed a precursor layer 120B' (300 nm thick) made of lanthanum nickel oxide.

Subsequently, as shown in FIGS. 49(c) and 49(d), the precursor layer 120B' is imprinted at 150° C. with use of a convexoconcave mold M1a (having the difference in height of 300 nm) formed such that the region corresponding to the gate electrode 120B is concave. Therefore, the precursor layer 120B' is deformed to have an imprinted structure (300 nm thick at the convex portion and 50 nm thick at the concave portion). The imprinting is performed by applying the pressure of 5 MPa.

Then, the precursor layer 120B' is entirely etched so that the precursor layer is completely removed at the regions other than the region corresponding to the gate electrode 120B (the entire etching step). The entire etching process is performed in accordance with the wet etching technique (HF:HCL solution) without adopting the vacuum process.

Thereafter, the precursor layer 120B' is heat treated for 10 minutes at 650° C., which is set as the third temperature, with use of an RTA apparatus. As shown in FIG. 49(e), by performing this heat treatment, the precursor layer 120B' is transformed into the gate electrode 120B made of lanthanum nickel oxide. Also in this method, the gate electrode 120B can be formed similarly to the case of adopting the method of producing a field effect transistor according to Embodiment 13.

Therefore, in the method of producing a field effect transistor according to any one of Modifications 1 to 4 of Embodiment 13, similarly to the case of adopting the method of producing a field effect transistor according to Embodiment 13, it is possible to supply the material for the gate electrode only to the portion to be provided with the gate electrode 120B.

The method of producing a field effect transistor according to any one of Modifications 1 to 4 of Embodiment 13 includes processes similar to those of the method of producing a field effect transistor according to Embodiment 13, except for the first process. There are thus exerted corresponding effects from among the effects of the method of producing a field effect transistor according to Embodiment 13.

Embodiment 14

Figure 50:
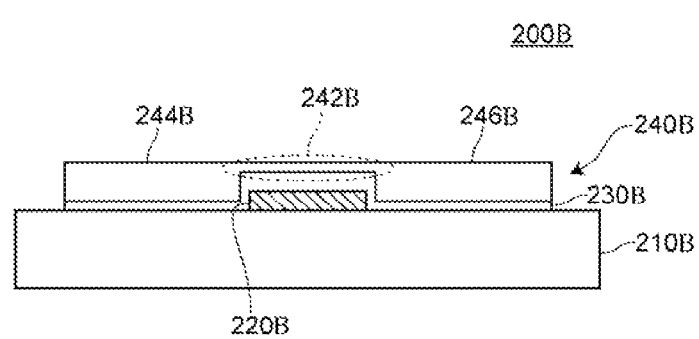
FIGS. 50(a) and 50(b) are explanatory views of a field effect transistor 200B according to Embodiment 14.
Figure 50:
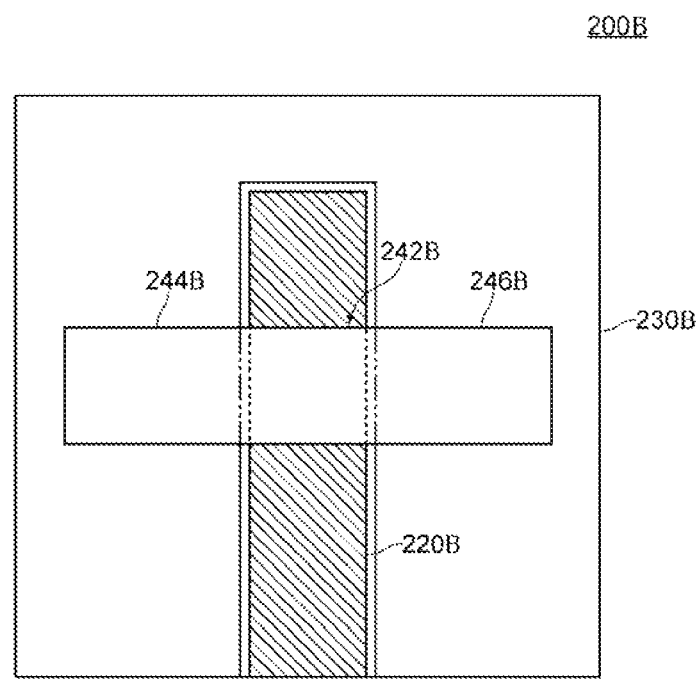
Figure 51:
FIGS. 51(a) to 51(d) are explanatory views of a method of producing a field effect transistor according to Embodiment 14.
Figure 51:
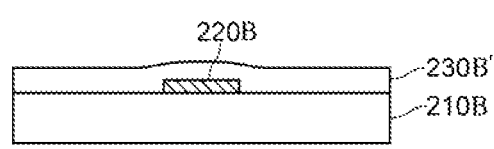
Figure 51:
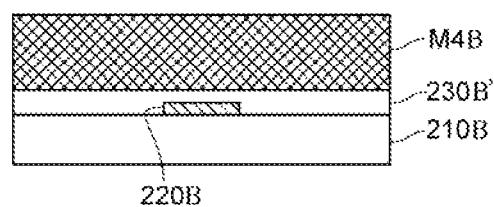
Figure 51:
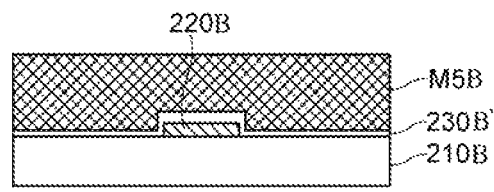
Figure 52:
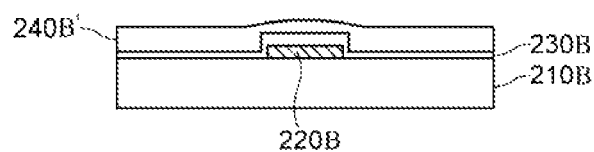
FIGS. 52(a) to 52(d) are explanatory views of the method of producing a field effect transistor according to Embodiment 14.
Figure 52:
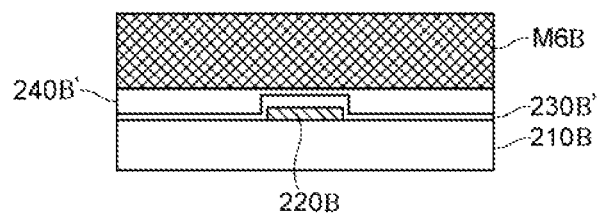
Figure 52:
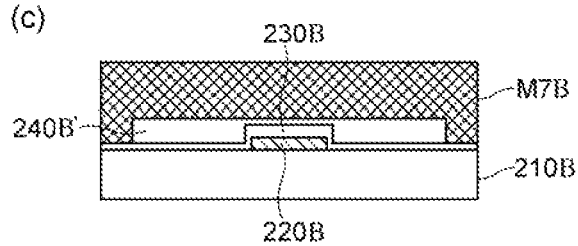
Figure 52:
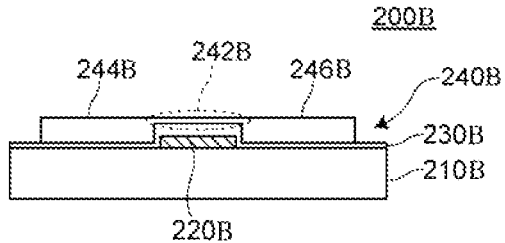

FIGS. 50(a) and 50(b) are explanatory views of a field effect transistor 200B according to Embodiment 14. FIG. 50(a) is a sectional view of the field effect transistor 200B, and FIG. 50(b) is a plan view of the field effect transistor 200B.

The field effect transistor 200B according to Embodiment 14 basically has a configuration similar to that of the field effect transistor 100B according to Embodiment 13. However, the configuration of the gate insulating layer is different from that of the field effect transistor 100B according to Embodiment 13. More specifically, as shown in FIGS. 50(a) and 50(b), in the field effect transistor 200B according to Embodiment 14, a gate insulating layer 230B is configured to be convex at the region covering a gate electrode 220B. Due to this structure, an oxide conductor layer is also configured differently.

As described above, in the field effect transistor 200B according to Embodiment 14, the configurations of the gate insulating layer and the oxide conductor layer are different from those of the field effect transistor 100B according to Embodiment 13. An oxide conductive material is used as the material for a channel region 242B. Accordingly, the carrier density can be increased. Furthermore, a ferroelectric material is used as the material for the gate insulating layer 230B, thereby realizing quick switching at a low drive voltage. As a result, similarly to the field effect transistor 100B according to Embodiment 13, a large current can be quickly controlled at a low drive voltage. The field effect transistor can be produced simply by forming the oxide conductor layer in which the channel region 242B is thinner than a source region 244B and a drain region 246B. Therefore, similarly to the field effect transistor 100B according to Embodiment 13, the excellent field effect transistor as described above can be produced with use of the raw materials and production energy, which are much less than the conventional case.

The field effect transistor 200B according to Embodiment 14 can be produced in accordance with a method of producing a field effect transistor, which includes the first to third processes in this order (the method of producing a field effect transistor according to Embodiment 14). Described step by step below is the method of producing the field effect transistor 200B according to Embodiment 14.

FIGS. 51(a) to 52(d) are explanatory views of the method of producing a field effect transistor according to Embodiment 14. FIGS. 51(a) to 51(d) and FIGS. 52(a) to 52(d) show the respective processes.

(1) First Process

In the first process, the gate electrode 220B is formed on one of surfaces of an insulating substrate 210B (see FIG. 51(a)). This process is the same as that of the method of producing a field effect transistor according to Embodiment 13. This process may be the same as that of the method of producing a field effect transistor according to any one of Modifications 1 to 4 of Embodiment 13.

(2) Second Process

In the second process, the gate insulating layer 230B is formed on one of the surfaces of the insulating substrate 210B. The gate insulating layer 230B is configured such that the region corresponding to the channel region 242B is convex relatively to the regions corresponding to the source region 244B and the drain region 246B (see FIGS. 51(b) to 51(d)).

Initially, as shown in FIG. 51(b), a solution containing a ferroelectric raw material is applied onto one of the surfaces of the insulating substrate 210B, thereby forming a film 230B' containing the ferroelectric raw material.

Then, as shown in FIG. 51(c), a flat mold M4B is pressed against the film 230B' containing the ferroelectric raw material, so that the film 230B' containing the ferroelectric raw material is flattened.

Next, as shown in FIG. 51(d), the film containing the ferroelectric raw material is imprinted with use of a convexoconcave mold M5B formed such that the regions corresponding to the source region 244B and the drain region 246B are convex relatively to the region corresponding to the channel region 242B.

Thereafter, the imprinted film 230B' containing the ferroelectric raw material is heat treated to form the gate insulating layer 230B on one of the surfaces of the insulating substrate 210B (not shown).

(3) Third Process

In the third process, there is formed, on the gate insulating layer 230B, an oxide conductor layer 240B that includes the source region 244B, the drain region 246B, and the channel region 242B (see FIGS. 52(a) to 52(d)).

Initially, as shown in FIG. 52(a), a solution containing an oxide conductive raw material is applied onto one of the surfaces of the insulating substrate 210B, thereby forming a film 240B' containing the oxide conductive raw material. The solution containing the oxide conductive raw material additionally includes impurities at a concentration set such that the completed channel region 242B has the carrier density in the range from $1 \times 10^{18}$ cm$^{-3}$ to $1 \times 10^{21}$ cm$^{-3}$.

Then, as shown in FIG. 52(b), the film 240B' containing the oxide conductive raw material is imprinted with use of a flat mold M6B, so that the film 240B' containing the oxide conductive raw material is flattened. In this case, the imprinting is performed such that the film 240B' containing the oxide conductive raw material at the region corresponding to the channel region 242B has predetermined thickness in the range from 5 nm to 100 nm.

Next, as shown in FIG. 52(c), the film 240B' containing the oxide conductive raw material is further imprinted with use of a convexoconcave mold M7B formed such that the region corresponding to an element isolation region is convex. Accordingly, the film 240B' containing the oxide conductive raw material is removed at the element isolation region.

Then, the film 240B' containing the oxide conductive raw material is heat treated to form the oxide conductor layer 240B that includes the source region 244B, the drain region 246B, and the channel region 242B. As a result, the field effect transistor 200B according to Embodiment 14 can be produced so as to have a bottom gate structure as shown in FIG. 52(d).

Embodiment 15

Figure 53:
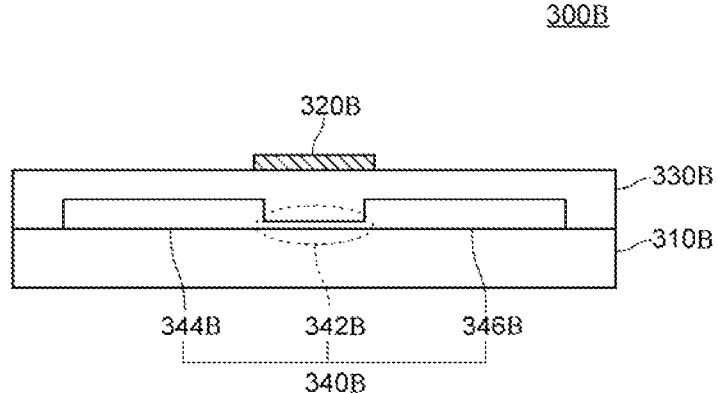
FIGS. 53(a) and 53(b) are explanatory views of a field effect transistor 300B according to Embodiment 15.
Figure 53:
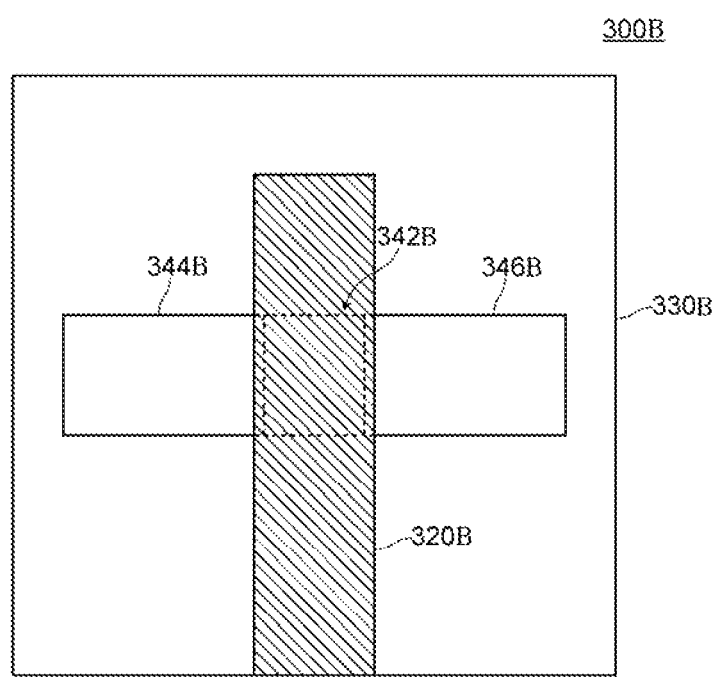
Figure 54:
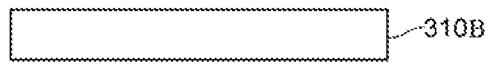
FIGS. 54(a) to 54(e) are explanatory views of a method of producing a field effect transistor according to Embodiment 15.
Figure 54:
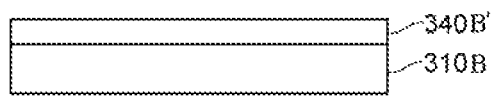
Figure 54:
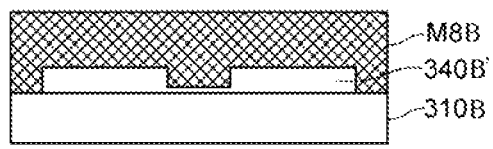
Figure 54:
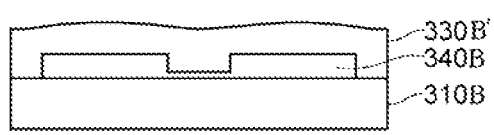
Figure 54:
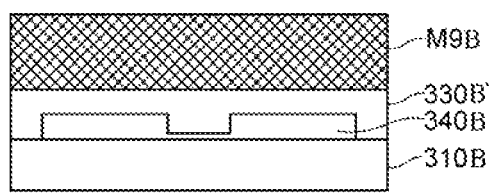
Figure 55:
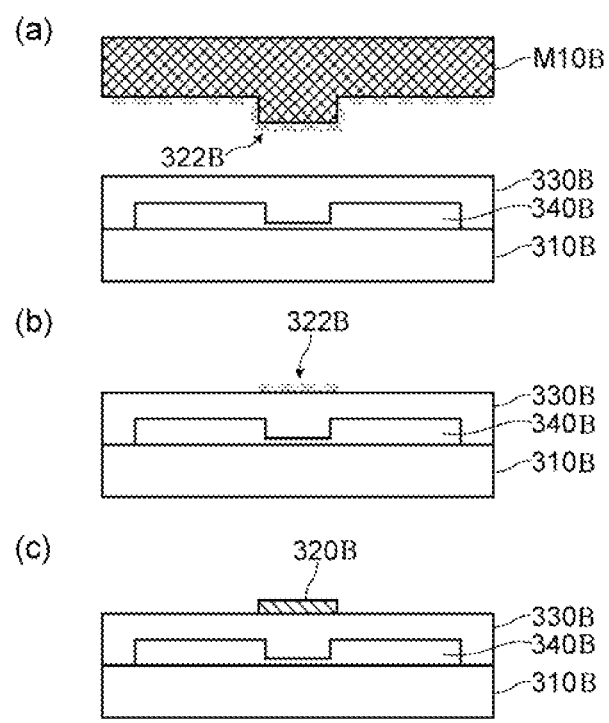
FIGS. 55(a) to 55(c) are explanatory views of the method of producing a field effect transistor according to Embodiment 15.

FIGS. 53(a) and 53(b) are explanatory views of a field effect transistor 300B according to Embodiment 15. FIG. 53(a) is a sectional view of the field effect transistor 300B, and FIG. 53(b) is a plan view of the field effect transistor 300B.

The field effect transistor 300B according to Embodiment 15 basically has a configuration similar to that of the field effect transistor 100B according to Embodiment 13. However, the field effect transistor according to the present embodiment is different from the field effect transistor 100B according to Embodiment 13, in having a top gate structure. More specifically, as shown in FIGS. 53(a) and 53(b), the field effect transistor 300B according to Embodiment 15 has a structure in which an oxide conductor layer 340B, a gate insulating layer 330B, and a gate electrode 320B are provided on an insulating substrate 310B in this order.

As described above, the field effect transistor 300B according to Embodiment 15 is different from the field effect transistor 100B according to Embodiment 13 in having the top gate structure. An oxide conductive material is used as the material for a channel region 342B. Accordingly, the carrier density can be increased. Furthermore, a ferroelectric material is used as the material for the gate insulating layer 330B, thereby realizing quick switching at a low drive voltage. As a result, similarly to the field effect transistor according to Embodiment 13, a large current can be quickly controlled at a low drive voltage. The field effect transistor can be produced simply by forming the oxide conductor layer 340B in which the channel region 342B is thinner than a source region 344B and a drain region 346B. As a result, similarly to the field effect transistor according to Embodiment 13, the excellent field effect transistor as described above can be produced with use of the raw materials and production energy, which are much less than the conventional case.

The field effect transistor 300B according to Embodiment 15 can be produced in accordance with a method of producing a field effect transistor, which includes the first to third processes in this order (the method of producing a field effect transistor according to Embodiment 15). Described step by step below is the method of producing the field effect transistor 300B according to Embodiment 15.

FIGS. 54(a) to 55(c) are explanatory views of the method of producing a field effect transistor according to Embodiment 15. FIGS. 54(a) to 54(e) and FIGS. 55(a) to 55(c) show the respective processes.

(1) First Process

In the first process, the oxide conductor layer 340B is formed on one of the surfaces of the insulating substrate 310B. The oxide conductor layer includes the source region 344B, the drain region 346B, and the channel region 342B (see FIGS. 54(a) to 54(c)).

Initially, as shown in FIGS. 54(a) and 54(b), a solution containing an oxide conductive raw material is applied onto one of the surfaces of the insulating substrate 310B, thereby forming a film 340B' containing the oxide conductive raw material.

Next, as shown in FIG. 54(c), the film 340B' containing the oxide conductive raw material is imprinted with use of a convexoconcave mold M8B formed such that the region corresponding to the channel region 342B is convex relatively to the regions corresponding to the source region 344B and the drain region 346B. In this case, the imprinting is performed such that the film 340B' containing the oxide conductive raw material at the region corresponding to the channel region 342B has predetermined thickness in the range from 5 nm to 100 nm. Accordingly, in the film 340B' containing the oxide conductive raw material, the portion to be transformed into the channel region 342B is made thinner than the other portions. The convexoconcave mold M8B is configured such that the region corresponding to an element isolation region is further convex relatively to the region corresponding to the channel region 342B. Therefore, the film 340B' containing the oxide conductive raw material is removed at the element isolation region (see FIG. 54(c)).

Then, the film 340B' containing the oxide conductive raw material is heat treated to form the oxide conductor layer 340B that includes the source region 344B, the drain region 346B, and the channel region 342B (not shown).

(2) Second Process

In the second process, the gate insulating layer 330B is formed on the oxide conductor layer 340B that includes the source region 344B, the drain region 346B, and the channel region 342B (see FIGS. 54(d) and 54(e)).

Initially, as shown in FIG. 54(d), a solution containing a ferroelectric raw material is applied onto one of the surfaces of the insulating substrate 310B, thereby forming a film 330B' containing the ferroelectric raw material.

Then, the film 330B' containing the ferroelectric raw material is imprinted with use of a flat mold M9B, so that the film 330B' containing the ferroelectric raw material is flattened.

Thereafter, the flattened film 330B' containing the ferroelectric raw material is heat treated to form the gate insulating layer 330B (not shown).

(3) Third Process

In the third process, the gate electrode 320B is formed on the gate insulating layer 330B, (see FIGS. 55(a) to 55(c)).

Initially, as shown in FIG. 55(a), a convexoconcave mold M10B is pressed onto the gate insulating layer 330B. The convexoconcave mold is provided, at least on the convex portion, with a particulate plating catalyst 322B. Thus, as shown in FIG. 55(b), the particulate plating catalyst 322B is caused to adhere to the gate insulating layer 330B at the portion to be provided with the gate electrode 320B.

Then, by performing the nonelectrolytic plating, there is formed the gate electrode 320B made of platinum (Pt) or the like, at the region to which the particulate plating catalyst 322B adheres.

Alternatively, the manner of the first process in the method of producing a field effect transistor according to any one of Modifications 1 to 4 of Embodiment 13 is applicable to the third process.

By adopting such a method, the field effect transistor 300B according to Embodiment 15 can be produced so as to have the top gate structure.

Indicated with reference to the following examples is that a field effect transistor of the present invention can be produced in accordance with the imprinting technique.

Example 5

1. Production of Field Effect Transistor 400B

Figure 57:
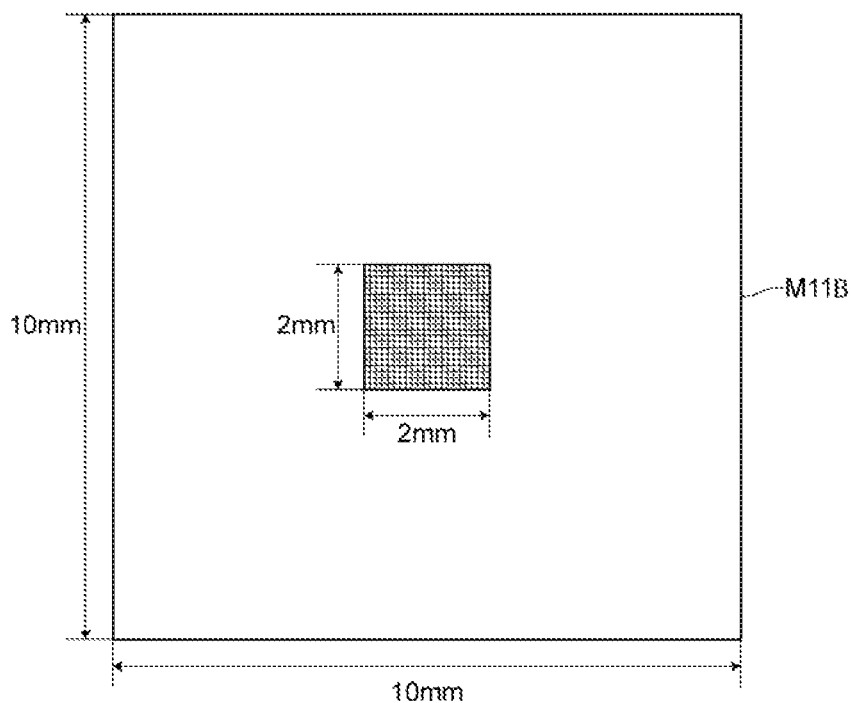
FIGS. 57(a) and 57(b) are explanatory views of a convexo-concave mold M11B used in Example 5.
Figure 57:
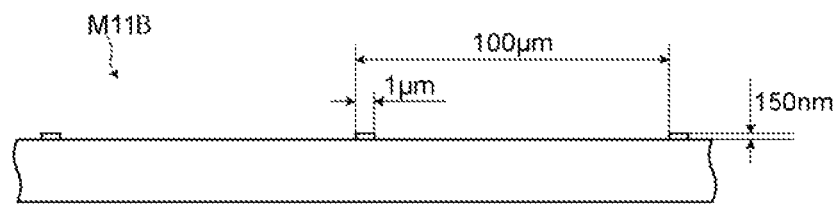
Figure 58:
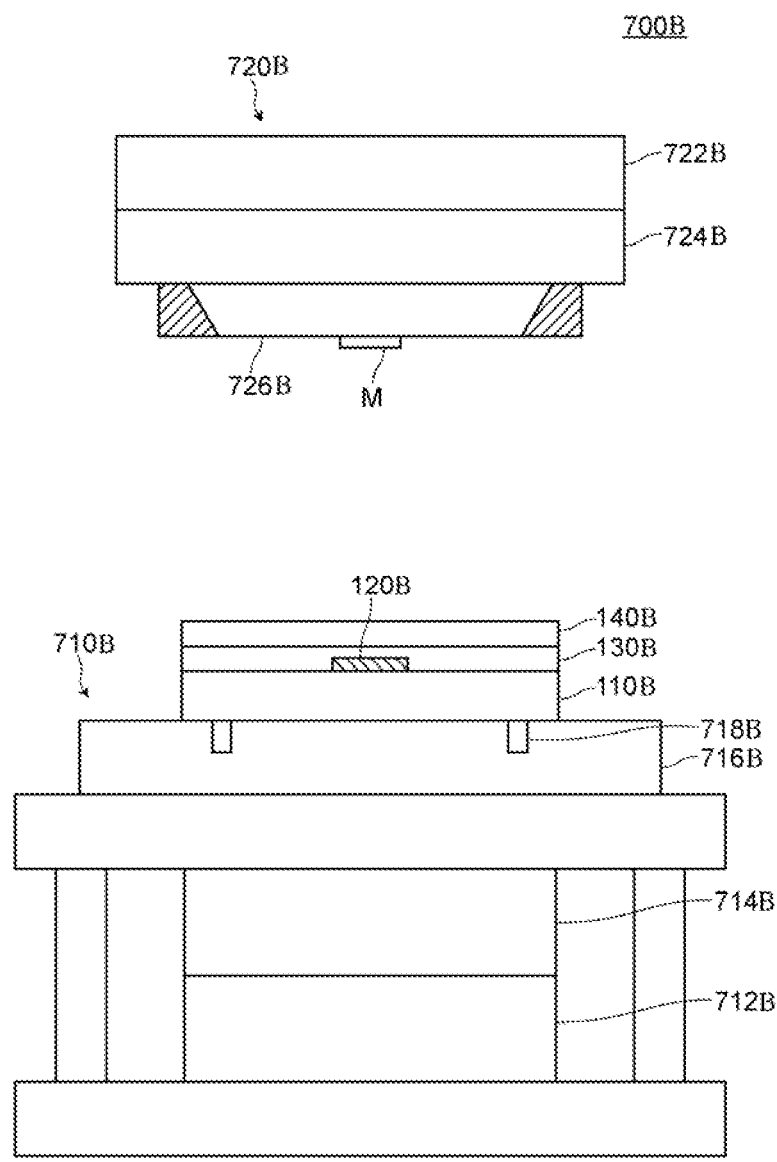
FIG. 58 is an explanatory view of an imprinting apparatus 700B used in Example 5.

FIGS. 56(a) to 56(e) are explanatory views of a method of producing a field effect transistor according to Example 5. FIGS. 56(a) to 56(e) show the respective processes. FIGS. 57(a) and 57(b) are explanatory views of a convexoconcave mold M11B used in Example 5. FIG. 58 is an explanatory view of an imprinting apparatus 700B used in Example 5. In FIG. 58, reference sign 710B denotes a lower mold, reference sign 712B denotes a heat shield plate, reference sign 714B denotes a heater, reference sign 716B denotes a mount portion, reference sign 718B denotes a suction portion, reference sign 720B denotes an upper mold, reference sign 722B denotes a heater, reference sign 724B denotes a fixing portion, and reference sign 726B denotes a base material made of quartz glass.

In the present example, the field effect transistor 400B according to Example 5 was produced by performing, in this order, "the ground Pt substrate preparation process", "the PZT layer formation process", "the ITO layer formation process", "the imprinting process", and "the ITO layer baking process" to be described below. Described step by step below is the method of producing the field effect transistor 400B according to Example 5.

(1) Ground Pt Substrate Preparation Process

Figure 56:
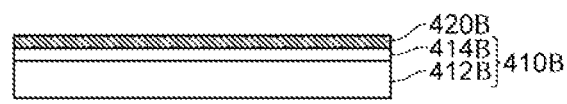
FIGS. 56(a) to 56(e) are explanatory views of a method of producing a field effect transistor according to Example 5.
Figure 56:
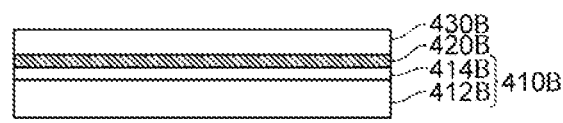
Figure 56:
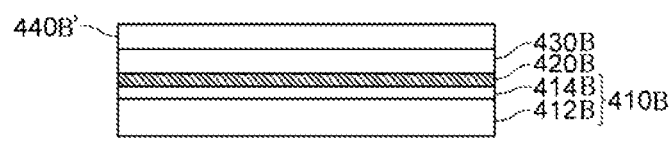
Figure 56:
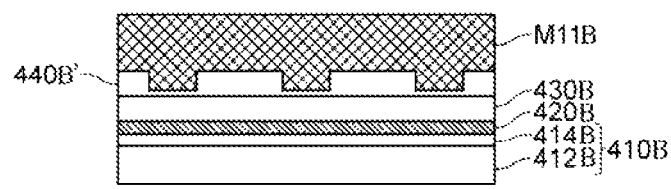
Figure 56:
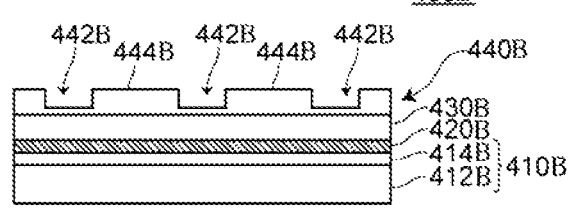

Initially, as shown in FIG. 56(a), there was prepared a ground Pt substrate (by forming a Pt layer to serve as a gate electrode 420B on the entire surface of an insulating substrate 410B that is obtained by forming an $SiO_2$ layer 414B on an Si substrate 412B; manufactured by TANAKA KIKINZOKU KOGYO K.K.). The gate electrode (Pt layer) 420 was formed on the entire surface of the insulating substrate 410B, so as to be uniformly imprinted with use of a flat mold.

(2) Gate Insulating Layer Formation Process

Then, as shown in FIG. 56(b), a PZT layer to serve as a gate insulating layer 430B was formed on the ground Pt substrate. In order to form the gate insulating layer (PZT layer) 430B, initially, a PZT sol-gel solution (manufactured by Mitsubishi Materials Corporation) as a solution containing a ferroelectric raw material was applied onto the ground Pt substrate under the spin coating conditions of 2500 rpm and 25 seconds, and the ground Pt substrate was dried on a hot plate at 220° C. for 5 minutes, repetitively for 4 times. Then, the substrate was tentatively baked on the hot plate at 350° C. for 10 minutes. Furthermore, the PZT layer was crystallized with use of an RTA apparatus at 650° C. for 20 minutes, and there was formed the gate insulating layer 430B.

(3) ITO Layer Formation Process

Subsequently, after an organic residue was removed from the PZT substrate by UV cleaning ($\lambda$=254 nm) for 5 minutes, an ITO layer 440B' was formed as a film containing an oxide conductive raw material, as shown in FIG. 56(c). The ITO layer 440B' was formed by initially applying, on the gate insulating layer (PZT layer) 430B, an ITO sol-gel solution (manufactured by Kojundo Chemical Laboratory Co., Ltd., original solution:diluted solution=1:1.5), as a solution containing the oxide conductive raw material, under the spin coating conditions of 2500 rpm and 25 seconds. Then, the ITO layer 440B' was formed by drying on a hot plate at 150° C. for 5 minutes. The ITO sol-gel solution additionally includes impurities at a concentration set such that the completed channel region has the carrier density in the range from $1\times10^{18}$ cm$^{-3}$ to $1\times10^{21}$ cm$^{-3}$.

(4) Imprinting Process

Subsequently, in order to enhance the mold releasing property of the ITO layer 440B', a mold releasing agent HD-1101 (manufactured by Daikin Chemicals Sales, Ltd.) was applied onto the ITO layer 440B' in accordance with the spin coat technique, and then the ITO layer was dried on the hot plate at 60° C. for 5 minutes. The mold releasing treatment was performed on the mold with use of a dip coating mold releasing agent ZH-1101 (manufactured by Daikin Chemicals Sales, Ltd.).

Then, as shown in FIG. 56(d), the ITO layer 440B' was imprinted with use of the convexoconcave mold M11B (see FIGS. 57(a) and 57(b)) formed such that the regions corresponding to channel regions 442B (see FIG. 56(e)) are convex relatively to the regions corresponding to source region/drain region 444B (see FIG. 56(e)). The imprinting was performed with use of the imprinting apparatus 700B (imprinting apparatus ST50 manufactured by Toshiba Machine Co., Ltd., see FIG. 58).

As shown in FIGS. 57(a) and 57(b), the convexoconcave mold M11B has a pattern region of 2 mm×2 mm at the center of a square shape of 10 mm×10 mm, and is provided, in the pattern region, with a latticed pattern of 1 μm wide and 150 nm high. The convexoconcave mold M11B is fixed to a base material 726B made of quartz glass by means of a double sided tape.

The imprinting was performed by applying the pressing force of 0.3 kN (3 MPa per 1 cm□). The temperature was increased from 70° C. upon application of the pressing force, and the heating process was performed to reach 180° C., while the pressing force was kept at the same level. The pressing force was kept for 15 minutes. Then, the mold was cooled with water, and was released when the temperature was decreased to 70° C.

(5) ITO Layer Baking Process

Next, the ITO layer 440B' was baked on the hot plate at 400° C. for 10 minutes. Thereafter, the ITO layer 440B' was heated with use of an RTA apparatus at 650° C. for 30 minutes (in the oxygen atmosphere for the first 15 minutes and in the nitrogen atmosphere for the second 15 minutes)), so that the ITO layer was crystallized. In this manner, there was formed an ITO layer 440B thus crystallized.

The field effect transistor 400B according to Example 5 was obtained by performing the above processes.

Figure 59:
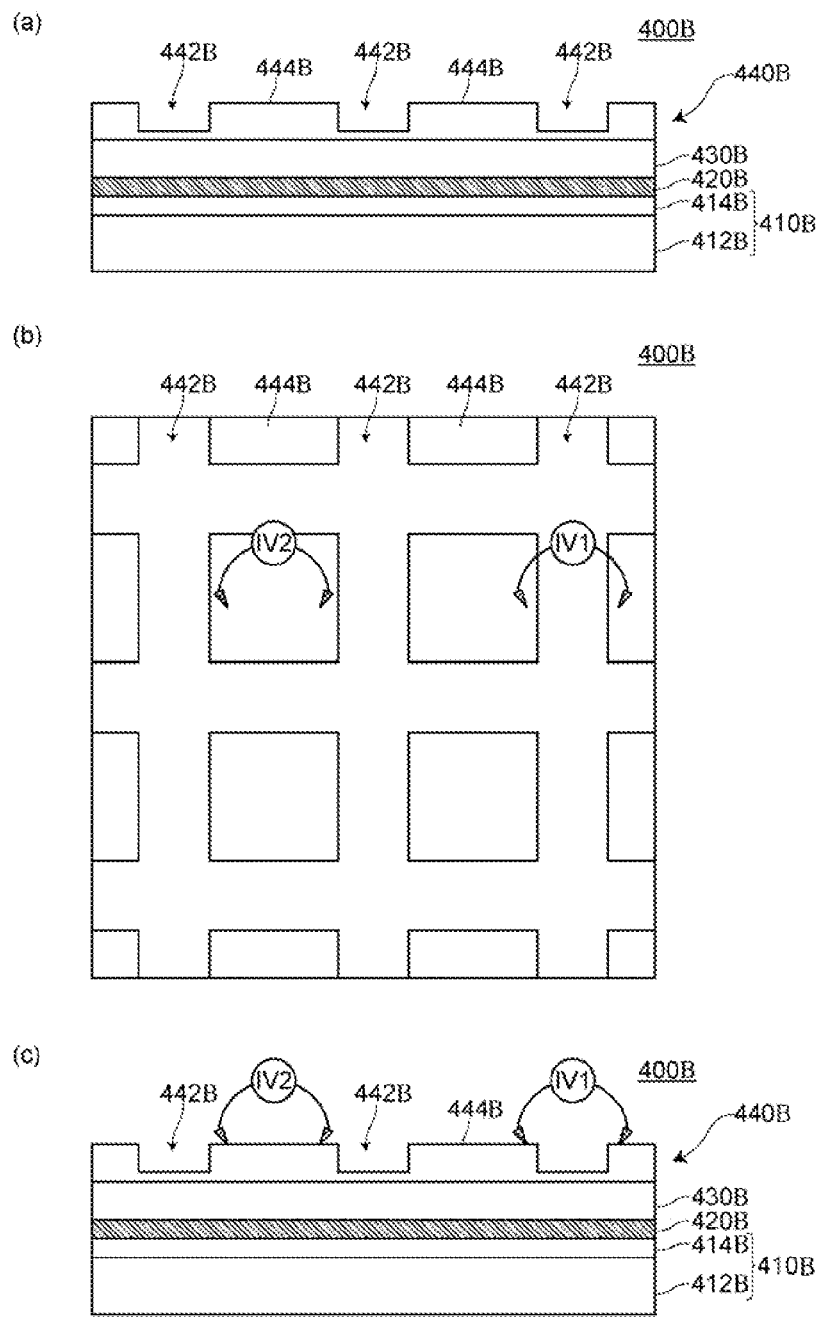
FIGS. 59(a) to 59(c) are explanatory views of a field effect transistor 400B according to Example 5.

2. Evaluation of Field Effect Transistor 400B (1) Structure of Field Effect Transistor 400B FIGS. 59(a) to 59(c) are explanatory views of the field effect transistor 400B according to Example 5. FIG. 59(a) is a sectional view of the field effect transistor 400B. FIG. 59(b) is a plan view of the field effect transistor 400B in the case where the electrical measurement is being performed. FIG. 59(c) is a sectional view of the field effect transistor 400B in the case where the electrical measurement is being performed.

As shown in FIGS. 59(a) to 59(c), in the field effect transistor 400B according to Example 5, the portions imprinted by the convex portions of the convexoconcave mold M11B serve as the channel regions 442B. Furthermore, the portions imprinted by the concave portions of the convexoconcave mold M11B serve as the source/drain regions 444B.

(2) State of Surface of Field Effect Transistor 400B

In the field effect transistor 400B thus obtained, the state of the ITO layer 440B' prior to the ITO layer baking process and the state of the ITO layer 440B after the ITO layer baking process were observed with use of a laser microscope OLS-3000 (manufactured by Olympus Corporation) and an SPM (manufactured by SII NanoTechnology Inc.).

Figure 60:
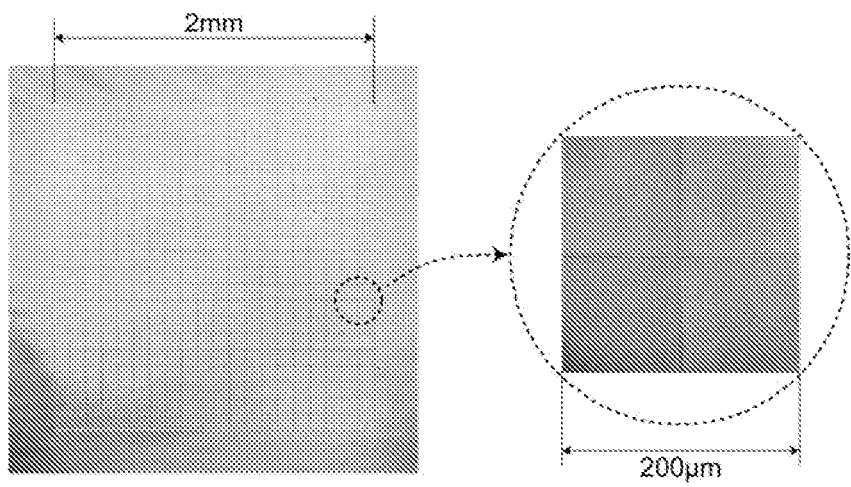
FIGS. 60(a) and 60(b) are explanatory views of states of a surface of an ITO layer.
Figure 60:
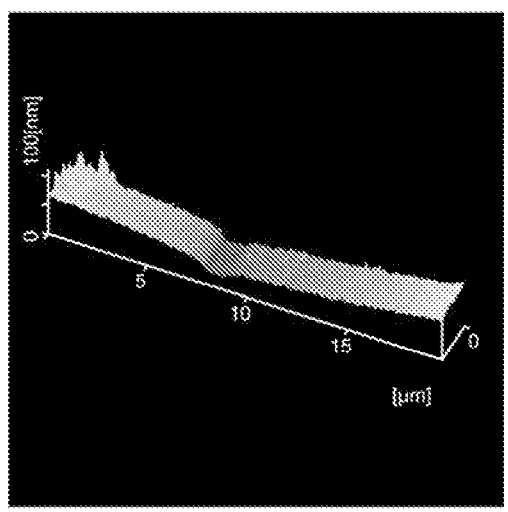

FIGS. 60(a) and 60(b) are explanatory views of the state of the surface of the ITO layer. In FIG. 60(a), a picture on the left is taken with use of the laser microscope, showing the ITO layer 440B' prior to the ITO layer baking process. In FIG. 60(a), a picture on the right provides an enlarged view of a region surrounded with the dashed line indicated in the left picture. FIG. 60(b) is an SPM picture of the ITO layer 440B after the ITO layer baking process. In FIG. 60(b), the recessed portion at the center corresponds to the channel region 442B.

In the field effect transistor 400B according to Example 5, as apparent also from FIG. 60(a), there is obtained a uniform structure with less difference in gray scale of the laser microscope (in other words, less difference in height) over the entire pattern region. Furthermore, as apparent also from FIG. 60(b), there is provided a difference in height of 50 nm to 60 nm between the channel region 442B of approximately 1 µm long and the source/drain regions 444B.

(3) Electrical Properties of Field Effect Transistor 400B

Initially, an end of the ITO layer 440B was wet etched with use of 1% hydrofluoric acid so as to expose the gate electrode 420B located therebelow, and a gate electrode probe was pressed against the exposed gate electrode. Then, as shown in FIGS. 59(b) and 59(c), a source probe and a drain probe were pressed respectively against the two source/drain regions 444B that sandwich the channel region 442B (see reference sign IV1 in FIGS. 59(b) and 59(c)).

Thereafter, the electrical properties (the property $I_D$-$V_G$ between a drain current $I_D$ and a gate voltage $V_G$, and the property $I_D$-$V_D$ between the drain current $I_D$ and a drain voltage $V_D$) of the field effect transistor 400B were measured with use of a semiconductor parameter analyzer (manufactured by Agilent Technologies, Inc.).

Figure 61:
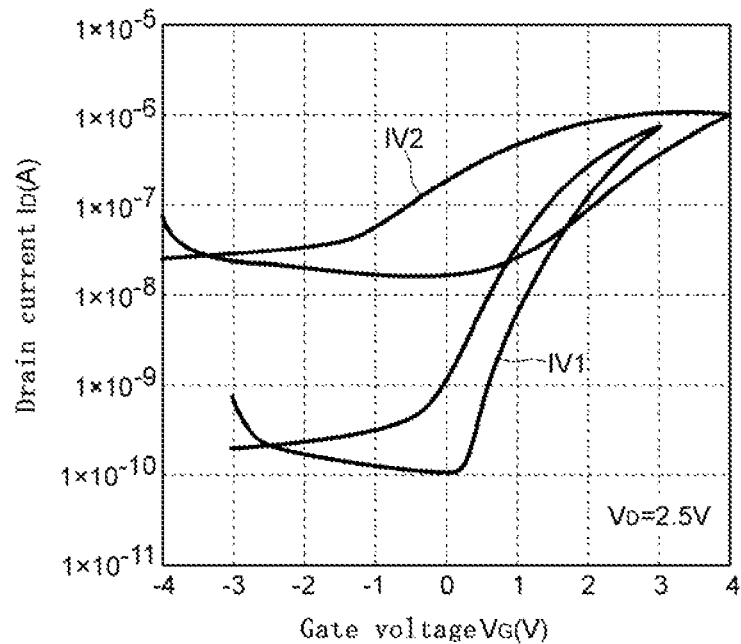
FIGS. 61(a) and 61(b) are graphs indicating electrical properties of the field effect transistor 400B according to Example 5.
Figure 61:
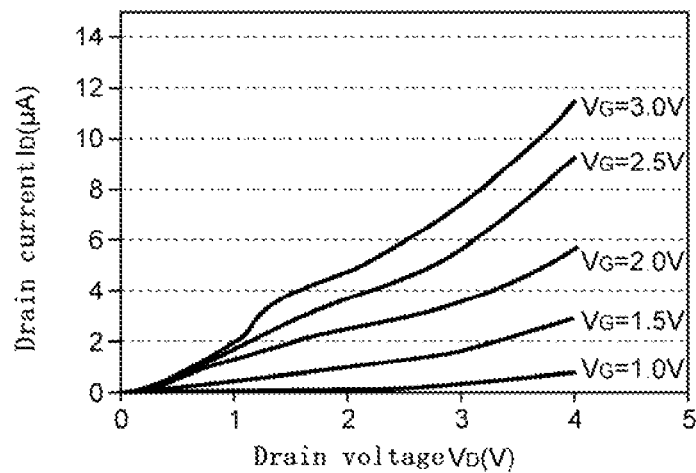

FIGS. 61(a) and 61(b) are explanatory graphs indicating the electrical properties of the field effect transistor 400B according to Example 5. FIG. 61(a) indicates the property $I_D$-$V_G$. FIG. 61(b) indicates the property $I_D$-$V_D$. In order to measure the property $I_D$-$V_G$, the gate voltage $V_G$ was scanned in the range from −3 V to +3 V with the drain voltage $V_D$ being kept at 2.5 V.

As apparent also from FIG. 61(a), the field effect transistor 400B according to Example 5 has the hysteresis property to conduct as a transistor memory (in the figure, see the property curve denoted by reference sign IV1). Further exhibited was an ON/OFF ratio of approximately 4 digits, and there was obtained the memory window property of 0.5 V. As apparent also from FIG. 61(b), the field effect transistor 400B according to Example 5 conducts as a transistor.

Example 6

1. Production of Field Effect Transistor 500B

Figure 62:
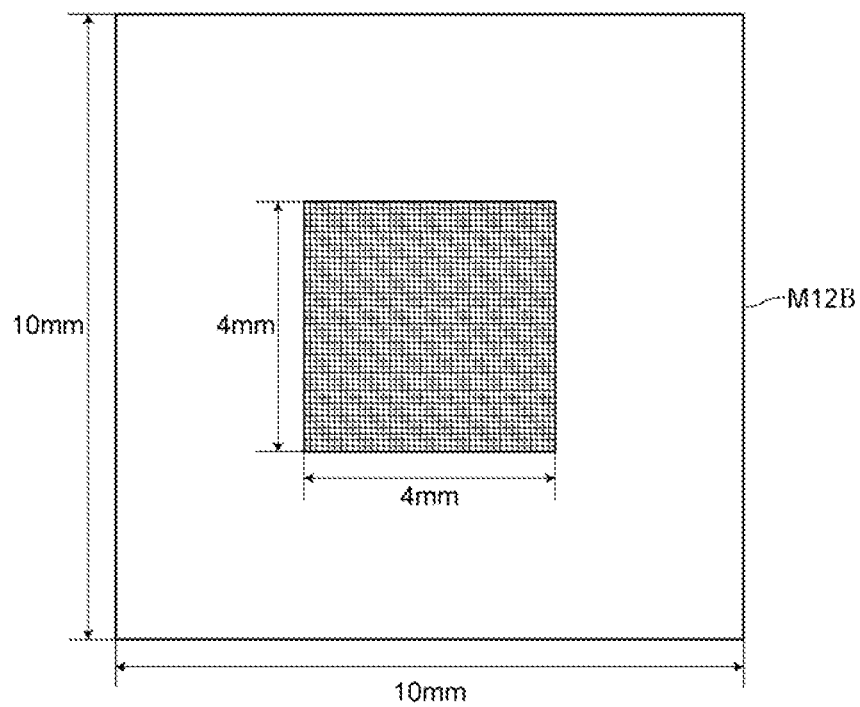
FIGS. 62(a) and 62(b) are explanatory views of a convexo-concave mold M12B used in Example 6.
Figure 62:
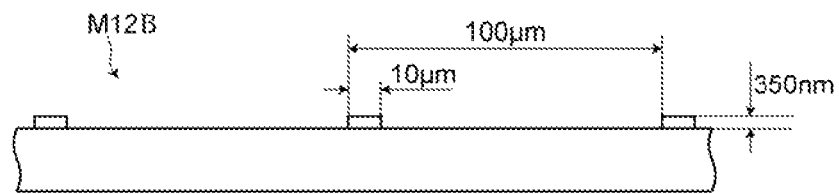

FIGS. 62(a) and 62(b) are explanatory views of a convexoconcave mold M12B used in Example 6.

A field effect transistor 500B according to Example 6 was produced by performing processes similar to those of Example 5, except for using the convexoconcave mold M12B shown in FIGS. 62(a) and 62(b) in the imprinting process.

As shown in FIGS. 62(a) and 62(b), the convexoconcave mold M12B has a pattern region of 4 mm×4 mm at the center of a square shape of 10 mm×10 mm. In the pattern region, there is provided a latticed pattern of 10 µm wide and 350 nm high.

2. Evaluation of Field Effect Transistor 500B (1) State of Surface of Field Effect Transistor 500B In the field effect transistor 500B thus obtained, the state of the ITO layer prior to the ITO layer baking process and the state of the ITO layer after the ITO layer baking process were observed with use of a laser microscope OLS-3000 (manufactured by Olympus Corporation) and an SEM (manufactured by Hitachi, Ltd. HT/S-4100).

Figure 63:
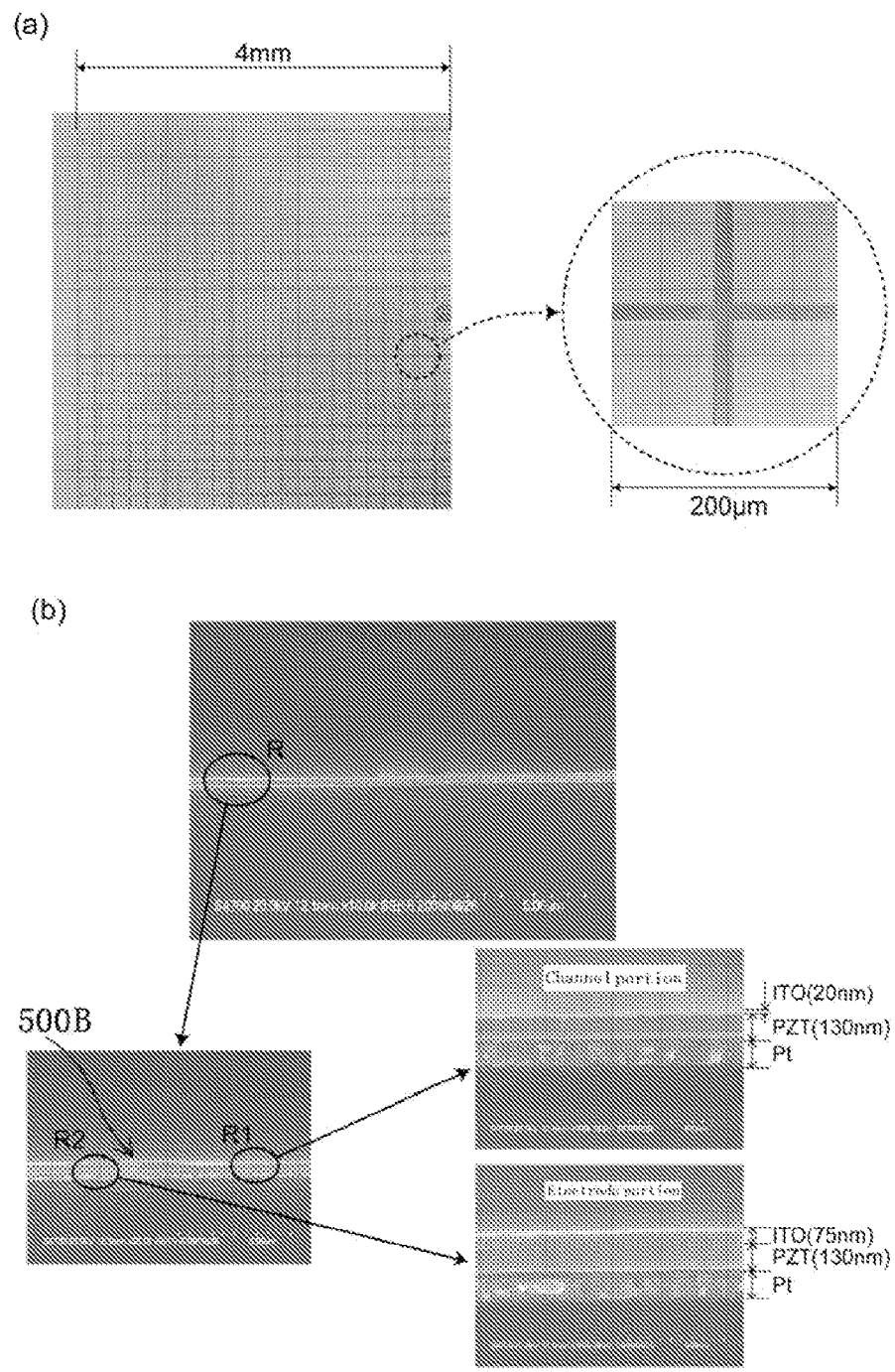
FIGS. 63(a) and 63(b) are explanatory views of states of a surface of an ITO layer.

FIGS. 63(a) and 63(b) are explanatory views of states of the surface of the ITO layer. In FIG. 63(a), a picture on the left is taken with use of the laser microscope, showing the ITO layer prior to the ITO layer baking process. In FIG. 63(a), a picture on the right provides an enlarged view of a region surrounded with the dashed line indicated in the left picture. FIG. 63(b) is an SEM picture indicating a section of the ITO layer after the ITO layer baking process. In FIG. 63(b), a channel region R1 and a source/drain region R2 were observed by enlarging a region denoted by reference sign R. The Pt layer, the PZT layer, and the ITO layer could be observed by further enlarging this region.

In the field effect transistor 500B according to Example 6, as apparent also from FIG. 63(a), similarly to the case of Example 5, there is obtained a uniform structure with less difference in gray scale of the laser microscope (in other words, less difference in height) over the entire pattern region. Furthermore, as apparent also from FIG. 63(b), in the channel region, the PZT layer (130 nm) and the ITO layer (20 nm) are provided on the Pt layer. Moreover, in the source/drain region, the PZT layer (130 nm) and the ITO layer (75 nm) are provided on the Pt layer.

(2) Electrical Properties of Field Effect Transistor 500B

The electrical properties of the field effect transistor 500B according to Example 6 were evaluated in a manner similar to the case of Example 5. However, in Example 6, due to the circumstances of the test, the electrical properties could not be measured as indicated by reference sign IV1 in FIGS. 59(b) and 59(c). Accordingly, the electrical properties were measured in the manner indicated by reference sign IV2 in FIGS. 59(b) and 59(c). More specifically, the field effect transistor as a measurement target in Example 6 is not the field effect transistor 500B but a field effect transistor used for measurement (not shown), in which the region corresponding to the "source/drain region" (the ITO layer of 75 nm thick) shown in FIGS. 59(b) and 59(c) corresponds to the channel region, while two measurement terminals corresponds to the source electrode and the drain electrode, respectively.

As described above, the field effect transistor as the target of measuring the electrical properties in Example 6 is different from the field effect transistor 500B of Example 6 and cannot be precisely regarded as the field effect transistor of the present invention. However, if such a field effect transistor used for measurement conducts as a transistor, the field effect transistor 500B of Example 6, which has the ITO layer of 20 nm thick as the channel region, will apparently conduct as a transistor.

Figure 64:
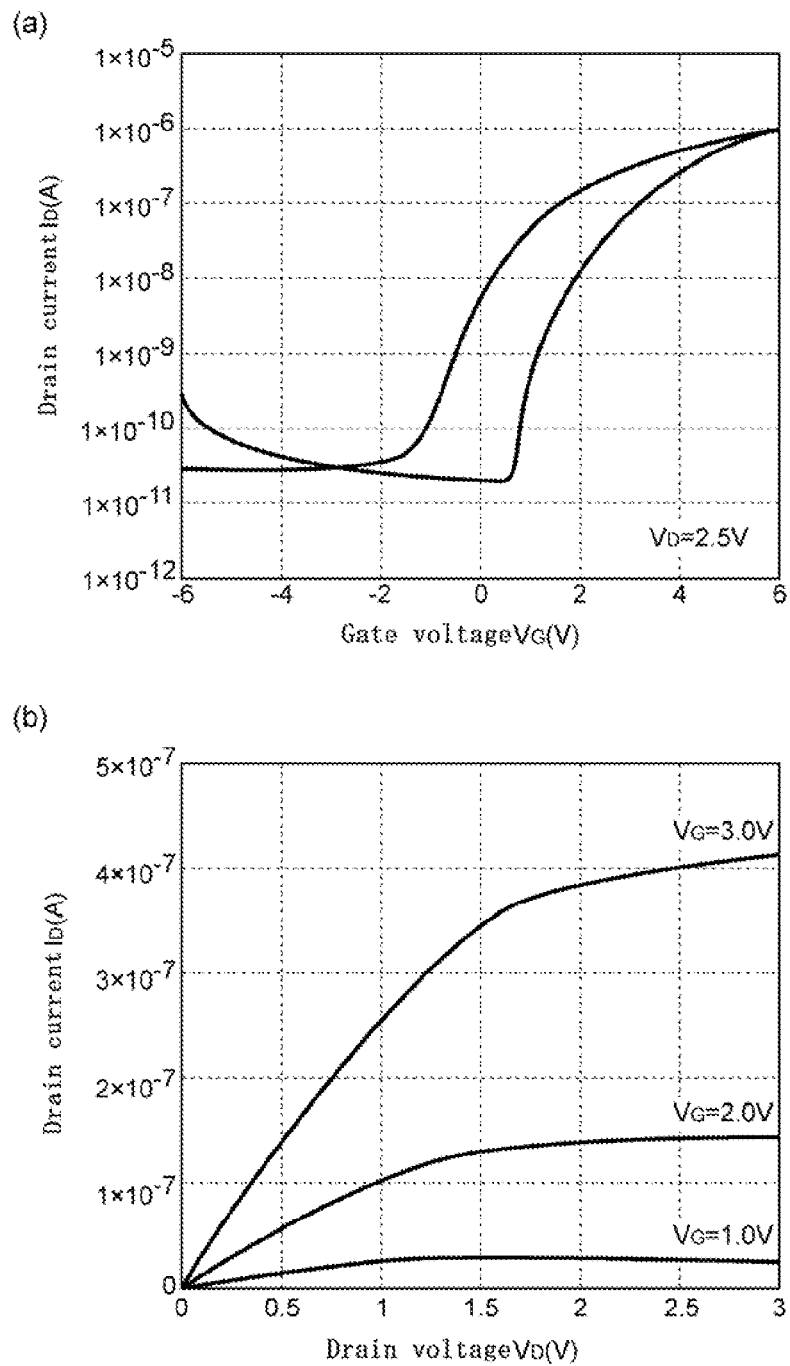
FIGS. 64(a) and 64(b) are graphs indicating electrical properties of a field effect transistor used for measurement according to Example 6.
Figure 65:
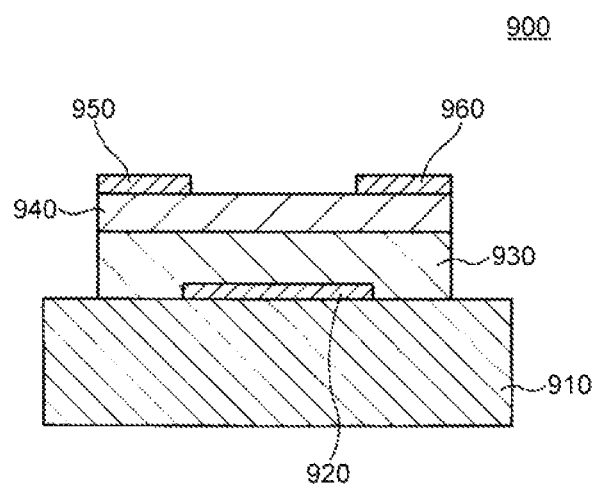
FIG. 65 is an explanatory view of a conventional thin film transistor 900.
Figure 66:
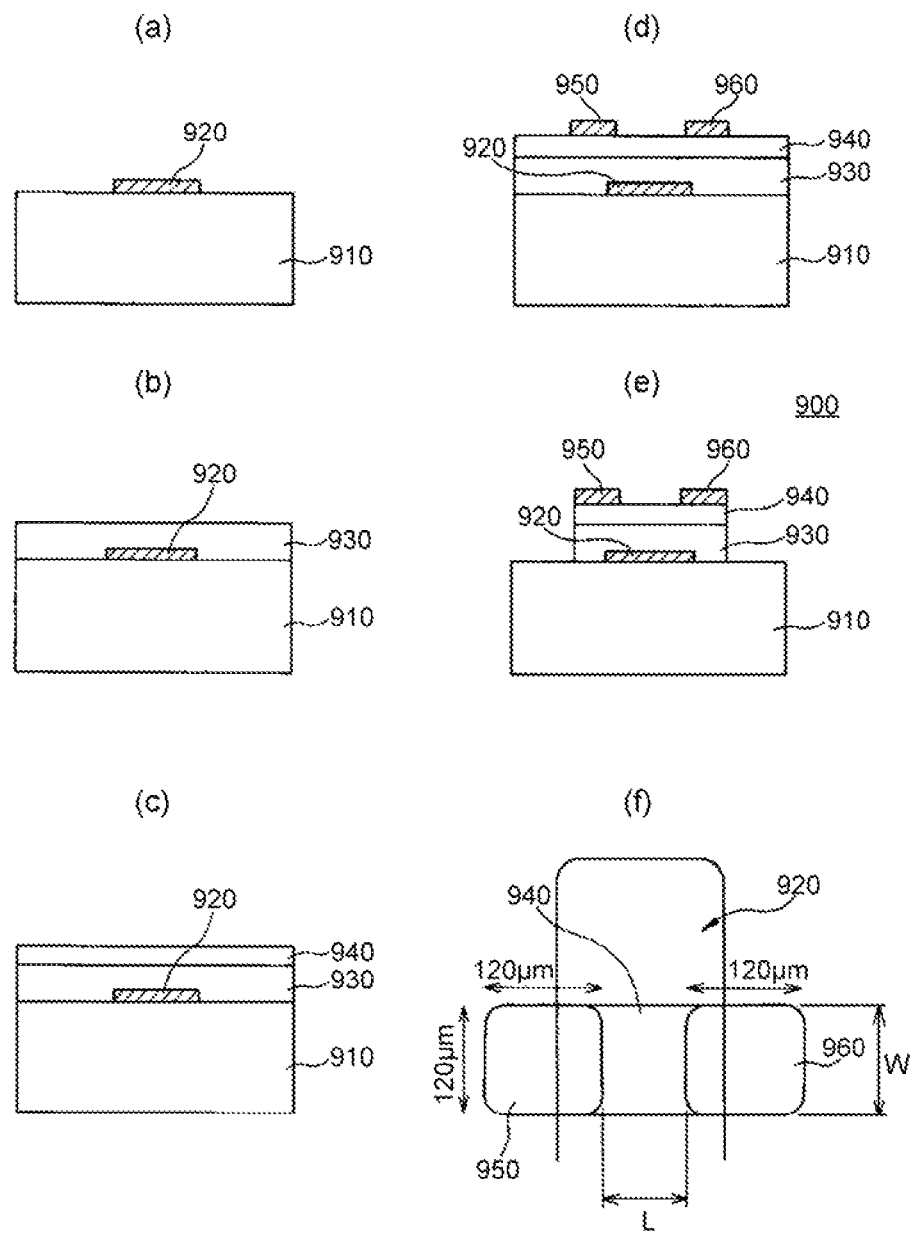
FIGS. 66(a) to 66(f) are explanatory views of a method of producing a conventional thin film transistor.
Figure 67:
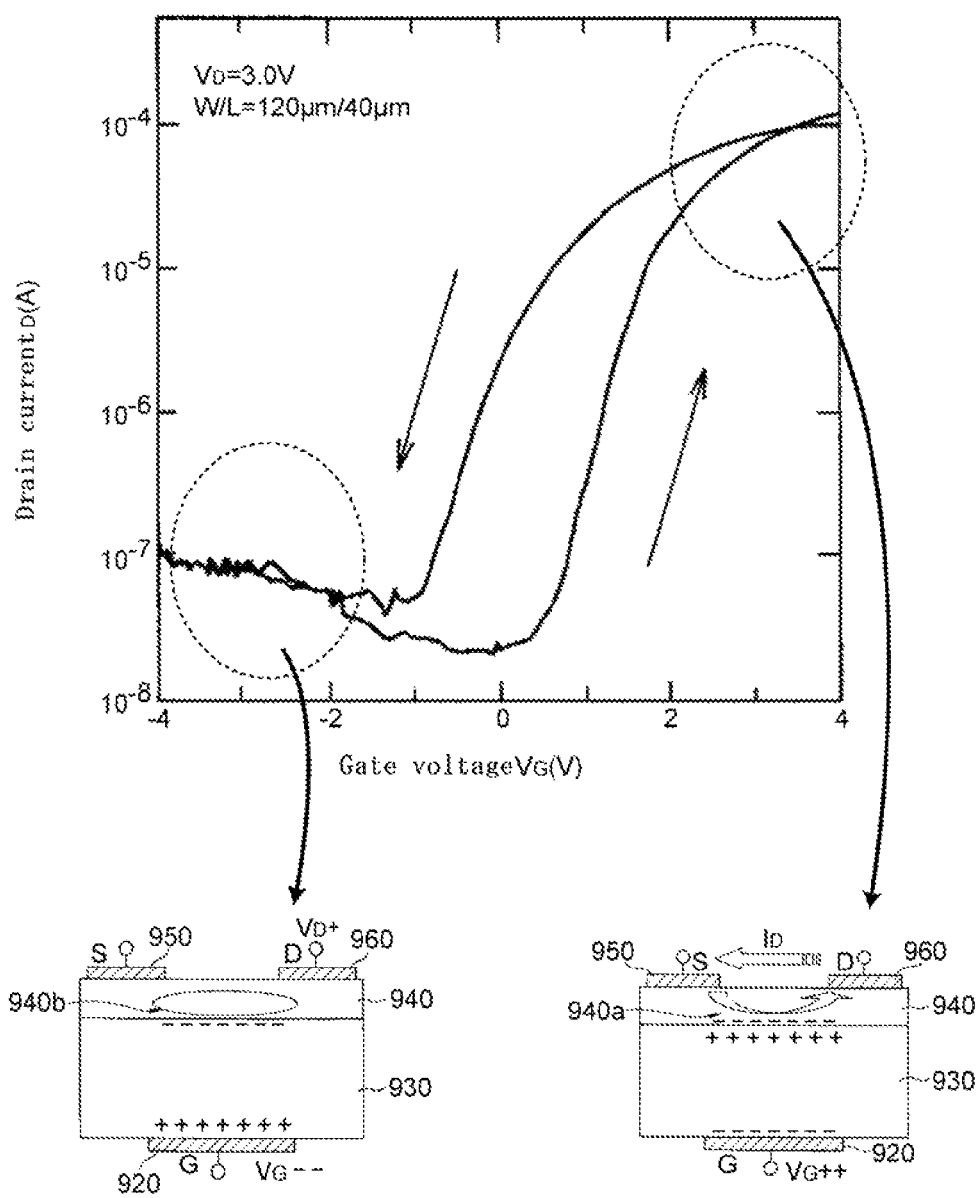
FIG. 67 is an explanatory view of electrical properties of the conventional thin film transistor 900.

FIGS. 64(a) and 64(b) are explanatory graphs indicating the electrical properties of the field effect transistor used for measurement. FIG. 64(a) indicates the property $I_D$-$V_G$ between the drain current $I_D$ and the gate voltage $V_G$, and FIG. 64(b) indicates the property $I_D$-$V_D$ between the drain current $I_D$ and a drain voltage $V_D$. In order to measure the property $I_D$-$V_G$, the gate voltage $V_G$ was scanned in the range from −6 V to +6 V with the drain voltage $V_D$ being kept at 2.5 V.

As apparent also from FIG. 64(a), the field effect transistor used for measurement in the present example has the hysteresis property to conduct as a transistor memory. Further exhibited was an ON/OFF ratio of approximately 5 digits, and there was obtained the memory window property of 2 V. As apparent also from FIG. 64(b), the field effect transistor used for measurement conducts as a transistor. Therefore, the field effect transistor 500B of Example 6, which has the ITO layer of 20 nm thick as the channel region, will apparently conduct as a transistor.

There have been described the field effect transistor and the method of producing the same according to each of the embodiments. However, the present invention is not limited to the above. The present invention can be embodied in the scope not departing from the purposes thereof, and can be modified in the following manners, for example.

(1) In each of the embodiments described above, indium tin oxide (ITO) was used as the oxide conductor material. However, the present invention is not limited to the above. For example, it is possible to use, as the oxide conductor material, indium oxide ($In_2O_3$), antimony doped tin oxide (Sb—$SnO_2$), zinc oxide (ZnO), aluminum doped zinc oxide (Al—ZnO), gallium doped zinc oxide (Ga—ZnO), ruthenium oxide ($RuO_2$), iridium oxide ($IrO_2$), tin oxide (SnO$_2$), tin monoxide SnO, niobium doped titanium dioxide (Nb—TiO$_2$), and the like. Other examples of the oxide conductor material include amorphous conductive oxide such as indium gallium zinc complex oxide (IGZO), gallium doped indium oxide (In—Ga—O (IGO)), and indium doped zinc oxide (In—Zn—O (IZO)). Still other examples of the oxide conductor material include strontium titanate (SrTiO$_3$), niobium doped strontium titanate (Nb—SrTiO$_3$), strontium barium complex oxide (SrBaO$_2$), strontium calcium complex oxide (SrCaO$_2$), strontium ruthenate (SrRuO$_3$), lanthanum nickel oxide (LaNiO$_3$), lanthanum titanium oxide (LaTiO$_3$), lanthanum copper oxide (LaCuO$_3$), neodymium nickel oxide (NdNiO$_3$), yttrium nickel oxide (YNiO$_3$), lanthanum calcium manganese complex oxide (LCMO), barium plumbate (BaPbO$_3$), LSCO (La$_x$Sr$_{1-x}$CuO$_3$), LSMO (La$_{1-x}$Sr$_x$MnO$_3$), YBCO (YBa$_2$Cu$_3$O$_{7-x}$), LNTO (La(Ni$_{1-x}$Ti$_x$)O$_3$), LSTO ((La$_{1-x}$Sr$_x$)TiO$_3$), STRO (Sr(Ti$_{1-x}$Ru$_x$)O$_3$), any other perovskite conductive oxide, and any other pyrochlore conductive oxide.

(2) In each of the embodiments described above, PZT (Pb(Zr$_x$Ti$_{1-x}$)O$_3$) was used as the ferroelectric material. However, the present invention is not limited to the above. For example, it is possible to use, as the ferroelectric material, Nb doped PZT, La doped PZT, barium titanate (BaTiO$_3$), lead titanate (PbTiO$_3$), BTO (Bi$_4$Ti$_3$O$_{12}$), BLT (Bi$_{4-x}$La$_x$Ti$_3$O$_{12}$), SBT (SrBi$_2$Ta$_2$O$_9$), BZN (Bi$_{1.5}$Zn$_{1.0}$Nb$_{1.5}$O$_7$), bismuth ferrite (BiFeO$_3$), or the like.

(3) Each of the embodiments described above adopts the gate insulating layer made of a ferroelectric material. However, the present invention is not limited to the above. For example, it is possible to use the gate insulating layer made of a paraelectric material (such as BZN (Bi$_{1.5}$Zn$_{1.0}$Nb$_{1.5}$O$_7$) or BST (Ba$_x$Sr$_{1-x}$)Ti$_3$O$_{12}$).

(4) Each of the embodiments described above adopts Pt or lanthanum nickel oxide (LaNiO$_3$) as the material for the gate electrode. However, the present invention is not limited to the above. For example, it is possible to use, as the material for the gate electrode, Au, Ag, Al, Ti, ITO, In$_2$O$_3$, Sb—In$_2$O$_3$, Nb—TiO$_2$, ZnO, Al—ZnO, Ga—ZnO, IGZO, RuO$_2$, IrO$_2$, Nb—STO, SrRuO$_3$, LaNiO$_3$, BaPbO$_3$, LSCO, LSMO, YBCO, any other perovskite conductive oxide, or the like. Still alternatively, as another material for the gate electrode, it is possible to use any other pyrochlore conductive oxide or any other amorphous conductive oxide.

(5) Each of the embodiments described above adopts the substrate made of quartz glass (SiO$_2$) as the insulating substrate. However, the present invention is not limited to the above. For example, it is possible to use, as the insulating substrate, an insulating substrate that is obtained by forming an STO (SrTiO$_3$) layer on a surface of an Si substrate with an SiO$_2$ layer and a Ti layer being interposed therebetween, an SiO$_2$/Si substrate, an alumina (Al$_2$O$_3$) substrate, an SRO (SrRuO$_3$) substrate, an STO (SrTiO$_3$), or the like.

(6) Each of the embodiments described above adopts, as the solid substrate, the insulating substrate having at least one of the surfaces being insulated. However, the present invention is not limited to the above. For example, it is possible to use a semiconductor substrate such as an Si substrate or an SiC substrate.

(7) In a field effect transistor according to the present invention, each of the oxide conductor layer, the gate electrode, and the gate insulating layer may be formed with use of a liquid material.

(8) In a field effect transistor according to the present invention, each of the oxide conductor layer, the gate electrode, and the gate insulating layer may have a perovskite structure.

(9) In a field effect transistor according to the present invention, each of the oxide conductor layer, the gate electrode, and the gate insulating layer may be formed without adopting the vacuum process.

Therefore, each of the above embodiments has been disclosed not for limiting the present invention but for describing the corresponding embodiment. Furthermore, modifications made within the scope of the present invention, inclusive of other combinations of the respective embodiments, will be also included in the scope of the patent claims.

The invention claimed is:

1. A method of producing a field effect transistor including: an oxide conductor layer having a source region, a drain region, and a channel region, a gate electrode for controlling a conductive state of the channel region and a gate insulating layer provided between the gate electrode and the channel region and made of ferroelectric material or paraelectric material, wherein the oxide conductor layer, in which the channel region is thinner than the source region and the drain region, is formed in accordance with an imprinting technique, the method comprising:
    a first step of forming the gate electrode on one of surfaces of a solid substrate;
    a second step of applying a solution containing a ferroelectric raw material or a paraelectric raw material at least onto the gate electrode of the solid substrate to form a film containing the ferroelectric raw material or the paraelectric raw material, and then performing heat treatment to form the gate insulating layer; and
    a third step of applying a solution containing an oxide conductive raw material onto the gate insulating layer to form a film containing the oxide conductive raw material, then imprinting the film containing the oxide conductive raw material with use of a convexo-concave mold formed such that a region corresponding to the channel region is convex relative to regions corresponding to the source region and the drain region, and thereafter performing heat treatment to form the source region, the drain region, and the channel region; the steps being performed in this order.

2. The method of producing a field effect transistor according to claim 1, wherein
    the third step includes the step of partially removing the film containing the oxide conductive raw material in accordance with an imprinting technique to achieve element isolation.

3. The method of producing a field effect transistor according to claim 1, wherein
    in the first step, a plating catalytic material is caused to adhere to a portion to be provided with the gate electrode in accordance with a contact printing technique, and then nonelectrolytic plating is provided to the region, to which the plating catalytic material adheres, so as to form the gate electrode.

4. The method of producing a field effect transistor according to claim 2, wherein
    in the first step, a portion to be provided with the gate electrode is lyophilized in accordance with a contact printing technique, then ink containing a raw material for the gate electrode is supplied to the lyophilized region, and thereafter heat treatment is performed to form the gate electrode.

5. A method of producing a field effect transistor including: an oxide conductor layer having a source region, a drain region, and a channel region, a gate electrode for controlling a conductive state of the channel region and a gate insulating layer provided between the gate electrode and the channel region and made of a ferroelectric material or a paraelectric material, wherein the oxide conductor layer, in which the channel region is thinner than the source region and the drain region, is formed in accordance with an imprinting technique, the method comprising:

a first step of forming the gate electrode on one of surfaces of a solid substrate;

a second step of applying a solution containing a ferroelectric raw material or a paraelectric raw material onto one of the surfaces of the solid substrate to form a film containing the ferroelectric raw material or the paraelectric raw material, then imprinting the film containing the ferroelectric raw material or the paraelectric raw material with use of a convexo-concave mold formed such that regions corresponding to the source region and the drain region are convex relative to a region corresponding to the channel region, and thereafter performing heat treatment to form the gate insulating layer configured to be convex at a region corresponding to the channel region relatively to regions corresponding to the source region and the drain region; and a third step of applying a solution containing an oxide conductive raw material onto one of the surfaces of the solid substrate to form a film containing the oxide conductive raw material, then imprinting the film containing the oxide conductive raw material with use of a flat mold, and thereafter performing heat treatment to form the source region the drain region, and the channel region, the steps being performed in this order.

6. A method of producing a field effect transistor including: an oxide conductor layer having a source region, a drain region and a channel region, a gate electrode for controlling a conductive state of the channel region and a gate insulating layer provided between the gate electrode and the channel region and made of a ferroelectric material or a paraelectric material, wherein the oxide conductor layer, in which the channel region is thinner than the source region and the drain region, is formed in accordance with an imprinting technique, the method comprising:

a first step of applying a solution containing an oxide conductive raw material onto one of surfaces of a solid substrate to form a film containing the oxide conductive raw material, then imprinting the film containing the oxide conductive raw material with use of a convexo-concave mold formed such that a region corresponding to the channel region is convex relative to regions corresponding to the source region and the drain region, and thereafter performing heat treatment to form the source region, the drain region, and the channel region;

a second step of applying a solution containing a ferroelectric raw material or a paraelectric raw material at least onto the channel region to form a film containing the ferroelectric raw material or the paraelectric raw material, then imprinting the film containing the ferroelectric raw material or the paraelectric raw material with use of a flat mold, and thereafter performing heat treatment to form the gate insulating layer; and a third step of forming the gate electrode on the gate insulating layer, the steps being performed in this order.

7. The method of producing a field effect transistor according to claim 6, wherein the first step includes the step of partially removing the film containing the oxide conductive raw material in accordance with an imprinting technique to achieve element isolation.

8. The method of producing a field effect transistor according to claim 7, wherein in the third step, a plating catalytic material is caused to adhere to a portion to be provided with the gate electrode in accordance with a contact printing technique, and then nonelectrolytic plating is provided to the region, to which the plating catalytic material adheres, so as to form the gate electrode.

9. The method of producing a field effect transistor according to claim 8, wherein, in the third step, a portion to be provided with the gate electrode is lyophilized in accordance with a contact printing technique, then ink containing a raw material for the gate electrode is supplied to the lyophilized region, and thereafter heat treatment is performed to form the gate electrode.

* * * * *

UNITED STATES PATENT AND TRADEMARK OFFICE
CERTIFICATE OF CORRECTION

PATENT NO. : 9,123,752 B2  
APPLICATION NO. : 14/531723  
DATED : September 1, 2015  
INVENTOR(S) : Tatsuya Shimoda et al.

It is certified that error appears in the above-identified patent and that said Letters Patent is hereby corrected as shown below:

In The Claims

Column 78, Line 61:
"according to claim 2, wherein" should read, --according to claim 1, wherein--.

Column 80, Line 28:
"according to claim 7, wherein" should read, --according to claim 6, wherein--.

Column 80, Line 36:
"according to claim 8, wherein" should read, --according to claim 6, wherein--.

Signed and Sealed this
Twenty-third Day of August, 2016

Michelle K. Lee
*Director of the United States Patent and Trademark Office*